US012787543B2

(12) United States Patent
Nakazawa et al.

(10) Patent No.: US 12,787,543 B2
(45) Date of Patent: Nov. 3, 2026

(54) MANUFACTURING METHOD OF DISPLAY APPARATUS AND DISPLAY APPARATUS

(71) Applicant: Semiconductor Energy Laboratory Co., Ltd., Atsugi (JP)

(72) Inventors: Yasutaka Nakazawa, Tochigi (JP); Takayuki Ohide, Isehara (JP); Naoto Goto, Tochigi (JP); Hiroki Adachi, Tochigi (JP); Satoru Idojiri, Tochigi (JP); Hayato Yamawaki, Atsugi (JP); Kenichi Okazaki, Atsugi (JP); Sachiko Kawakami, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 240 days.

(21) Appl. No.: 18/373,324

(22) Filed: Sep. 27, 2023

(65) Prior Publication Data

US 2024/0138183 A1 Apr. 25, 2024

(30) Foreign Application Priority Data

Oct. 7, 2022 (JP) ................................ 2022-162233

(51) Int. Cl.
*H10K 59/12* (2023.01)
*H10K 59/122* (2023.01)
(Continued)

(52) U.S. Cl.
CPC ....... *H10K 59/1201* (2023.02); *H10K 59/122* (2023.02); *H10K 85/342* (2023.02); (Continued)

(58) Field of Classification Search
CPC . H10K 59/1201; H10K 59/122; H10K 85/636
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2002-324673 A 11/2002
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Joseph L Williams
(74) *Attorney, Agent, or Firm* — Eric J. Robinson; Robinson Intellectual Property Law Office, P.C.

(57) ABSTRACT

A method for manufacturing a novel display apparatus is provided. The method includes a first step of forming a first electrode, a second electrode, and a first gap over an insulating film, a second step of forming a first film over the second electrode; a third step of forming a first layer overlapping with the first electrode, a fourth step of removing the first film by an etching method to form a first unit overlapping with the first electrode, a fifth step of removing a surface of the second electrode, a sixth step of forming a second film over the first layer and the second electrode, a seventh step of forming a second layer overlapping with the second electrode, and an eighth step of removing the second film by an etching method using the second layer to form a second unit overlapping with the second electrode and a second gap.

5 Claims, 54 Drawing Sheets

(51) Int. Cl.
*H10K 85/30* (2023.01)
*H10K 85/60* (2023.01)

(52) U.S. Cl.
CPC ......... *H10K 85/615* (2023.02); *H10K 85/633* (2023.02); *H10K 85/636* (2023.02); *H10K 85/657* (2023.02); *H10K 85/6572* (2023.02); *H10K 85/6576* (2023.02)

(56) References Cited

U.S. PATENT DOCUMENTS

| | | | | |
|---|---|---|---|---|
| 12,563,895 | B2 * | 2/2026 | Yamazaki .......... | H10K 59/1201 |
| 2002/0072139 | A1 | 6/2002 | Kashiwabara | |
| 2002/0113546 | A1 | 8/2002 | Seo et al. | |
| 2008/0197769 | A1 | 8/2008 | Seo et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0097407 | A1 * | 4/2014 | Oh ....................... | H10K 59/122 438/34 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0057330 | A1 | 2/2020 | Yamazaki et al. | |
| 2020/0203662 | A1 | 6/2020 | Mollard et al. | |
| 2022/0130918 | A1 | 4/2022 | Yamazaki et al. | |
| 2022/0181572 | A1 | 6/2022 | Ohsawa et al. | |
| 2022/0209162 | A1 | 6/2022 | Seo et al. | |
| 2022/0216445 | A1 | 7/2022 | Seo et al. | |
| 2022/0223671 | A1 | 7/2022 | Yamazaki et al. | |
| 2022/0348534 | A1 | 11/2022 | Kubota et al. | |
| 2022/0366845 | A1 | 11/2022 | Kimura et al. | |
| 2024/0284766 | A1 * | 8/2024 | Ohsawa .................... | G09F 9/30 |

FOREIGN PATENT DOCUMENTS

| | | | |
|---|---|---|---|
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| WO | WO-2018/087625 | | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

9101

9102

9103

9200

9201

9201

9201

MANUFACTURING METHOD OF DISPLAY APPARATUS AND DISPLAY APPARATUS

BACKGROUND OF THE INVENTION

1. Field of the Invention

One embodiment of the present invention relates to a method for manufacturing a display apparatus, a display apparatus, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display apparatus such as a television device or a monitor device along with a higher definition. A device absolutely required to have the highest resolution display panel is a device for virtual reality (VR) or augmented reality (AR).

Examples of the display apparatus that can be used for a display panel include, typically, a liquid crystal display apparatus, a light-emitting apparatus including a light-emitting element such as an organic electroluminescent (EL) element or a light-emitting diode (LED), and electronic paper performing display by an electrophoretic method or the like.

An organic EL element generally has a structure in which, for example, a layer containing a light-emitting organic compound is provided between a pair of electrodes. By voltage application to this element, the light-emitting organic compound can emit light. A display apparatus including such an organic EL element needs no backlight which is necessary for a liquid crystal display apparatus and the like and thus can have advantages such as thinness, lightweight, high contrast, and low power consumption. Patent Document 1, for example, discloses an example of a display apparatus using an organic EL element.

Patent Document 2 discloses a display apparatus using an organic EL device for VR.

REFERENCES

[Patent Document 1] Japanese Published Patent Application No. 2002-324673

[Patent Document 2] PCT International Publication No. 2018/087625

SUMMARY OF THE INVENTION

An object of one embodiment of the present invention is to provide a method for manufacturing a novel display apparatus that is highly convenient, useful, or reliable. Another object is to provide a novel display apparatus that is highly convenient, useful, or reliable. Another object is to provide a method for manufacturing a novel display apparatus, a novel display apparatus, or a novel semiconductor device.

Note that the description of these objects does not preclude the existence of other objects. In one embodiment of the present invention, there is no need to achieve all these objects. Other objects will be apparent from and can be derived from the description of the specification, the drawings, the claims, and the like.

(1) One embodiment of the present invention is a method for manufacturing a display apparatus including the following steps.

In a first step, a first electrode, a second electrode, and a first gap between the first electrode and the second electrode are formed over an insulating film.

In a second step, a first film is formed over the first electrode and the second electrode.

In a third step, a first layer overlapping with the first electrode is formed.

In a fourth step, the first film is removed from above the second electrode by an etching method using the first layer to form a first unit overlapping with the first electrode.

In a fifth step, a surface of the second electrode is removed by an etching method to expose a new surface.

In a sixth step, a second film is formed over the first layer and the second electrode.

In a seventh step, a second layer overlapping with the second electrode is formed.

In an eighth step, the second film is removed from above the first layer and the first gap by an etching method using the second layer to form a second unit overlapping with the second electrode and a second gap overlapping with the first gap.

In a ninth step, the first layer and the second layer are removed from above the first electrode and the second electrode, respectively, by an etching method.

In a tenth step, a third layer is formed over the first unit and the second unit.

In an eleventh step, a conductive film is formed over the third layer.

Accordingly, a display apparatus including a first light-emitting device including the first electrode and a second light-emitting device including the second electrode can be manufactured. The surface of the second electrode exposed to the etching process in the fourth step can be removed in the fifth step. The properties of the surface of the second electrode can be made closer to those of a surface of the first electrode. A phenomenon in which the driving voltage of the second light-emitting device increases due to the properties of the surface of the second electrode can be inhibited. A second gap can be formed between the first unit and the second unit. Occurrence of a phenomenon in which one of the first light-emitting device and the second light-emitting device emits light with unintended luminance in accordance with light emission of the other of the first light-emitting device and the second light-emitting device can be suppressed. In addition, the first light-emitting device and the second light-emitting device can be individually driven. Occurrence of a cross talk phenomenon between adjacent light-emitting devices can be suppressed. The resolution of the display apparatus can be increased. The aperture ratio of a pixel of the display apparatus can be increased. As a result, a method for manufacturing a novel display apparatus that is highly convenient, useful, or reliable can be provided.

(2) Another embodiment of the present invention is the method for manufacturing a display apparatus including the following steps between the eighth step and the ninth step.

In a twelfth step, a fourth layer is formed by an atomic layer deposition (ALD) method. The fourth layer is in contact with the insulating film in the first gap and covers the first unit and the second unit.

In a thirteenth step, a fifth layer is formed. The fifth layer fills the first gap and the second gap and has a first opening overlapping with the first electrode and a second opening overlapping with the second electrode.

In the ninth step, the first layer and part of the fourth layer each overlapping with the first opening and the second layer and another part of the fourth layer each overlapping with the second opening are removed by an etching method using the fifth layer.

Thus, the first gap and the second gap can be filled with the fourth layer and the fifth layer. Moreover, a step due to the first gap and the second gap can be reduced so as to be close to a flat plane. A phenomenon in which a cut or a split is generated due to the step in the conductive film can be suppressed. In addition, with use of the fourth layer, the contact between the fifth layer and each of the first unit and the second unit can be prevented in the thirteenth step. With use of the fourth layer, a phenomenon in which a substance that adversely affects the reliability of the first light-emitting device moves from the fifth layer to the first unit can be inhibited. With use of the fourth layer, a phenomenon in which a substance that adversely affects the reliability of the second light-emitting device moves from the fifth layer to the second unit can be inhibited. As a result, a method for manufacturing a novel display apparatus that is highly convenient, useful, or reliable can be provided.

(3) Another embodiment of the present invention is a display apparatus including a first light-emitting device, a second light-emitting device, an insulating film, and a fourth layer.

The first light-emitting device includes a first electrode, a first unit, and a third electrode.

The first electrode is positioned between the first unit and the insulating film and has a first thickness.

The first unit is positioned between the first electrode and the third electrode and contains a first light-emitting material.

The second light-emitting device includes a second electrode, a second unit, and a fourth electrode.

The second electrode is positioned between the second unit and the insulating film. A first gap is positioned between the second electrode and the first electrode. The second electrode has a second thickness, which is smaller than the first thickness.

The second unit is positioned between the second electrode and the fourth electrode and contains a second light-emitting material. A second gap is positioned between the second unit and the first unit and overlaps with the first gap.

The fourth layer is in contact with the first unit and the second unit in the second gap and in contact with the insulating film in the first gap.

Thus, even when the properties of the surface change in the manufacturing process, for example, the second electrode from which the surface is removed can be used for the second light-emitting device. A phenomenon in which the driving voltage of the second light-emitting device increases due to the properties of the surface of the second electrode can be inhibited. Occurrence of a phenomenon in which one of the first light-emitting device and the second light-emitting device emits light with unintended luminance in accordance with light emission of the other of the first light-emitting device and the second light-emitting device can be suppressed. In addition, the first light-emitting device and the second light-emitting device can be individually driven. Occurrence of a cross talk phenomenon between adjacent light-emitting devices can be suppressed. The resolution of the display apparatus can be increased. The aperture ratio of a pixel of the display apparatus can be increased. As a result, a novel display apparatus that is highly convenient, useful, or reliable can be provided.

(4) Another embodiment of the present invention is the display apparatus in which the first light-emitting device includes a first layer and a sixth layer.

The first layer is positioned between the third electrode and the first unit and has a third opening overlapping with the first electrode.

The sixth layer is positioned between the first layer and the first unit and has a fourth opening overlapping with the third opening.

(5) Another embodiment of the present invention is the display apparatus in which the first layer contains oxygen and aluminum and the sixth layer has higher water solubility than the first unit.

Thus, even when the properties of the sixth layer change in the manufacturing process, for example, the sixth layer can be removed from above the first unit to form the first light-emitting device. Furthermore, the first unit can be protected from being damaged in the manufacturing process. The sixth layer can be removed from above the first unit with use of an aqueous etchant. As a result, a novel display apparatus that is highly convenient, useful, or reliable can be provided.

(6) Another embodiment of the present invention is the display apparatus including a conductive film and a fifth layer.

The conductive film includes the third electrode.

The fifth layer is positioned between the conductive film and the fourth layer and has a first opening.

The fourth layer has a fifth opening overlapping with the third opening, the fourth opening, and the first opening.

(7) Another embodiment of the present invention is the display apparatus in which the first opening includes an end portion substantially aligned with end portions of the fifth opening, the third opening, and the fourth opening.

Accordingly, a gap formed between the fifth layer and the first unit after the removal of the sixth layer from above the first unit can be small. As a result, a novel display apparatus that is highly convenient, useful, or reliable can be provided.

Although the block diagram in drawings attached to this specification shows components classified based on their functions in independent blocks, it is difficult to classify actual components based on their functions completely, and one component can have a plurality of functions.

Note that the light-emitting apparatus in this specification includes, in its category, an image display device that uses a light-emitting device. The light-emitting apparatus may also include, in its category, a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

One embodiment of the present invention can provide a method for manufacturing a novel display apparatus that is highly convenient, useful, or reliable. Another embodiment of the present invention can provide a novel display apparatus that is highly convenient, useful, or reliable. A method for manufacturing a novel display apparatus can be provided. A novel display apparatus can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
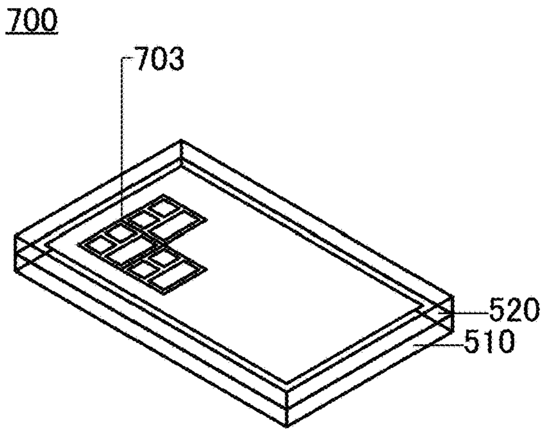
FIGS. 1A to 1D illustrate structures of a display apparatus of an embodiment.

A method for manufacturing a display apparatus of one embodiment of the present invention includes the following steps: a first step of forming a first electrode, a second electrode, and a first gap between the first electrode and the second electrode over an insulating film; a second step of forming a first film over the first electrode and the second electrode; a third step of forming a first layer overlapping with the first electrode; a fourth step of removing the first film from above the second electrode by an etching method using the first layer to form a first unit overlapping with the first electrode; a fifth step of removing a surface of the second electrode by an etching method to expose a new surface; a sixth step of forming a second film over the first layer and the second electrode; a seventh step of forming a second layer overlapping with the second electrode; an eighth step of removing the second film from above the first layer and the first gap by an etching method using the second layer to form a second unit overlapping with the second electrode and a second gap overlapping with the first gap; a ninth step of removing the first layer and the second layer from above the first electrode and the second electrode, respectively, by an etching method; a tenth step of forming a third layer over the first unit and the second unit; and an eleventh step of forming a conductive film over the third layer.

Accordingly, a display apparatus including a first light-emitting device including the first electrode and a second light-emitting device including the second electrode can be manufactured. The surface of the second electrode exposed to the etching process in the fourth step can be removed in the fifth step. The properties of the surface of the second electrode can be made closer to those of a surface of the first electrode. A phenomenon in which the driving voltage of the second light-emitting device increases due to the properties of the surface of the second electrode can be inhibited. A second gap can be formed between the first unit and the second unit. Occurrence of a phenomenon in which one of the first light-emitting device and the second light-emitting device emits light with unintended luminance in accordance with light emission of the other of the first light-emitting device and the second light-emitting device can be suppressed. In addition, the first light-emitting device and the second light-emitting device can be individually driven. Occurrence of a cross talk phenomenon between adjacent light-emitting devices can be suppressed. The resolution of the display apparatus can be increased. The aperture ratio of a pixel of the display apparatus can be increased. As a result, a method for manufacturing a novel display apparatus that is highly convenient, useful, or reliable can be provided.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a display apparatus of one embodiment of the present invention is described with reference to FIGS. 1A to 1D and FIG. 2.

Figure 1B:
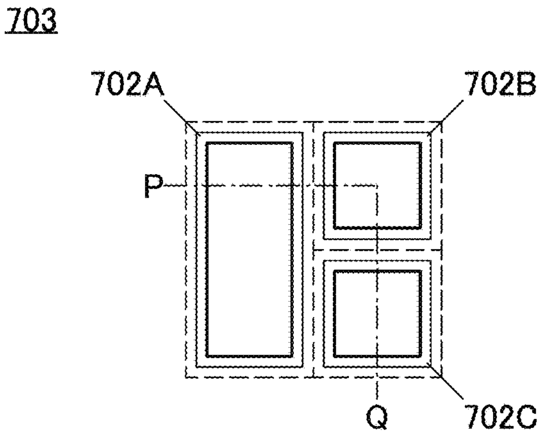
Figure 1C:
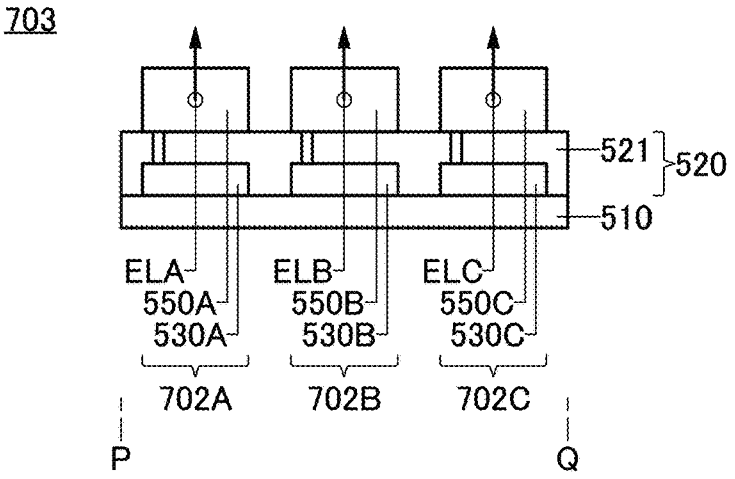
Figure 1D:
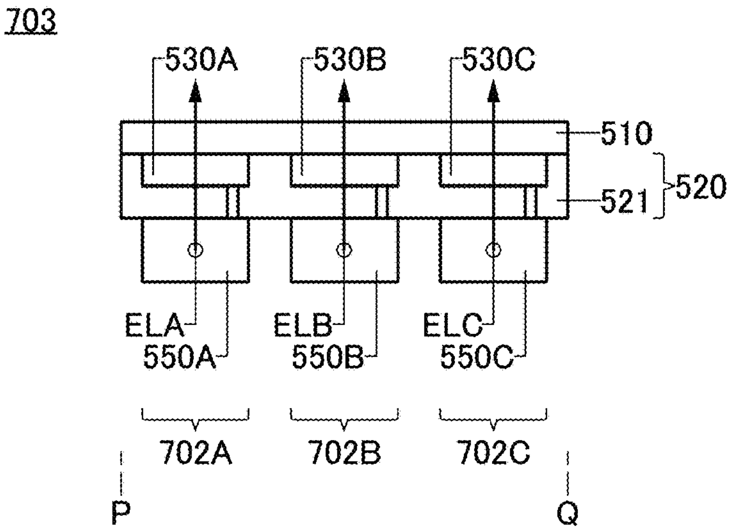

FIG. 1A is a cross-sectional view illustrating a structure of the display apparatus of one embodiment of the present invention, and FIG. 1B is a front view illustrating part of FIG. 1A. FIG. 1C is a cross-sectional view taken along a cutting line P-Q in FIG. 1B, and FIG. 1D is a cross-sectional view illustrating a structure different from that in FIG. 1C.

Figure 2:
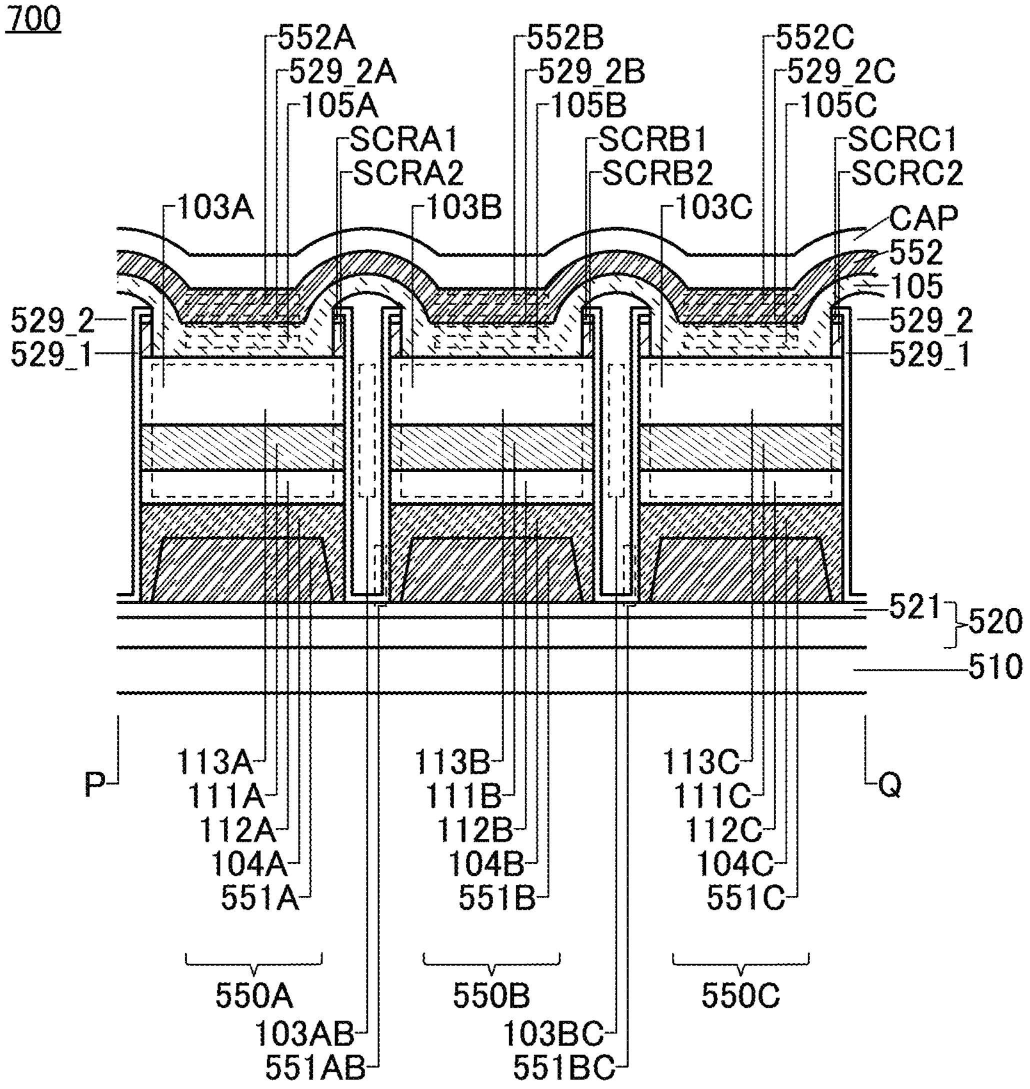
FIG. 2 illustrates a structure of a display apparatus of an embodiment.

FIG. 2 is a cross-sectional view illustrating the structure of the display apparatus of one embodiment of the present invention.

Figure 3A:
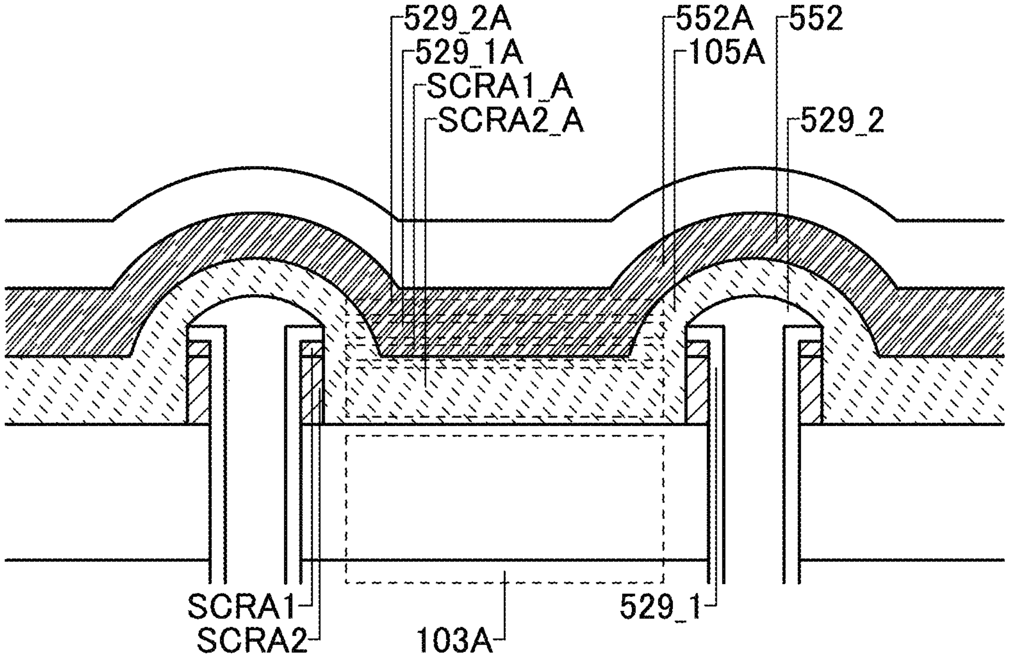
FIGS. 3A and 3B illustrate a structure of a display apparatus of an embodiment.
Figure 3B:
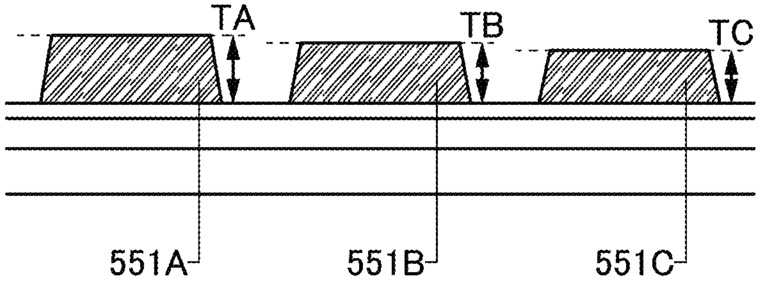

FIG. 3A is a cross-sectional view illustrating part of FIG. 2. FIG. 3B is a cross-sectional view illustrating another part of FIG. 2.

Figure 4:
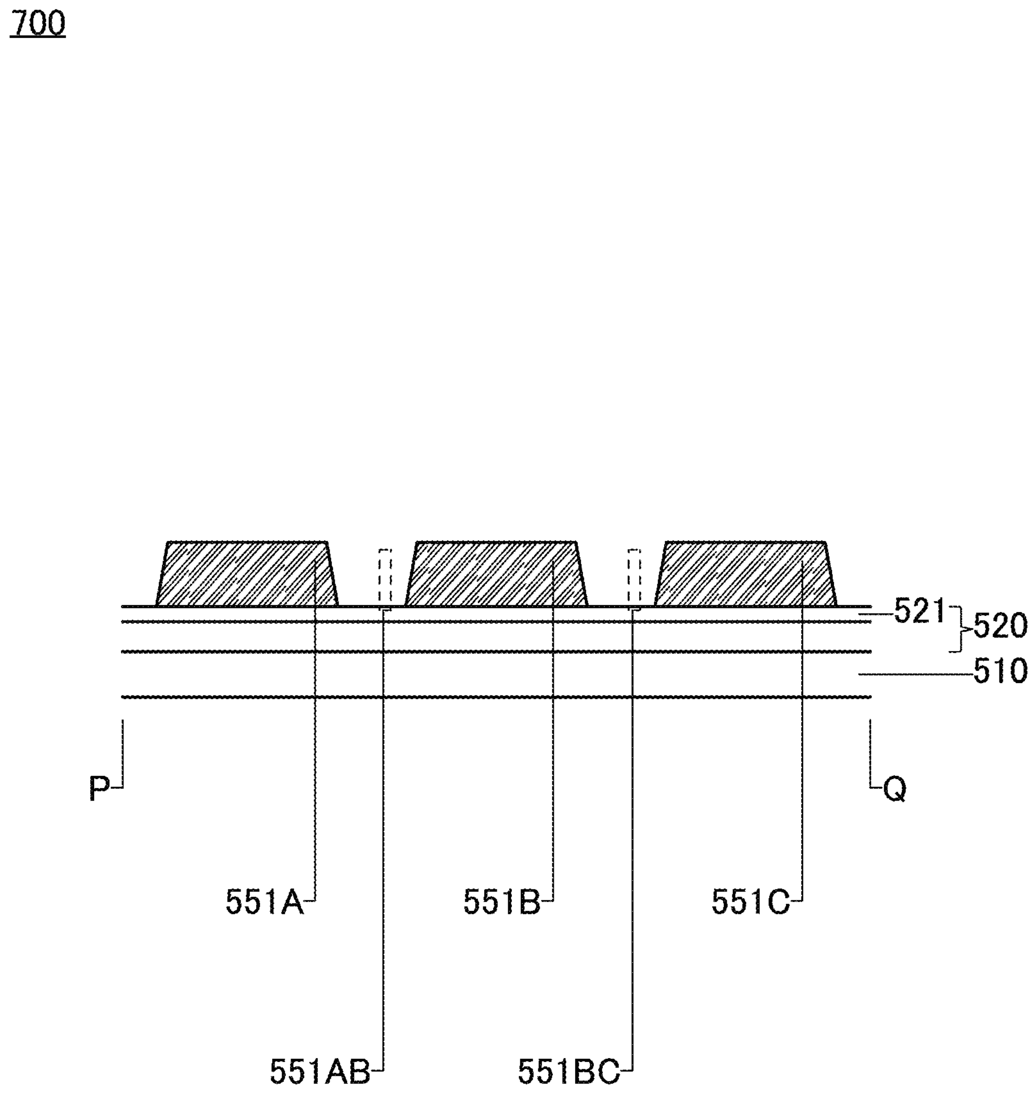
FIG. 4 illustrates a method for manufacturing a display apparatus of an embodiment.

FIG. 4 is a cross-sectional view illustrating a method for manufacturing a display apparatus of one embodiment of the present invention.

Figure 5:
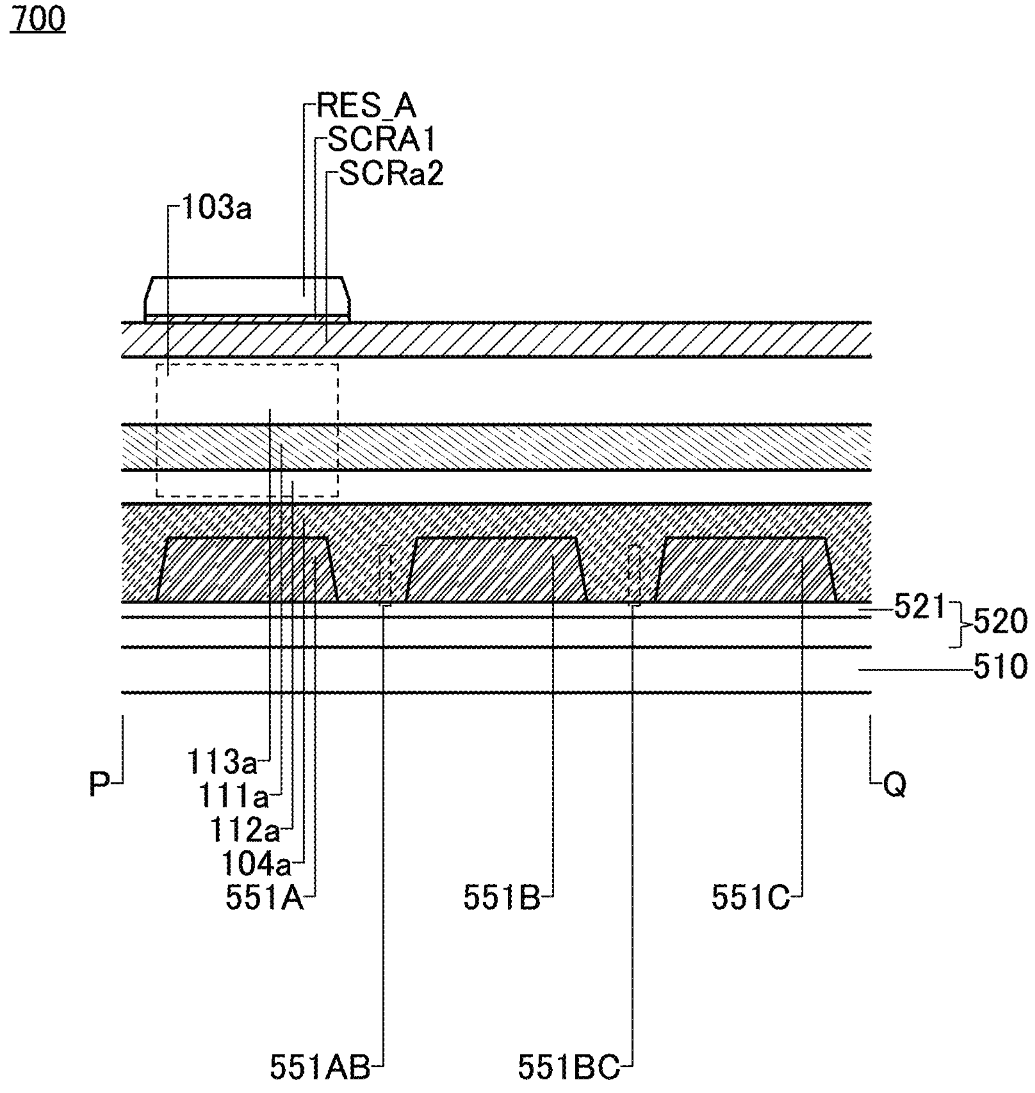
FIG. 5 illustrates a method for manufacturing a display apparatus of an embodiment.

FIG. 5 is a cross-sectional view illustrating the method for manufacturing the display apparatus of one embodiment of the present invention.

Figure 6:
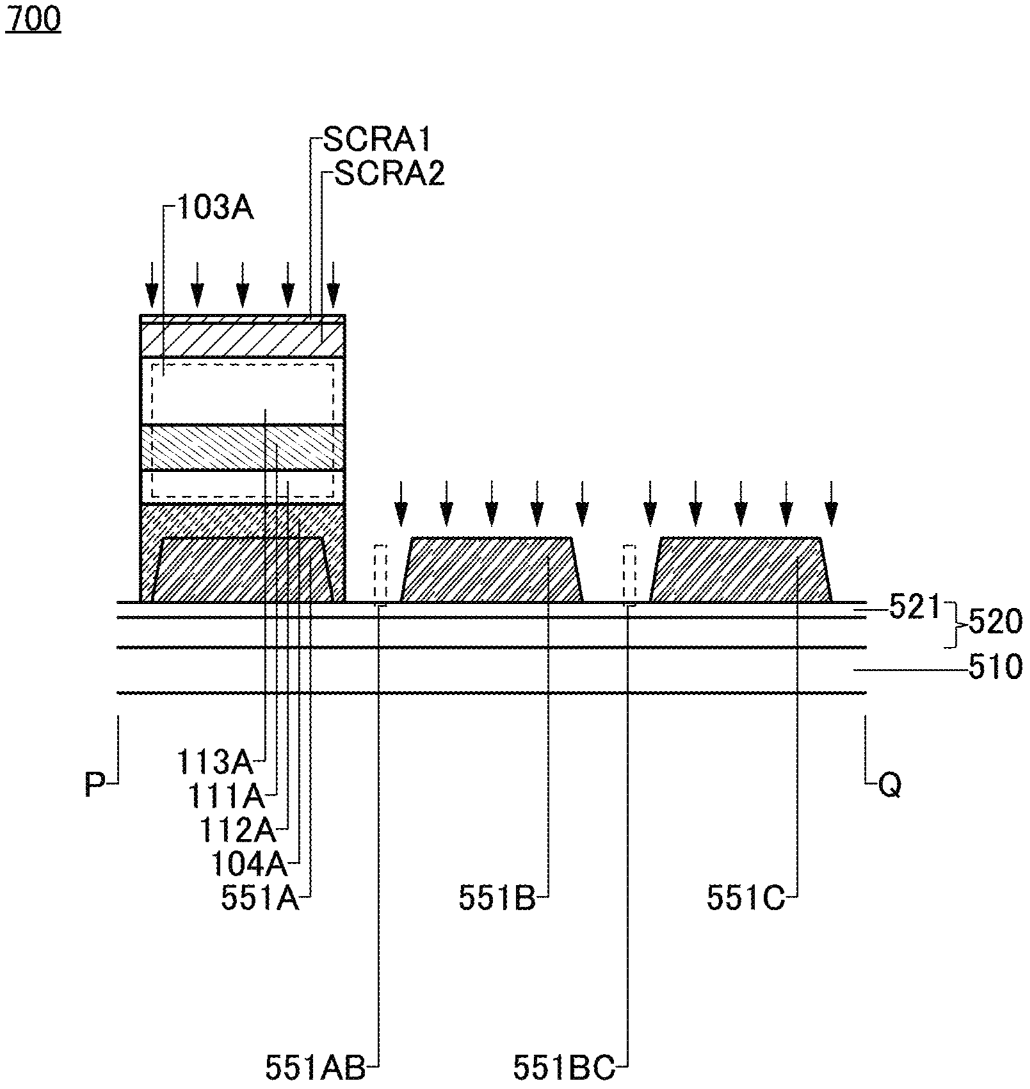
FIG. 6 illustrates a method for manufacturing a display apparatus of an embodiment.

FIG. 6 is a cross-sectional view illustrating the method for manufacturing the display apparatus of one embodiment of the present invention.

Figure 7:
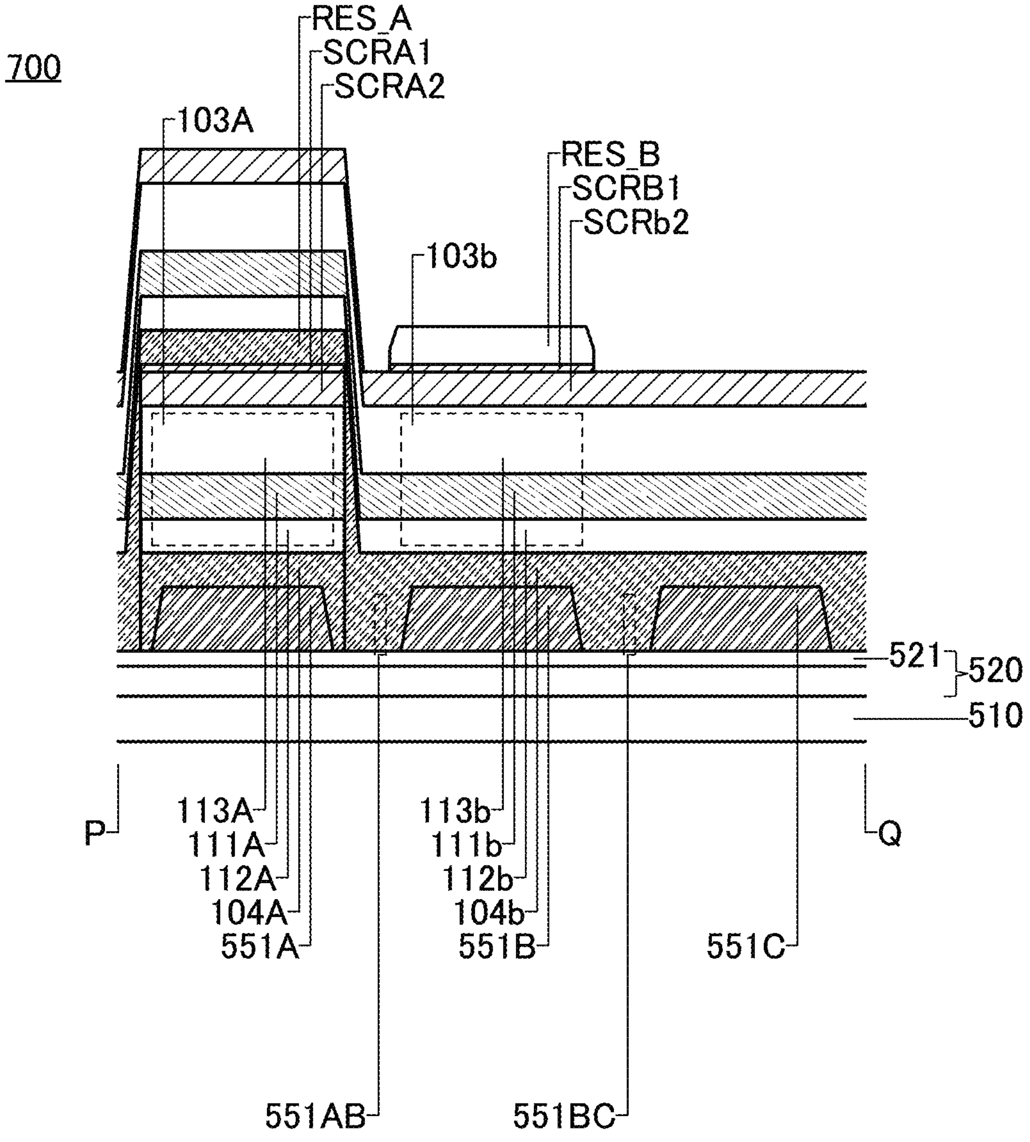
FIG. 7 illustrates a method for manufacturing a display apparatus of an embodiment.

FIG. 7 is a cross-sectional view illustrating the method for manufacturing the display apparatus of one embodiment of the present invention.

Figure 8:
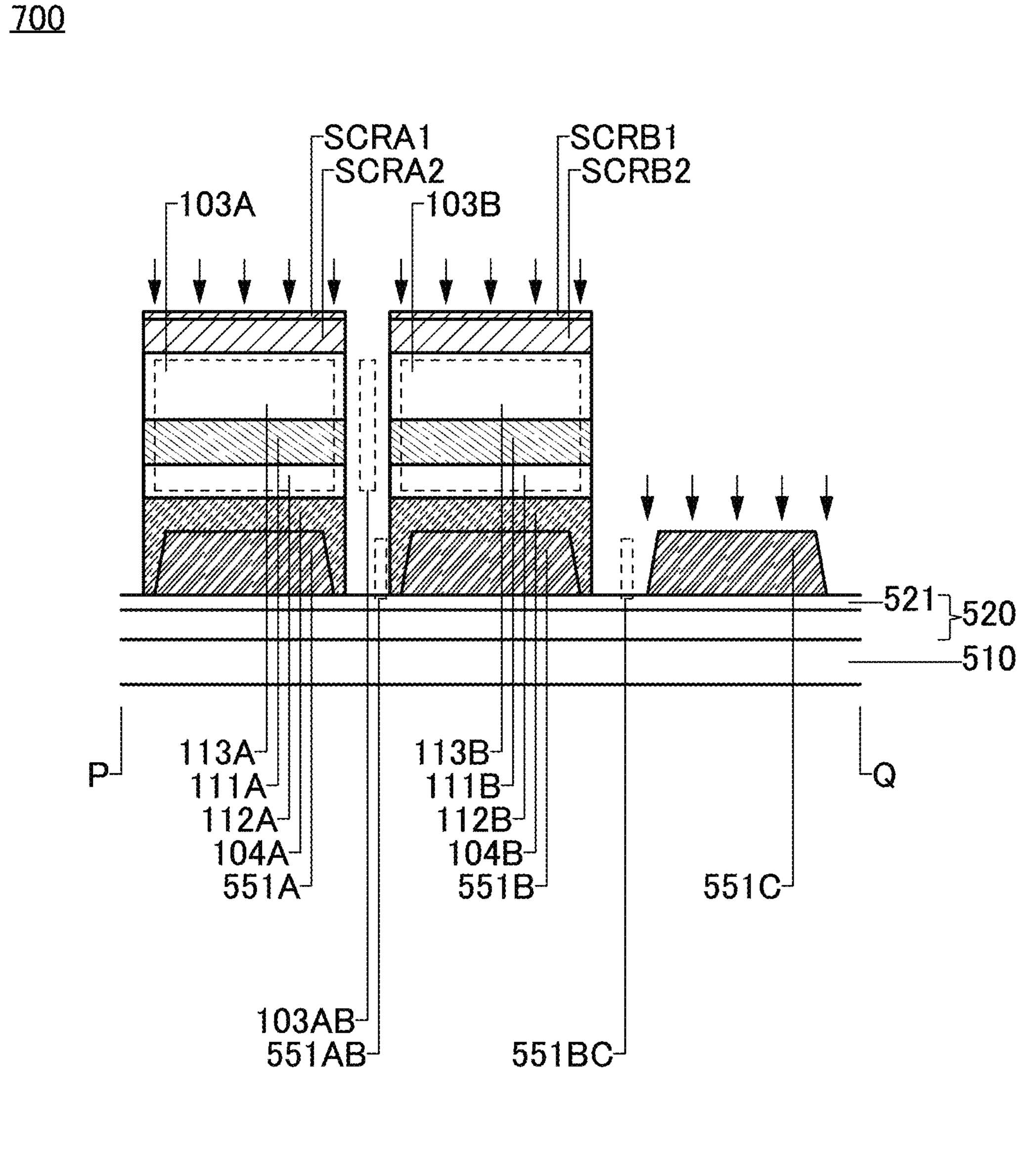
FIG. 8 illustrates a method for manufacturing a display apparatus of an embodiment.

FIG. 8 is a cross-sectional view illustrating the method for manufacturing the display apparatus of one embodiment of the present invention.

Figure 9:
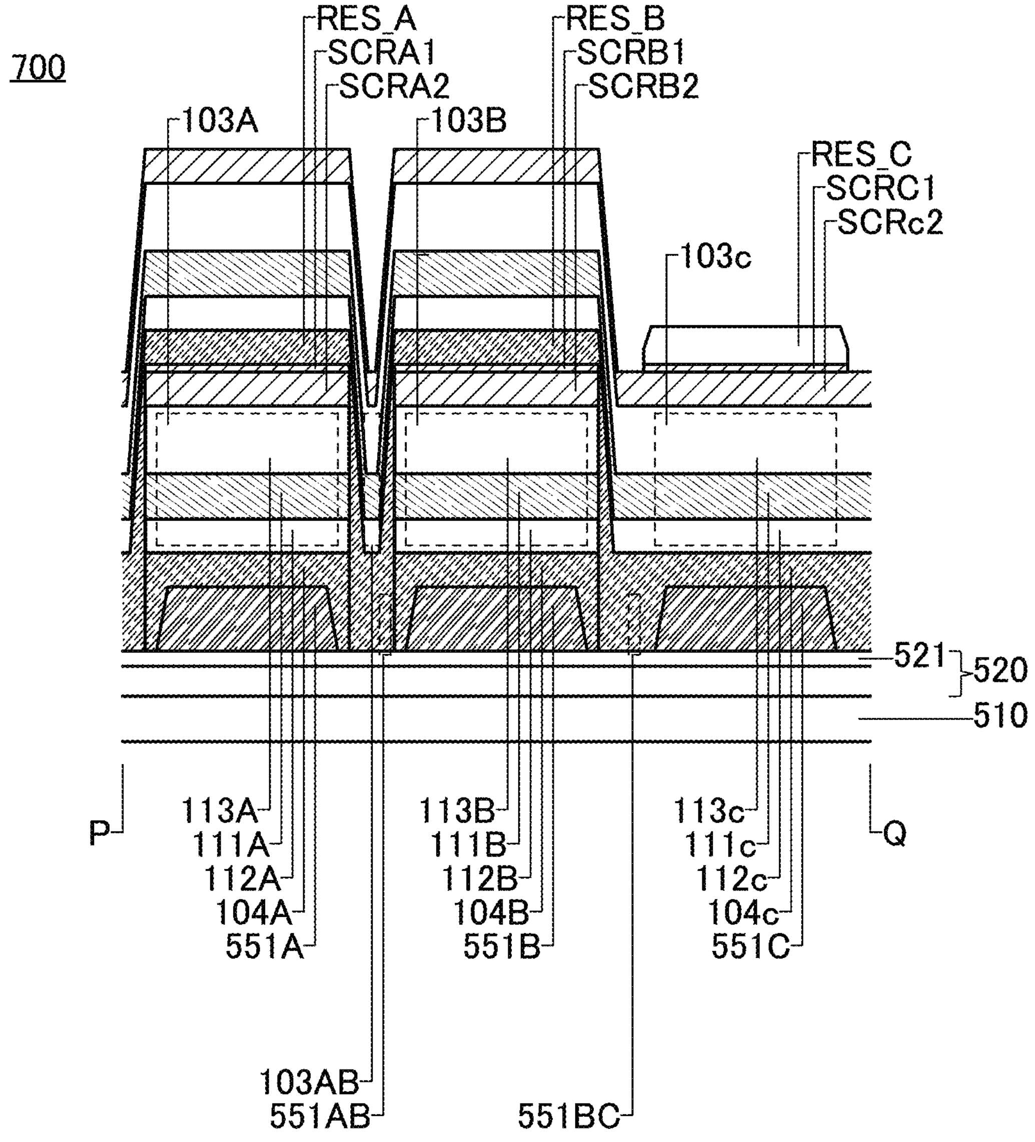
FIG. 9 illustrates a method for manufacturing a display apparatus of an embodiment.

FIG. 9 is a cross-sectional view illustrating the method for manufacturing the display apparatus of one embodiment of the present invention.

Figure 10:
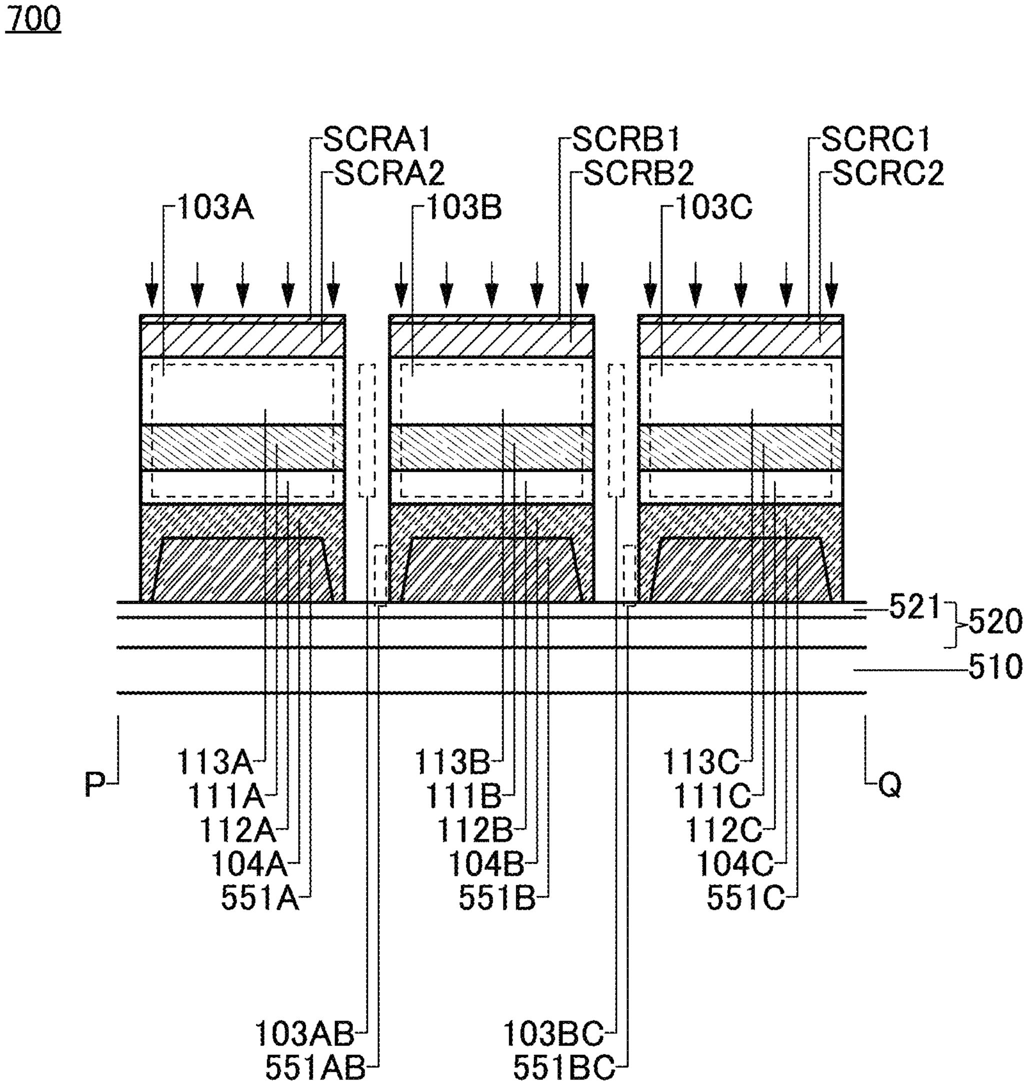
FIG. 10 illustrates a method for manufacturing a display apparatus of an embodiment.

FIG. 10 is a cross-sectional view illustrating the method for manufacturing the display apparatus of one embodiment of the present invention.

Figure 11:
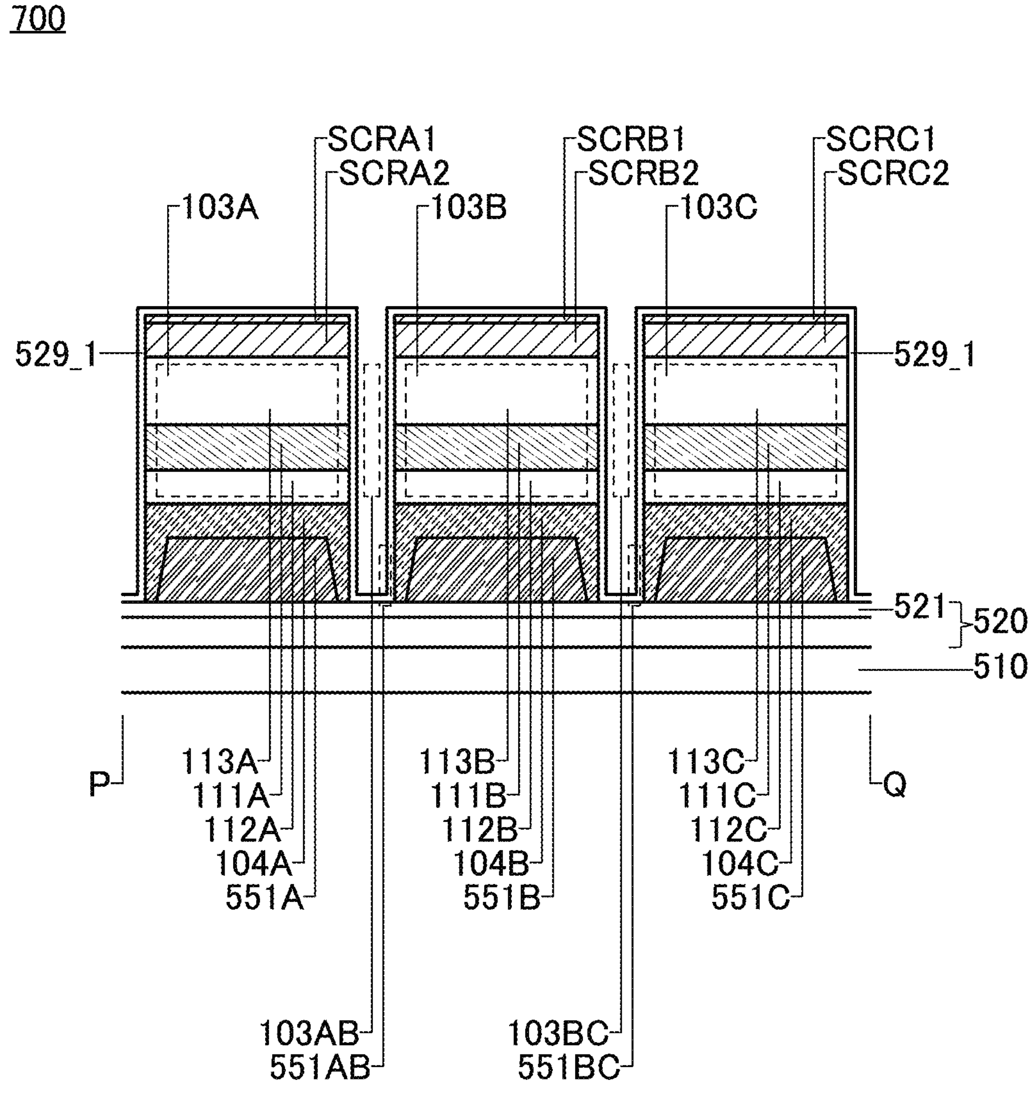
FIG. 11 illustrates a method for manufacturing a display apparatus of an embodiment.

FIG. 11 is a cross-sectional view illustrating the method for manufacturing the display apparatus of one embodiment of the present invention.

Figure 12:
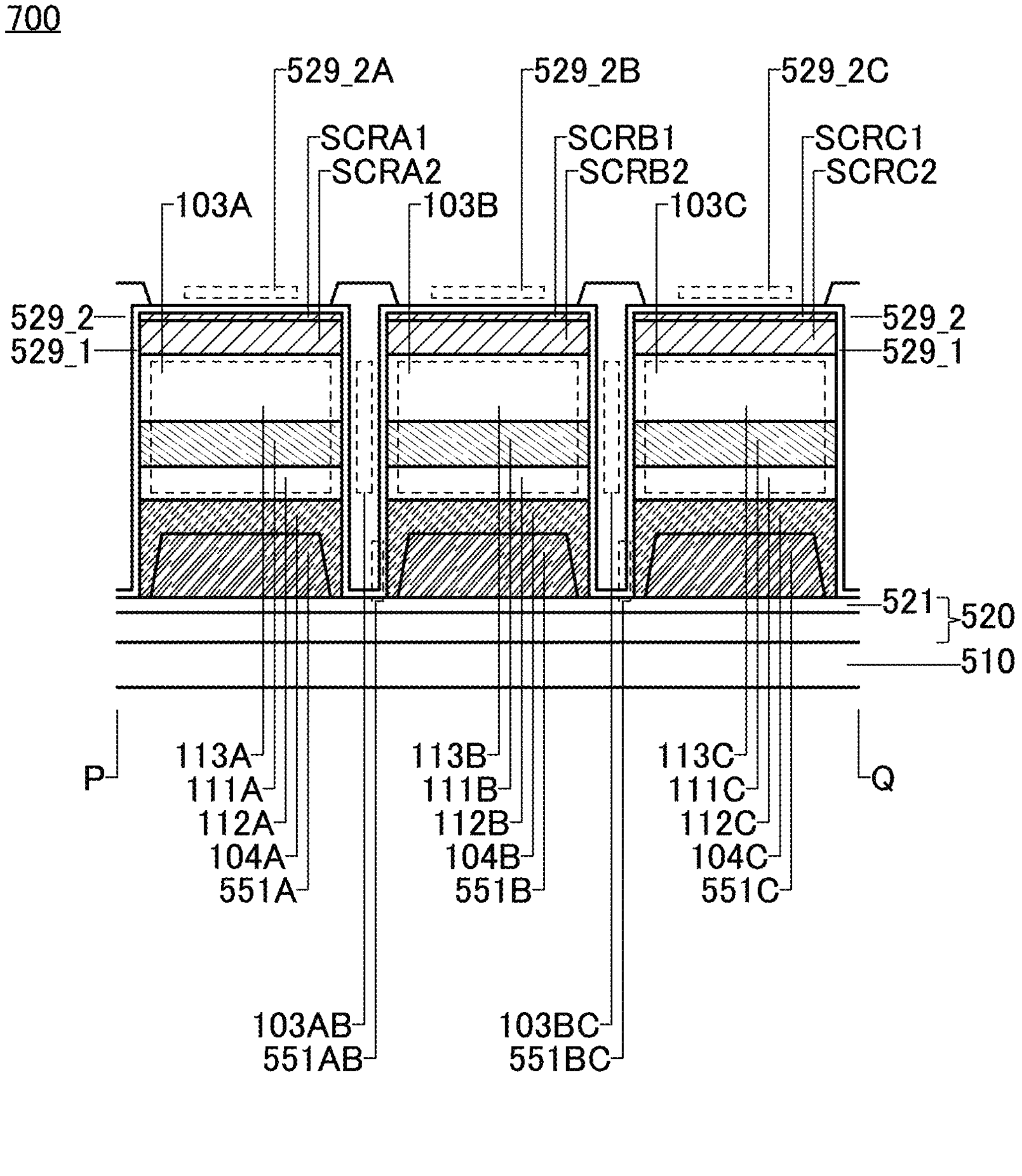
FIG. 12 illustrates a method for manufacturing a display apparatus of an embodiment.

FIG. 12 is a cross-sectional view illustrating the method for manufacturing the display apparatus of one embodiment of the present invention.

Figure 13:
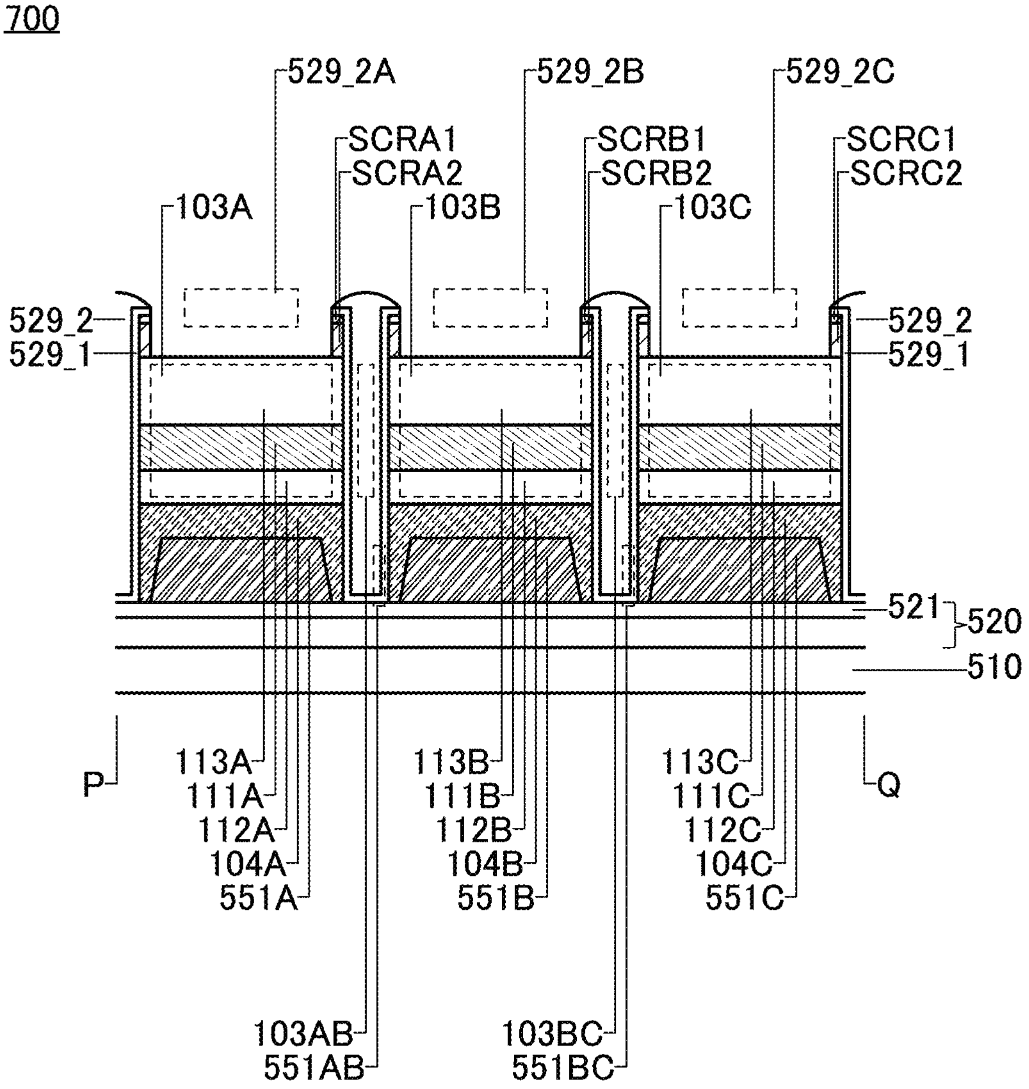
FIG. 13 illustrates a method for manufacturing a display apparatus of an embodiment.

FIG. 13 is a cross-sectional view illustrating the method for manufacturing the display apparatus of one embodiment of the present invention.

Figure 14A:
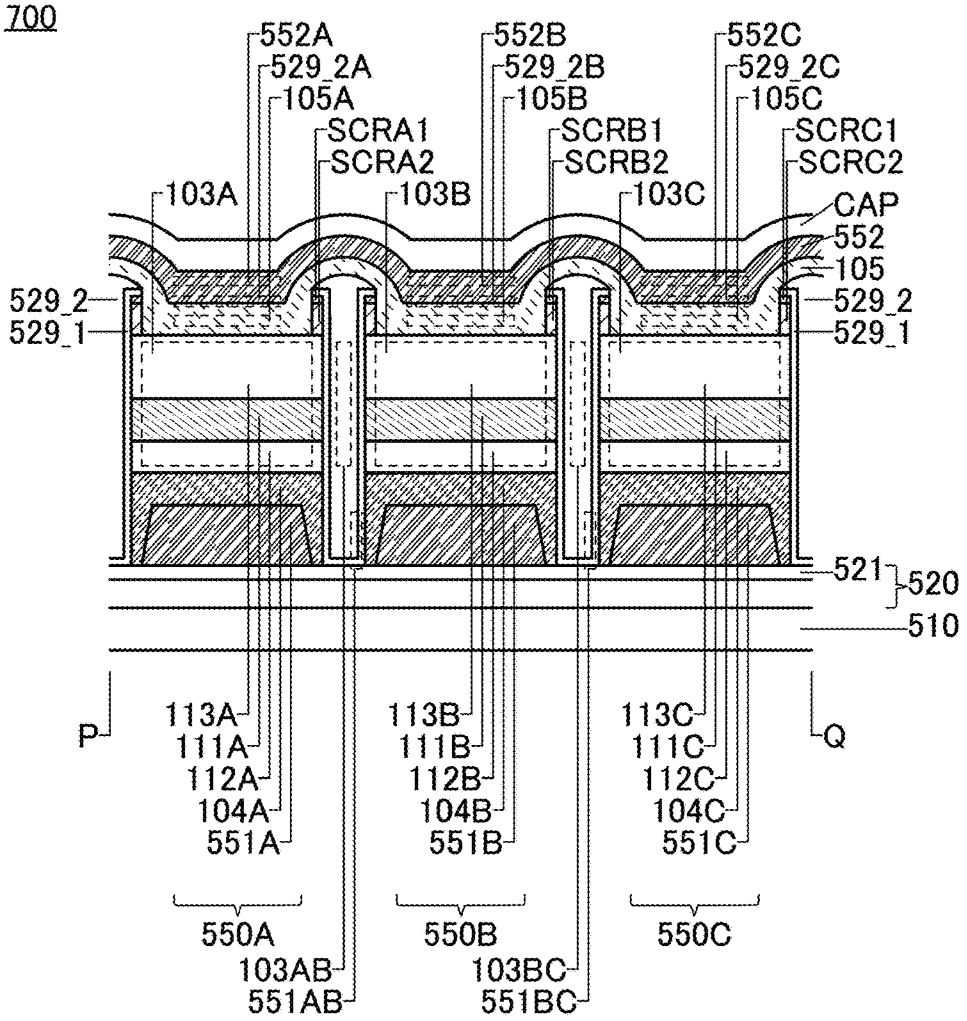
FIGS. 14A and 14B illustrate a method for manufacturing a display apparatus of an embodiment.
Figure 14B:
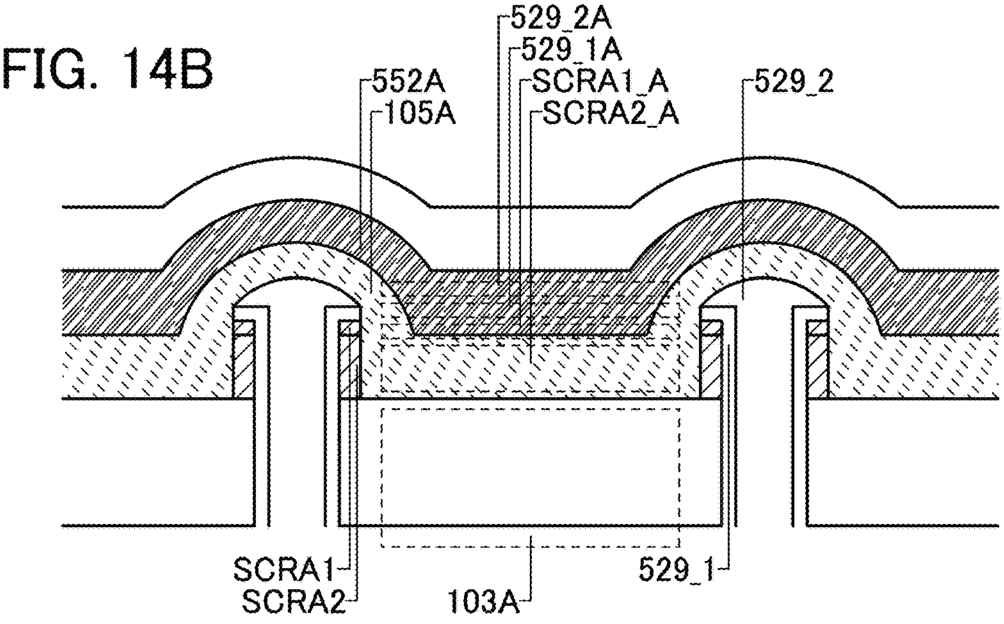

FIGS. 14A and 14B are cross-sectional views illustrating the method for manufacturing the display apparatus of one embodiment of the present invention.

Structure Example 1 of Display Apparatus 700

A display apparatus 700 described in this embodiment includes a pixel set 703 (see FIG. 1A). The display apparatus 700 includes a substrate 510 and a functional layer 520.

The pixel set 703 includes a pixel 702A, a pixel 702B, and a pixel 702C (see FIG. 1B).

The pixel 702A includes a light-emitting device 550A and a pixel circuit 530A. The light-emitting device 550A is electrically connected to the pixel circuit 530A (see FIGS. 1C and 1D).

The pixel 702B includes a light-emitting device 550B and a pixel circuit 530B. The light-emitting device 550B is electrically connected to the pixel circuit 530B.

The pixel 702C includes a light-emitting device 550C and a pixel circuit 530C. The light-emitting device 550C is electrically connected to the pixel circuit 530C.

Note that the functional layer 520 includes an insulating film 521, the pixel circuits 530A, 530B, and 530C. The pixel circuit 530A is positioned between the light-emitting device 550A and the substrate 510, the pixel circuit 530B is positioned between the light-emitting device 550B and the substrate 510, and the pixel circuit 530C is positioned between the light-emitting device 550C and the substrate 510.

In the display apparatus 700 of one embodiment of the present invention, for example, the light-emitting device 550A emits light ELA in a direction where the pixel circuit 530A is not provided, the light-emitting device 550B emits light ELB in a direction where the pixel circuit 530B is not provided, and the light-emitting device 550C emits light ELC in a direction where the pixel circuit 530C is not provided (see FIG. 1C). In other words, the display apparatus 700 of one embodiment of the present invention is a top-emission display apparatus.

In the display apparatus 700 of one embodiment of the present invention, for example, the light-emitting device 550A emits light ELA in a direction where the pixel circuit 530A is provided, the light-emitting device 550B emits light ELB in a direction where the pixel circuit 530B is provided, and the light-emitting device 550C emits light ELC in a direction where the pixel circuit 530C is provided (see FIG. 1D). In other words, the display apparatus 700 of one embodiment of the present invention is a bottom-emission display apparatus.

Structure Example 1 of Light-Emitting Device 550A

The light-emitting device 550A includes an electrode 551A, a unit 103A, and an electrode 552A (see FIG. 2). The light-emitting device 550A further includes a layer 104A, a layer 105A, and a layer CAP. The unit 103A includes a layer 112A, a layer 111A, and a layer 113A.

The electrode 551A is positioned between the unit 103A and the insulating film 521, and the electrode 551A has a thickness TA (see FIG. 3B).

For example, a conductive oxide containing indium can be used for the electrode 551A. Specifically, indium oxide, indium oxide-tin oxide (abbreviation: ITO), indium oxide-tin oxide containing silicon or silicon oxide (abbreviation: ITSO), indium oxide-zinc oxide (IZO (registered trademark)), In—Ga—Zn oxide (abbreviation: IGZO), indium oxide containing tungsten oxide and zinc oxide (abbreviation: IWZO), or the like can be used.

The unit 103A is positioned between the electrode 551A and the electrode 552A (see FIG. 2). The unit 103A contains a light-emitting material EMA.

Note that the details of a structure applicable to the light-emitting device 550A are described in Embodiments 2 to 6.

Structure Example 2 of Light-Emitting Device 550A

The light-emitting device 550A includes a layer SCRA1 and a layer SCRA2 (see FIG. 2 and FIG. 3A).

The layer SCRA1 is positioned between the electrode 552A and the unit 103A and has an opening SCRA1_A (see FIG. 3A). The opening SCRA1_A overlaps with the electrode 551A.

For example, a material containing oxygen and aluminum can be used for the layer SCRA1. Specifically, aluminum oxide can be used for the layer SCRA1. Alternatively, a metal, an alloy, or a metal oxide can be used for the layer SCRA1. Specifically, any of molybdenum (Mo), titanium (Ti), aluminum (Al), tungsten (W), and the like or an alloy containing any of them can be used for the layer SCRA1. Moreover, a metal oxide such as IGZO can be used for the layer SCRA1.

The layer SCRA2 is positioned between the layer SCRA1 and the unit 103A and has an opening SCRA2_A. The opening SCRA2_A overlaps with the opening SCRA1_A.

For example, a water-soluble material can be used for the layer SCRA2. In other words, a material that will be dissolved in a solvent containing water can be used for the layer SCRA2. Specifically, a material having higher water solubility than the unit 103A can be used for the layer SCRA2. For example, a material that will be dissolved in an aqueous solution containing hydrofluoric acid (HF) can be used for the layer SCRA2. Furthermore, a material that will be dissolved in an aqueous solution containing tetramethyl ammonium hydroxide (abbreviation: TMAH) can be used for the layer SCRA2.

Specifically, a metal complex such as tris(8-quinolinolato)aluminum(III) (abbreviation: $Alq_3$), bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used for the layer SCRA2.

Organic compounds represented below by Structural Formulae (101) to (116) and Structural Formulae (121) to (138) can be used for the layer SCRA2.

[Chemical Formulae 1]

(101)

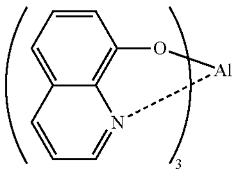

(102)

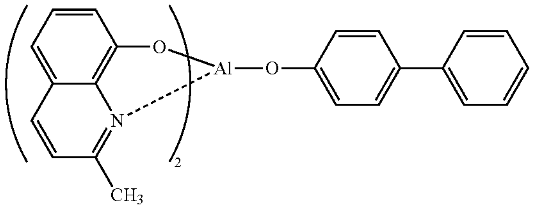

(103)

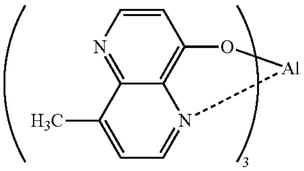

(104)

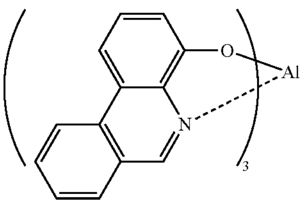

-continued
(105)
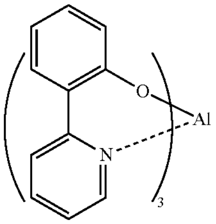
(106)
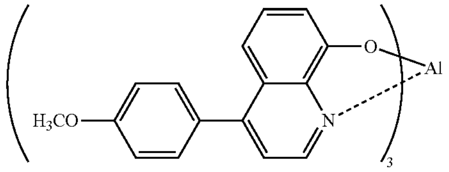
(107)
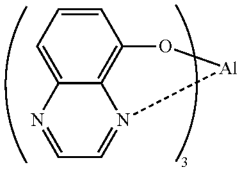
(108)
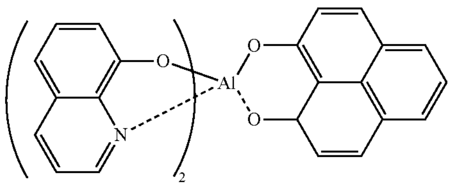
(109)
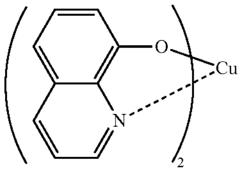
(110)
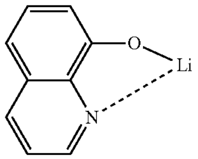
(111)
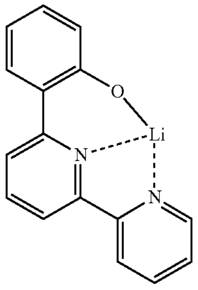
(112)
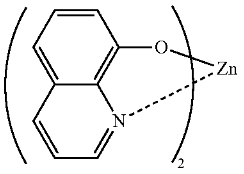
-continued
(113)
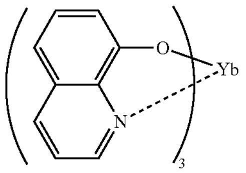
(114)
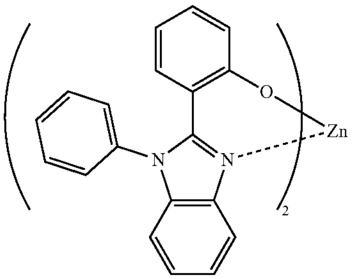
(115)
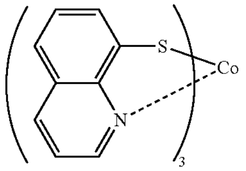
(116)
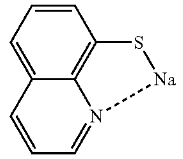
[Chemical Formulae 2]
(121)
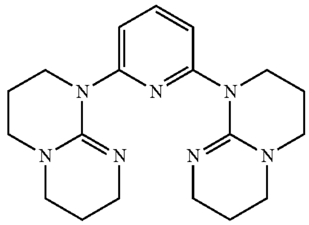
(122)
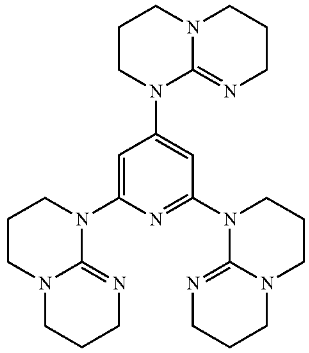

-continued
(123)
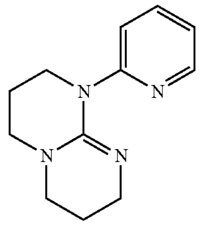
(124)
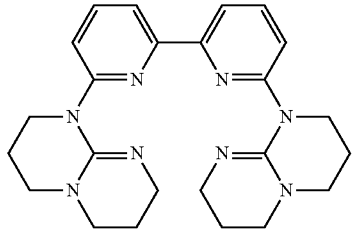
(125)
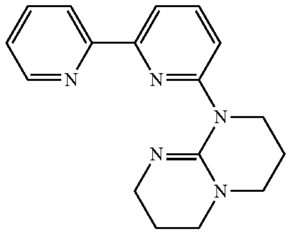
(126)
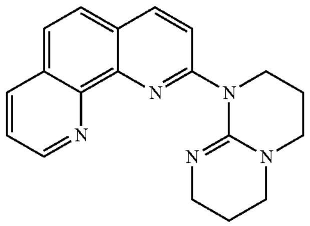
(127)
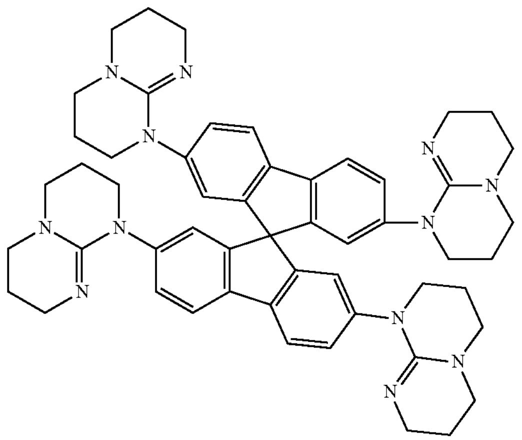
-continued
(128)
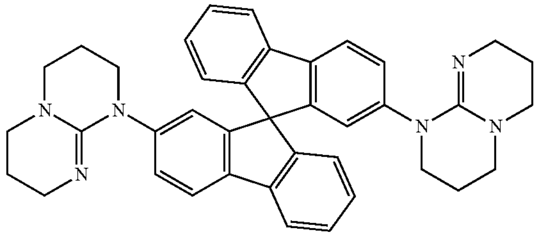
(129)
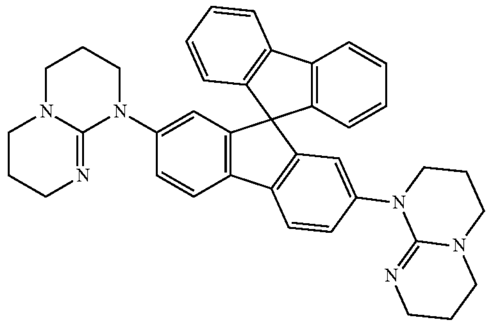
(130)
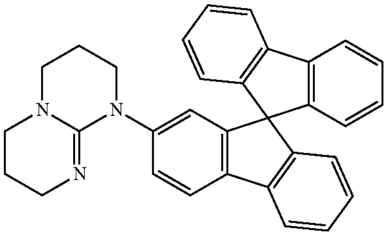
(131)
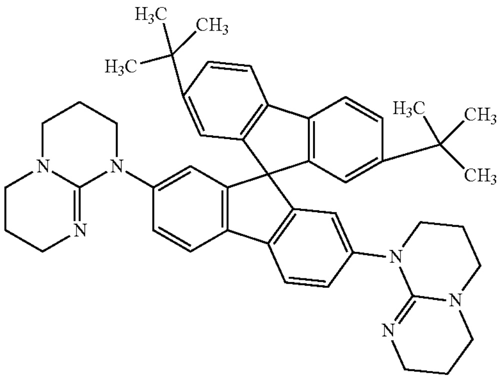
[Chemical Formulae 3]
(132)
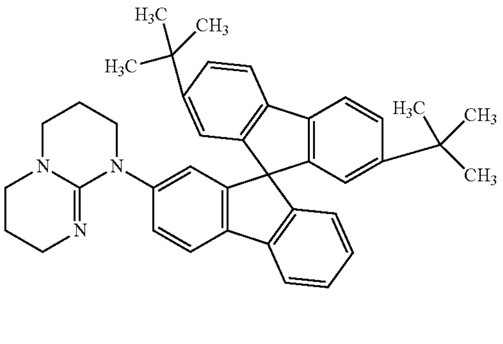

-continued (133)

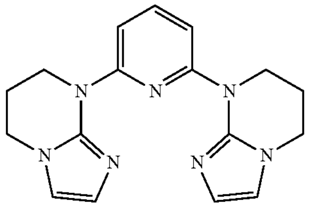

(134)

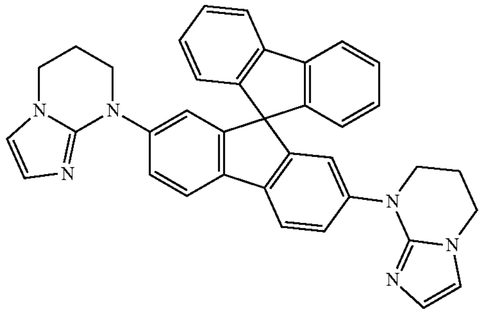

(135)

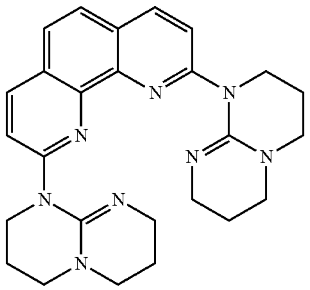

(136)

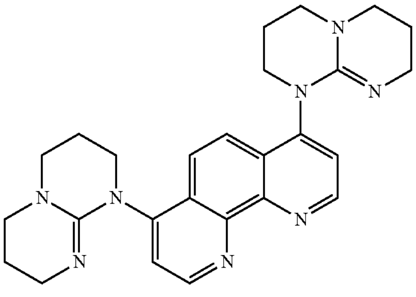

(137)

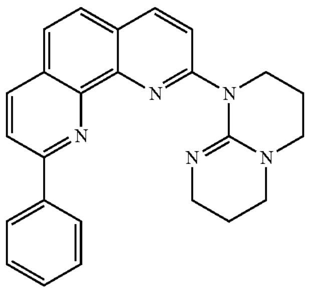

-continued (138)

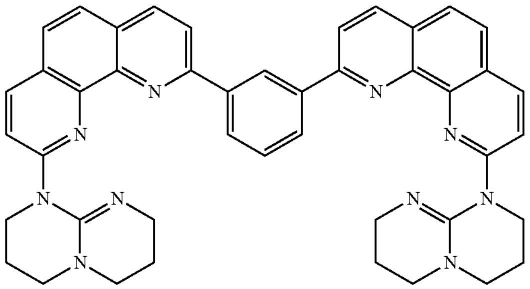

Thus, even when the properties of the layer SCRA2 change in the manufacturing process, for example, the layer SCRA2 can be removed from above the unit 103A to form the light-emitting device 550A. Furthermore, the unit 103A can be protected from being damaged in the manufacturing process. As a result, a novel display apparatus that is highly convenient, useful, or reliable can be provided.

Structure Example of Light-Emitting Device 550B

The light-emitting device 550B includes an electrode 551B, a unit 103B, and an electrode 552B (see FIG. 2). The light-emitting device 550B further includes a layer 104B, a layer 105B, and the layer CAP. The unit 103B includes a layer 112B, a layer 111B, and a layer 113B.

The electrode 551B is positioned between the unit 103B and the insulating film 521 and a gap 551AB is positioned between the electrode 551B and the electrode 551A. The electrode 551B has a thickness TB, which is smaller than the thickness TA (see FIG. 3B). Note that a difference in thickness between the electrodes is exaggerated in FIG. 3B.

The unit 103B is positioned between the electrode 551B and the electrode 552B (see FIG. 2). Note that the unit 103B contains a light-emitting material EMB. A gap 103AB is positioned between the unit 103B and the unit 103A and overlaps with the gap 551AB.

Structure Example of Light-Emitting Device 550C

The light-emitting device 550C includes an electrode 551C, a unit 103C, and an electrode 552C (see FIG. 2). The light-emitting device 550C further includes a layer 104C, a layer 105C, and the layer CAP. The unit 103C includes a layer 112C, a layer 111C, and a layer 113C.

The electrode 551C is positioned between the unit 103C and the insulating film 521 and a gap 551BC is positioned between the electrode 551C and the electrode 551B. The electrode 551C has a thickness TC, which is smaller than the thickness TB (see FIG. 3B).

The unit 103C is positioned between the electrode 551C and the electrode 552C (see FIG. 2). Note that the unit 103C contains a light-emitting material EMC. A gap 103BC is positioned between the unit 103C and the unit 103B and overlaps with the gap 551BC.

Structure Example 2 of Display Apparatus 700

The display apparatus 700 described in this embodiment includes a layer 529_1.

The layer 529_1 is in contact with the unit 103A and the unit 103B in the gap 103AB, in contact with the unit 103B and the unit 103C in the gap 103BC, and in contact with the insulating film 521 in the gap 551AB and the gap 551BC.

Thus, even when the properties of the surface change in the manufacturing process, for example, the electrode 551B from which the surface is removed can be used for the light-emitting device 550B. A phenomenon in which the driving voltage of the light-emitting device 550B increases due to the properties of the surface of the electrode 551B can be inhibited. Occurrence of a phenomenon in which one of the light-emitting device 550A and the light-emitting device 550B emits light with unintended luminance in accordance with light emission of the other of the light-emitting device 550A and the light-emitting device 550B can be suppressed. In addition, the light-emitting device 550A and the light-emitting device 550B can be individually driven. Occurrence of a cross talk phenomenon between adjacent light-emitting devices can be suppressed. The resolution of the display apparatus can be increased. The aperture ratio of a pixel of the display apparatus can be increased. As a result, a novel display apparatus that is highly convenient, useful, or reliable can be provided.

Structure Example 3 of Display Apparatus 700

The display apparatus 700 described in this embodiment includes a conductive film 552 and a layer 529_2 (see FIG. 2 and FIG. 3A).

The conductive film 552 includes the electrodes 552A, 552B, and 552C.

The layer 529_2 is positioned between the conductive film 552 and the layer 529_1 and has an opening 529_2A.

The layer 529_1 has an opening 529_1A. The opening 529_1A overlaps with the openings SCRA1_A, SCRA2_A, and 529_2A.

For example, the opening 529_2A includes an end portion substantially aligned with end portions of the openings 529_1A, SCRA1_A, and SCRA2_A. By an etching method, the openings 529_1A, SCRA1_A, and SCRA2_A may each be processed to be larger than the opening 529_2A. Note that the openings 529_1A, SCRA1_A, and SCRA2_A are each processed to be larger than the opening 529_2A by less than or equal to 500 nm, preferably less than or equal to 200 nm, further preferably less than or equal to 100 nm.

Accordingly, a gap can be formed small between the layer 529_2 and the unit 103A along with side etching after the removal of the layer SCRA2 from above the unit 103A. As a result, a novel display apparatus that is highly convenient, useful, or reliable can be provided.

<Method for Manufacturing Display Apparatus>

A method for manufacturing the display apparatus of one embodiment of the present invention will be described.

<<Manufacturing Method Example>>

The method for manufacturing the display apparatus of one embodiment of the present invention includes the following steps.

[Step S1]

In Step S1, the electrode 551A, the electrode 551B, and the gap 551AB positioned between the electrode 551A and the electrode 551B are formed over the insulating film 521 (see FIG. 4). In addition, the electrode 551C and the gap 551BC positioned between the electrode 551B and the electrode 551C are formed over the insulating film 521.

For example, a conductive film can be formed by a sputtering method and then processed into a predetermined shape by a photolithography method.

[Step S2]

In Step S2, a film 104*a*, a film 103*a*, and a film SCRa2 are formed over the electrodes 551A, 551B, and 551C (see FIG. 5). For example, a stacked-layer film including a film 112*a*, a film 111*a*, and a film 113*a* can be used as the film 103*a*. Note that a film containing the light-emitting material EMA can be used as the film 111*a*. A material for protecting the film 103*a* in a processing step can be used for the film SCRa2.

For example, a predetermined film can be formed by a resistance-heating method. Specifically, an organic compound(s) can be deposited or co-deposited.

[Step S3]

In Step S3, the layer SCRA1 overlapping with the electrode 551A is formed. For example, a film SCRa1, which is a stacked-layer film including a film formed by an ALD method and a film formed by a sputtering method, is processed and can be used as the layer SCRA1. Specifically, a stacked-layer film including a film containing aluminum oxide formed by an ALD method and a film containing molybdenum formed by a sputtering method can be used.

For example, the layer SCRA1 can be processed into a predetermined shape by an etching method using a resist RES_A formed using a photosensitive polymer.

Note that the film SCRa2 is formed over a surface of the film 103*a* and then the film SCRa1 is formed over a surface of the film SCRa2, whereby the film 103*a* can be protected from being damaged in the formation step of the film SCRa1.

When the film SCRa1 is formed by an ALD method over the surface of the film 103*a*, for example, the molecular structure of an organic compound contained in the film 103*a* might change. In an ALD method, the surface of the film 103*a* is alternately exposed to a gas containing a precursor and a gas containing an oxidizer. For example, in an ALD method using a gas containing trimethylaluminum and a gas containing oxygen, water, or the like as an oxidizer, the organic compound contained in the film 103*a* may react with trimethylaluminum and a methyl group may be added to the organic compound. Moreover, the organic compound may react with the oxidizer and an oxide such as an oxygen molecule adduct or an oxygen adduct of the organic compound may be generated. Furthermore, a double bond or a triple bond of the organic compound may be hydrogenated. When such reactions occur, the organic compound contained in the film 103*a* changes into a compound in which the mass corresponding to an oxygen molecule, an oxygen atom, a hydrogen molecule, a hydrogen atom, or a methyl group is increased. As a result, the film 103*a* becomes a low-purity film containing the organic compound with an increased mass. A reduction in the purity of the film can be evaluated by liquid chromatography-mass spectrometry (LC-MS) on the film. Specifically, when the film 103*a* is analyzed by LC-MS and the purity of the film is not reduced, only the organic compound used for forming the film 103*a* is detected. That is, LC-MS detects only ions derived from the organic compound used for forming the film 103*a*. Meanwhile, in LC-MS analysis on the film 103*a* in the case where the film SCRa1 is formed by an ALD method and some organic compounds change into the above-described compounds due to the ALD method, an oxygen adduct and the like are detected. In addition to an ME ion or an $M+[H^+]$ ion of the organic compound used for forming the film 103*a* (M represents the mass of the organic compound used for forming the film 103*a*), the following ions are detected, for example: an $[M+32]^+$ ion and an $[M+32]\pm[H^+]$ ion (in the case of an oxygen molecule adduct), an $[M+16]^+$ ion and an $[M+16]+[H^+]$ ion (in the case of an oxygen adduct), an $[M+14n]^+$ ion and an $[M+14n]+[H^+]$ ion (in the case of methylation at n positions), and an $[M+2m]^+$ ion and an $[M+2m]+[H^+]$ ion (in the case of hydrogenation at m positions).

The film 103*a* preferably contains a high-purity organic compound, in which case the driving voltage can be reduced, an element with low power consumption can be provided, and a highly reliable element can be provided. Thus, in the case where the $[M+32]^+$ ion, the $[M+32]+[H^+]$ ion, the $[M+16]^+$ ion, the $[M+16]+[H^+]$ ion, the $[M+14n]^+$ ion, the $[M+14n]+[H^+]$ ion, the $[M+2m]^+$ ion, and the $[M+2m]+[H^+]$ ion are detected in LC-MS analysis on the film 103*a*, it is preferable that the amount of the ions be sufficiently small with respect to the organic compound. Specifically, when an MS chromatogram peak corresponding to the organic compound is observed, the area of a peak derived from the organic compound is obtained with a photodiode array (PDA) detector. Moreover, when an MS chromatogram peak corresponding to each of the above-listed ions is observed, the area of a peak derived from the ion is obtained. The proportion of the total area of the peaks derived from the above-listed ions is preferably less than 5%, further preferably less than 1%, still further preferably less than 0.1%, yet still further preferably less than or equal to the lower detection limit with respect to the area of the peak derived from the organic compound. Moreover, the proportion of the area of the peak derived from each of the above-listed ions is independently preferably less than 5%, further preferably less than 1%, still further preferably less than 0.1%, yet still further preferably less than or equal to the lower detection limit with respect to the area of the peak derived from the organic compound. Addition of an oxygen molecule, addition of one or more oxygen atoms, methylation, hydrogenation, and the like may occur at the same time in one organic compound; reaction may occur at several positions in one organic compound; and the position where reaction occurs is different between organic compounds even when the reaction occurs at one position. Thus, compounds having the same mass do not always have the same molecular structure. For the analysis, an apparatus in which ultra-high-performance liquid chromatography (UHPLC) is coupled with a mass spectrometer (MS) can be used. For example, an apparatus including a combination of ACQUITY UPLC and Xevo G2 Tof MS, which are manufactured by Waters Corporation, or a combination of UltiMate 3000 and Q Exactive, which are manufactured by Thermo Fisher Scientific K.K., can be used.

When another film is stacked by a sputtering method over the film formed by an ALD method over the surface of the film 103*a*, a change in the molecular structure of the organic compound contained in the film 103*a* may be promoted by addition of an oxygen molecule, addition of one or more oxygen atoms, hydrogenation, or the like. The film 103*a* preferably contains a high-purity organic compound, in which case the driving voltage can be reduced, an element with low power consumption can be provided, and a highly reliable element can be provided. In the comparison between the case of forming the film SCRa1 by an ALD method over the surface of the film 103*a* and the case of forming another film by a sputtering method over the film SCRa1, it is preferable that each of an oxygen molecule adduct, an oxygen adduct, and a hydrogen adduct of the organic compound contained in the film 103*a* of the latter case be not increased independently from that in the former case. Specifically, the proportion of the area of a peak derived from each of the observed ions (the proportion with respect to the area of a peak derived from the organic compound) of the latter case is independently increased from that in the former case by preferably less than 5%, further preferably less than 1%, still further preferably less than 0.1%, and no increase is further preferable.

When another film is stacked by a sputtering method over the film formed by an ALD method over the surface of the film 103*a*, the amount of the organic compound contained in the film 103*a* may be reduced. The film 103*a* preferably has an optimal thickness (amount) for driving an element, in which case the driving voltage can be reduced, an element with low power consumption can be provided, a highly reliable element can be provided, and an element with high color purity can be provided. Thus, the amount of the organic compound contained in the film 103*a* is preferably the same between the case of forming the film SCRa1 by an ALD method over the surface of the film 103*a* and the case of forming another film by a sputtering method over the film SCRa1. Specifically, the absolute value of a difference in the proportion of the area of a peak derived from each of the observed ions (the proportion with respect to the area of a peak derived from the organic compound) between the former case and the latter case is preferably less than 5%, further preferably less than 1%, still further preferably less than 0.1%, and no difference is further preferable.

[Step S4]

In Step S4, the films 104*a*, 103*a*, and SCRa2 are removed from above the electrode 551B by an etching method using the layer SCRA1, whereby the layer 104A, the unit 103A, and the layer SCRA2 that overlap with the electrode 551A are formed (see FIG. 6). That is, the film 104*a*, the film 103*a*, and the film SCRa2 are processed into the layer 104A, the unit 103A, and the layer SCRA2, respectively. Moreover, the film 112*a*, the film 111*a*, and the film 113*a* are processed into the layer 112A, the layer 111A, and the layer 113A, respectively.

For example, the unit 103A can be processed into a predetermined shape by a dry etching method using the layer SCRA1. Specifically, an oxygen-containing gas can be used as an etching gas. Note that the layer SCRA1 functions as a hard mask.

In Step S4, the electrodes 551B and 551C are exposed. The electrodes 551B and 551C are exposed to an etching gas used in a dry etching method. The properties of surfaces of the electrodes 551B and 551C are different from those of a surface of the electrode 551A.

The conductivity of a conductive oxide such as indium oxide-tin oxide (abbreviation: ITO) or indium oxide-tin oxide containing silicon or silicon oxide (abbreviation: ITSO) is derived from levels derived from a tin atom or levels derived from an oxygen vacancy, for example. In the case where the electrodes 551B and 551C each including any of the above conductive oxides are exposed to an etching gas containing oxygen, oxygen is added to the electrodes 551B and 551C. In some case, the conductivity decreases and the resistance increases. Compared to the electrode 551A that supplies holes to the layer 104A, the electrode 551B and the electrode 551C are less likely to supply holes to the layer 104B and the layer 104C, respectively.

[Step S5]

In Step S5, the surfaces of the electrodes 551B and 551C are removed by an etching method to expose new surfaces. This makes the thickness TB of the electrode 551B smaller than the thickness TA of the electrode 551A.

For example, a region from the surface to a depth of several nanometers is removed from each of the electrodes 551B and 551C. Specifically, a wet etching method can be used. Note that an etchant is selected in accordance with a conductive material used for the electrodes 551B and 551C. In the case of using indium oxide-tin oxide (abbreviation: ITO) as a conductive material, for example, a solution containing oxalic acid can be used as the etchant. In the case of using IZO (registered trademark) or IGZO as a conductive material, a solution containing oxalic acid, a solution containing phosphoric acid, or a solution containing hydrofluoric acid can be used as the etchant.

[Step S6]

In Step S6, a film 104*b*, a film 103*b*, and a film SCRb2 are formed over the layer SCRA1, the electrode 551B, and the electrode 551C (see FIG. 7). For example, a stacked-layer film including a film 112*b*, a film 111*b*, and a film 113*b* can be used as the film 103*b*. Note that a film containing the light-emitting material EMB can be used as the film 111*b*. A material for protecting the film 103*b* in a processing step can be used for the film SCRb2.

For example, a predetermined film can be formed by a resistance-heating method. Specifically, an organic compound(s) can be deposited or co-deposited.

[Step S7]

In Step S7, a layer SCRB1 overlapping with the electrode 551B is formed. For example, a stacked-layer film including a film formed by an ALD method and a film formed by a sputtering method is processed and can be used as the layer SCRB1. Specifically, a stacked-layer film including a film containing aluminum oxide formed by an ALD method and a film containing molybdenum formed by a sputtering method can be used.

For example, the layer SCRB1 can be processed into a predetermined shape by an etching method using a resist RES_B formed using a photosensitive polymer.

[Step S8]

In Step S8, the films 104*b*, 103*b*, and SCRb2 are removed from above the layer SCRA1 and the gap 551AB by an etching method using the layer SCRB1, whereby the layer 104B, the unit 103B, and a layer SCRB2 that overlap with the electrode 551B are formed. In addition, the gap 103AB that overlaps with the gap 551AB is formed (see FIG. 8). That is, the film 104*b*, the film 103*b*, and the film SCRb2 are processed into the layer 104B, the unit 103B, and the layer SCRB2, respectively. Moreover, the film 112*b*, the film 111*b*, and the film 113*b* are processed into the layer 112B, the layer 111B, and the layer 113B, respectively.

For example, the unit 103B can be processed into a predetermined shape by a dry etching method using the layer SCRB1. Specifically, an oxygen-containing gas can be used as an etching gas. Note that the layer SCRB1 functions as a hard mask.

In Step S8, the electrode 551C is exposed.

[Step S9]

In Step S9, the surface of the electrode 551C is removed by an etching method to expose a new surface. This makes the thickness TC of the electrode 551C smaller than the thickness TB of the electrode 551B.

For example, a region from the surface to a depth of several nanometers is removed from the electrode 551C. Specifically, a wet etching method can be used.

[Step S10]

In Step S10, a film 104*c*, a film 103*c*, and a film SCRc2 are formed over the layer SCRA1, the layer SCRB1, and the electrode 551C (see FIG. 9). For example, a stacked-layer film including a film 112*c*, a film 111*c*, and a film 113*c* can be used as the film 103*c*. Note that a film containing the light-emitting material EMC can be used as the film 111*c*. A material for protecting the film 103*c* in a processing step can be used for the film SCRc2.

For example, a predetermined film can be formed by a resistance-heating method. Specifically, an organic compound(s) can be deposited or co-deposited.

[Step S11]

In Step S11, a layer SCRC1 overlapping with the electrode 551C is formed. For example, a stacked-layer film including a film formed by an ALD method and a film formed by a sputtering method is processed and can be used as the layer SCRC1. Specifically, a stacked-layer film including a film containing aluminum oxide formed by an ALD method and a film containing molybdenum formed by a sputtering method can be used.

For example, the layer SCRC1 can be processed into a predetermined shape by an etching method using a resist RES_C formed using a photosensitive polymer.

[Step S12]

In Step S12, the films 104*c*, 103*c*, and SCRc2 are removed from above the layers SCRA1 and SCRB1 and the gaps 551AB and 551BC by an etching method using the layer SCRC1, whereby the layer 104C, the unit 103C, and a layer SCRC2 that overlap with the electrode 551C are formed. In addition, the gap 103BC that overlaps with the gap 551BC is formed (see FIG. 10). That is, the film 104*c*, the film 103*c*, and the film SCRc2 are processed into the layer 104C, the unit 103C, and the layer SCRC2, respectively. Moreover, the film 112*c*, the film 111*c*, and the film 113*c* are processed into the layer 112C, the layer 111C, and the layer 113C, respectively.

For example, the unit 103C can be processed into a predetermined shape by a dry etching method using the layer SCRC1. Specifically, an oxygen-containing gas can be used as an etching gas. Note that the layer SCRC1 functions as a hard mask.

[Step S13]

In Step S13, the layer 529_1 that is in contact with the insulating film 521 in the gap 551AB and covers the units 103A and 103B is formed by an ALD method (see FIG. 11). In addition, the layer 529_1 is in contact with the insulating film 521 in the gap 551BC and covers the units 103B and 103C.

[Step S14]

In Step S14, the layer 529_2 that fills the gaps 551AB and 103AB and has the opening 529_2A overlapping with the electrode 551A and an opening 529_2B overlapping with the electrode 551B is formed (see FIG. 12). Moreover, the layer 529_2 fills the gaps 551BC and 103BC and has an opening 529_2C overlapping with the electrode 551C.

Thus, the gaps 551AB and 103AB can be filled with the layers 529_1 and 529_2. Moreover, a step due to the gaps 551AB and 103AB can be reduced so as to be close to a flat plane. A phenomenon in which a cut or a split is generated due to the step in the conductive film 552 can be suppressed. In addition, with use of the layer 529_1, the contact between the layer 529_2 and each of the units 103A and 103B can be prevented in Step S14. With use of the layer 529_1, a phenomenon in which a substance that adversely affects the reliability of the light-emitting device 550A moves from the layer 529_2 to the unit 103A can be inhibited. With use of the layer 529_1, a phenomenon in which a substance that adversely affects the reliability of the light-emitting device 550B moves from the layer 529_2 to the unit 103B can be inhibited. As a result, a method for manufacturing a novel display apparatus that is highly convenient, useful, or reliable can be provided.

[Step S15]

In Step S15, by an etching method using the layer 529_2, the layers 529_1, SCRA1, and SCRA2 overlapping with the opening 529_2A are removed from above the electrode 551A and the layers 529_1, SCRB1, and SCRB2 overlapping with the opening 529_2B are removed from above the electrode 551B (see FIG. 13). In addition, the layers 529_1, SCRC1, and SCRC2 overlapping with the opening 529_2C are removed from above the electrode 551C.

For example, a wet etching method using the layer 529_2 functioning as a resist can be used. Note that an aqueous solution containing hydrofluoric acid (HF), an aqueous solution containing phosphoric acid, an aqueous solution containing nitric acid, or an aqueous solution containing tetramethyl ammonium hydroxide (abbreviation: TMAH) can be used as an etchant.

[Step S16]

In Step S16, the layer 105 is formed over the units 103A and 103B (see FIGS. 14A and 14B).

[Step S17]

In Step S17, the conductive film 552 is formed over the layer 105.

Accordingly, a display apparatus including the light-emitting device 550A including the electrode 551A and the light-emitting device 550B including the electrode 551B can be manufactured. The surface of the electrode 551B exposed to the etching process in Step S4 can be removed in Step S5. The properties of the surface of the electrode 551B can be made closer to those of the surface of the electrode 551A. A phenomenon in which the driving voltage of the light-emitting device 550B increases due to the properties of the surface of the electrode 551B can be inhibited. The gap 103AB can be formed between the unit 103A and the unit 103B. Moreover, a phenomenon in which one of the light-emitting device 550A and the light-emitting device 550B emits light with unintended luminance in accordance with light emission of the other of the light-emitting device 550A and the light-emitting device 550B can be suppressed. In addition, the light-emitting device 550A and the light-emitting device 550B can be individually driven. Occurrence of a cross talk phenomenon between adjacent light-emitting devices can be suppressed. The resolution of the display apparatus can be increased. The aperture ratio of a pixel of the display apparatus can be increased. As a result, a method for manufacturing a novel display apparatus that is highly convenient, useful, or reliable can be provided.

This embodiment can be combined with any of the other embodiments in this specification as appropriate.

Embodiment 2

In this embodiment, a structure of a light-emitting device 550X that can be used for a display apparatus of one embodiment of the present invention is described with reference to FIGS. 15A and 15B.

Figure 15A:
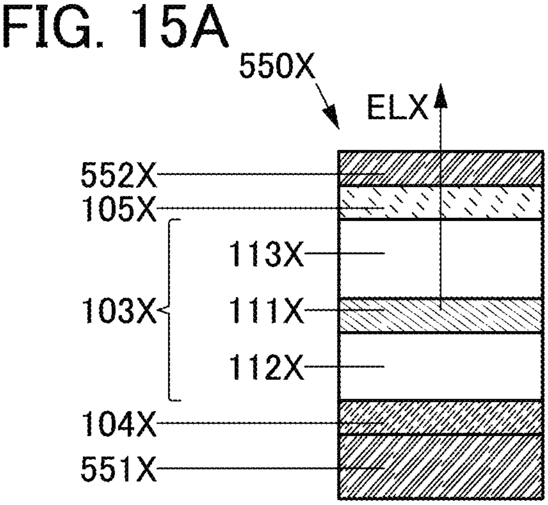
FIGS. 15A and 15B illustrate a structure of a light-emitting device of an embodiment.
Figure 15B:
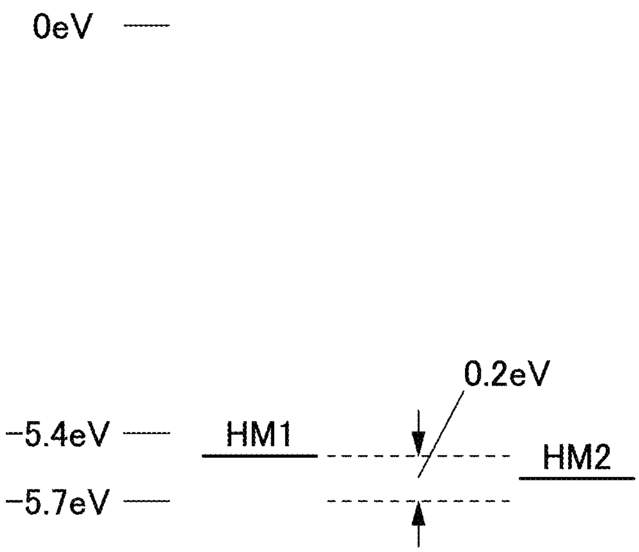

FIG. 15A is a cross-sectional view illustrating a structure of a light-emitting device to be described in this embodiment, and FIG. 15B is a diagram illustrating energy levels of materials used for the light-emitting device to be described in this embodiment.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

Structure Example of Light-Emitting Device 550X

The light-emitting device 550X described in this embodiment includes an electrode 551X, an electrode 552X, and a unit 103X. The electrode 552X overlaps with the electrode 551X, and the unit 103X is positioned between the electrode 552X and the electrode 551X.

Structure Example of Unit 103X

The unit 103X has a single-layer structure or a stacked-layer structure. For example, the unit 103X includes a layer 111X, a layer 112X, and a layer 113X (see FIG. 15A). The unit 103X has a function of emitting light ELX.

The layer 111X is positioned between the layer 113X and the layer 112X, the layer 113X is positioned between the electrode 552X and the layer 111X, and the layer 112X is positioned between the layer 111X and the electrode 551X.

For example, a layer selected from functional layers such as a light-emitting layer, a hole-transport layer, an electron-transport layer, and a carrier-blocking layer can be used for the unit 103X. A layer selected from functional layers such as a hole-injection layer, an electron-injection layer, an exciton-blocking layer, and a charge-generation layer can also be used for the unit 103X.

Structure Example of Layer 112X

A hole-transport material can be used for the layer 112X, for example. The layer 112X can be referred to as a hole-transport layer. A material having a wider bandgap than the light-emitting material contained in the layer 111X is preferably used for the layer 112X. In that case, transfer of energy from excitons generated in the layer 111X to the layer 112X can be inhibited.

[Hole-Transport Material]

A material having a hole mobility of $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

The following are examples that can be used as a compound having an aromatic amine skeleton: 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF).

As a compound having a carbazole skeleton, for example, 1,3-bis(N-carbazolyl)benzene (abbreviation: mCP), 4,4'-di (N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP) can be used.

As a compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV) can be used.

As a compound having a furan skeleton, for example, 4,4',4"-(benzene-1,3,5-triyl)tri(dibenzofuran) (abbreviation: DBF3P-II) or 4-{3-[3-(9-phenyl-9H-fluoren-9-yl)phenyl] phenyl}dibenzofuran (abbreviation: mmDBFFLBi-II) can be used.

Structure Example of Layer 113X

An electron-transport material, a material having an anthracene skeleton, and a mixed material can be used for the layer 113X, for example. The layer 113X can be referred to as an electron-transport layer. A material having a wider bandgap than the light-emitting material contained in the layer 111X is preferably used for the layer 113X. In that case, transfer of energy from excitons generated in the layer 111X to the layer 113X can be inhibited.

[Electron-Transport Material]

For example, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the electron-transport property in the electron-transport layer can be suppressed. The amount of electrons injected into the light-emitting layer can be controlled. The light-emitting layer can be prevented from having excess electrons.

For example, a metal complex or an organic compound having a π-electron deficient heteroaromatic ring skeleton can be used as the electron-transport material.

As a metal complex, bis(10-hydroxybenzo[h]quinolinato) beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis [2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus is preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II) can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3-(3'-(dibenzothiophen-4-yl)biphenyl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As a heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As a heterocyclic compound having a triazine skeleton, 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b] naphtho[1,2-d]furan-8-yl)phenyl]phenyl}-4,6-diphenyl-1,3,5-triazine (abbreviation: mBnfBPTzn), or 2-{3-[3-(benzo[b] naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used for the layer 113X. In particular, an organic compound having both an anthracene skeleton and a heterocyclic skeleton can be suitably used.

For example, an organic compound having both an anthracene skeleton and a nitrogen-containing five-membered ring skeleton can be used for the layer 113X. Alternatively, an organic compound having both an anthracene skeleton and a nitrogen-containing five-membered ring skeleton where two heteroatoms are included in a ring can be used for the layer 113X. Specifically, it is preferable to use, as the heterocyclic skeleton, a pyrazole ring, an imidazole ring, an oxazole ring, a thiazole ring, or the like.

For example, an organic compound having both an anthracene skeleton and a nitrogen-containing six-membered ring skeleton can be used for the layer 113X. Alternatively, an organic compound having both an anthracene skeleton and a nitrogen-containing six-membered ring skeleton where two heteroatoms are included in a ring can be used for the layer 113X. Specifically, it is preferable to use, as the heterocyclic skeleton, a pyrazine ring, a pyrimidine ring, a pyridazine ring, or the like.

Structure Example of Mixed Material

A material in which a plurality of kinds of substances are mixed can be used for the layer 113X. Specifically, a mixed material which contains an alkali metal, an alkali metal compound, or an alkali metal complex and an electron-transport substance can be used for the layer 113X. Note that the electron-transport material preferably has a highest occupied molecular orbital (HOMO) level of −6.0 eV or higher.

The mixed material can be suitably used for the layer 113X in combination with a structure using a composite material, which is separately described, for a layer 104X. For example, a composite material of an electron-accepting substance and a hole-transport material can be used for the layer 104X. Specifically, a composite material of an electron-accepting substance and a substance having a relatively deep HOMO level HM1, which is higher than or equal to −5.7 eV and lower than or equal to −5.4 eV, can be used for the layer 104X (see FIG. 15B). Using the mixed material for the layer 113X in combination with the structure using such a composite material for the layer 104X leads to an increase in the reliability of the light-emitting device.

Furthermore, a structure using a hole-transport material for the layer 112X is preferably combined with the structure using the mixed material for the layer 113X and the composite material for the layer 104X. For example, a substance having a HOMO level HM2, which differs by −0.2 eV to 0 eV from the relatively deep HOMO level HM1, can be used for the layer 112X (see FIG. 15B). This leads to an increase in the reliability of the light-emitting device. Note that in this specification and the like, the structure of the above-described light-emitting device may be referred to as a Recombination-Site Tailoring Injection structure (ReSTI structure).

The concentration of the alkali metal, the alkali metal compound, or the alkali metal complex preferably changes in the thickness direction of the layer 113X (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

Structure Example 1 of Layer 111X

Either a structure containing a light-emitting material or a structure containing a light-emitting material and a host material can be employed for the layer 111X, for example. The layer 111X can be referred to as a light-emitting layer. The layer 111X is preferably provided in a region where holes and electrons are recombined. This allows efficient conversion of energy generated by recombination of carriers into light and emission of the light.

Furthermore, the layer 111X is preferably provided apart from a metal used for the electrode or the like. In that case, a quenching phenomenon caused by the metal used for the electrode or the like can be inhibited.

It is preferable that a distance from an electrode or the like having reflectivity to the layer 111X be adjusted and the layer 111X be placed in an appropriate position in accordance with an emission wavelength. With this structure, the amplitude can be increased by utilizing an interference phenomenon between light reflected by the electrode or the like and light emitted from the layer 111X. Light with a predetermined wavelength can be intensified and the spectrum of the light can be narrowed. In addition, bright light emission colors with high intensity can be obtained. In other words, the layer 111X is placed in an appropriate position between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as the light ELX from the light-emitting material (see FIG. 15A).

[Fluorescent Substance]

A fluorescent substance can be used for the layer 111X. For example, fluorescent substances exemplified below can be used for the layer 111X. Note that fluorescent substances that can be used for the layer 111X are not limited to the following, and a variety of known fluorescent substances can be used for the layer 111X.

Specifically, any of the following fluorescent substances can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenyl amine (abbreviation: PCBAPA), N,N'-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N,N'-(pyrene-1,6-diyl)bis[(6,N-diphenylbenzo[b]naphtho[1,2-d]furan)-8-amine] (abbreviation: 1,6BnfAPrn-03), N,N'-diphenyl-N,N'-bis(9-phenyl-9H-carbazol-2-yl)naphtho[2,3-b; 6,7-*b*'] bisbenzofuran-3,10-diamine (abbreviation: 3,10PCA2Nbf(IV)-02), 3,10-bis[N-(dibenzofuran-3-yl)-N-phenylamino] naphtho[2,3-b;6,7-b']bisbenzofuran (abbreviation: 3,10FrA2Nbf(IV)-02), and the like.

Condensed aromatic diamine compounds typified by pyrenediamine compounds such as 1,6FLPAPrn, 1,6mMemFLPAPrn, and 1,6BnfAPrn-03 are particularly preferable because they have high hole-trapping properties and have high emission efficiency or high reliability.

Other examples of fluorescent substances include N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, 9,10-diphenyl-2-[N-phenyl-N-(9-phenyl-carbazol-3-yl)-amino]-anthracene (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracene-2-amine (abbreviation:

2YGABPhA), N,N,9-triphenylanthracene-9-amine (abbreviation: DPhAPhA), coumarin 545T, N,N'-diphenylquinacridone (abbreviation: DPQd), rubrene, and 5,12-bis(biphenyl-4-yl)-6,11-diphenyltetracene (abbreviation: BP T).

Other examples of fluorescent substances include 2(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[4]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJ™).

[Phosphorescent Substance]

A phosphorescent substance can be used for the layer 111X. For example, phosphorescent substances exemplified below can be used for the layer 111X. Note that phosphorescent substances that can be used for the layer 111X are not limited to the following, and a variety of known phosphorescent substances can be used for the layer 111X.

For example, any of the following can be used for the layer 111X: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato)iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpim)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: Ir($CF_3$ppy)$_2$(pic)), bis[2-(4',6'-difluorophenyl)pyridinato-N,$C^{2'}$]iridium(III) acetylacetonate (abbreviation: FIracac), or the like can be used.

These substances are compounds exhibiting blue phosphorescence and having an emission wavelength peak at 440 nm to 520 nm.

[Phosphorescent Substance (Green)]

As an organometallic iridium complex having a pyrimidine skeleton or the like, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methyl phenyl)-4-phenylpyrimidinato] iridium(III) (abbreviation: [Ir(mpmppm)$_2$(acac)]), (acetylacetonato)bis(4,6-diphenylpyrimidinato)iridium(III) (abbreviation: [Ir(dppm)$_2$(acac)]), or the like can be used.

As an organometallic iridium complex having a pyrazine skeleton or the like, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetyl acetonate (abbreviation: [Ir(pq)$_2$(acac)]), [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: [Ir(5mppy-$d_3$)$_2$(mbfpypy-$d_3$)]), [2-$d_3$-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$ (mbfpypy-$d_3$)]), or the like can be used.

Examples of a rare earth metal complex are tris(acetylacetonato) (monophenanthroline)terbium(III) (abbreviation: [Tb(acac)$_3$(Phen)]), and the like.

These are compounds that mainly exhibit green phosphorescence and have an emission wavelength peak at 500 nm to 600 nm. Note that an organometallic iridium complex having a pyrimidine skeleton has distinctively high reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato](dipivaloylmethanato)iridium(III) (abbreviation: [Ir(d1npm)$_2$(dpm)]), or the like can be used.

As an organometallic iridium complex having a pyrazine skeleton or the like, (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium (III) (abbreviation: $[Ir(tppr)_2(dpm)]$), (acetylacetonato)bis [2,3-bis(4-fluorophenyl)quinoxalinato]iridium(III) (abbreviation: $[Ir(Fdpq)_2(acac)]$), or the like can be used.

As an organometallic iridium complex having a pyridine skeleton or the like, tris(1-phenylisoquinolinato-N,$C^{2'}$) iridium(III) (abbreviation: $[Ir(piq)_3]$), bis(1-phenylisoquinolinato-N,$C^{2'}$)iridium(III) acetyl acetonate (abbreviation: $[Ir(piq)_2(acac)]$), or the like can be used.

As a rare earth metal complex or the like, tris(1,3-diphenyl-1,3-propanedionato)(monophenanthroline)europium(III) (abbreviation: $[Eu(DBM)_3(Phen)]$), tris[1-(2-thenoyl)-3,3,3-trifluoroacetonato](monophenanthroline) europium(III) (abbreviation: $[Eu(TTA)_3(Phen)]$), or the like can be used.

As a platinum complex or the like, 2,3,7,8,12,13,17,18-octaethyl-21H,23H-porphyrin platinum(II) (abbreviation: PtOEP) or the like can be used.

These are compounds that exhibit red phosphorescence and have an emission peak at 600 nm to 700 nm. Furthermore, the organometallic iridium complexes having a pyrazine skeleton can provide red light emission with chromaticity favorably used for display apparatuses.

[Substance Exhibiting Thermally Activated Delayed Fluorescence (TADF)]

A TADF material can be used for the layer 111X. When a TADF material is used as the light-emitting substance, the S1 level of a host material is preferably higher than that of the TADF material. In addition, the T1 level of the host material is preferably higher than that of the TADF material.

For example, any of the TADF materials exemplified below can be used as the light-emitting material. Note that without being limited thereto, a variety of known TADF materials can be used.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used as the TADF material.

Specifically, the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formulae 4]

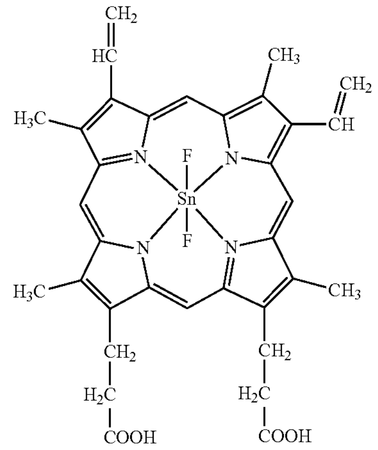

$SnF_2$(Proto IX)

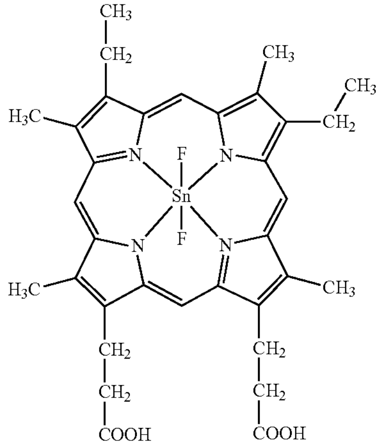

$SnF_2$(Meso IX)

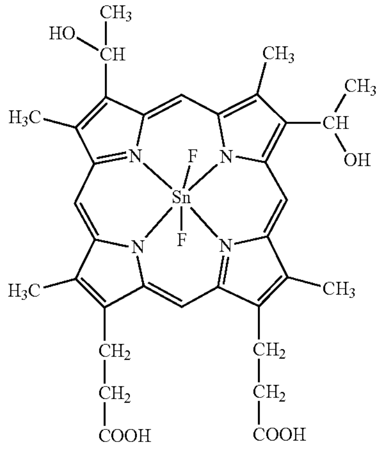

$SnF_2$(Hemato IX)

-continued

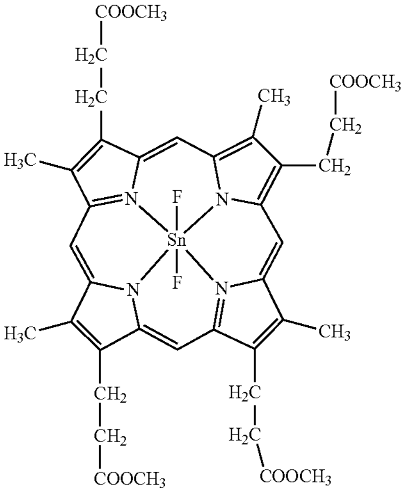

SnF2(Copro III-4Me)

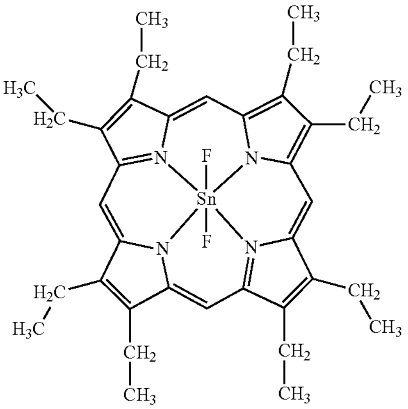

SnF2(OEP)

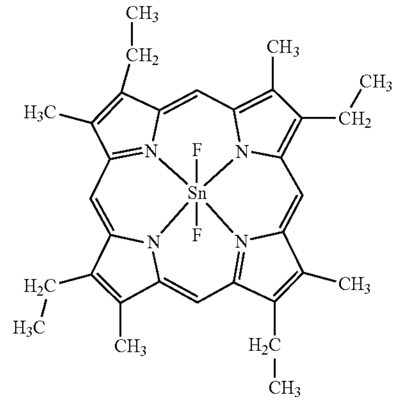

SnF2(Etio I)

-continued

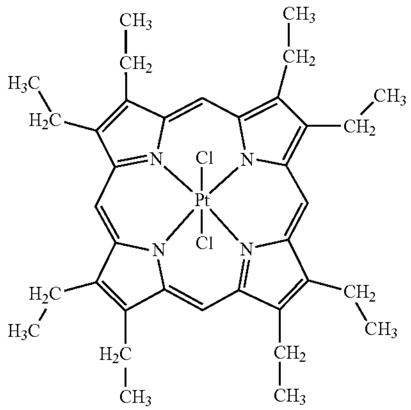

PtCl2OEP

Furthermore, a heterocyclic compound including one or both of a π-electron rich heteroaromatic ring and a π-electron deficient heteroaromatic ring can be used, for example, as the TADF material.

Specifically, the following compounds whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formulae 5]

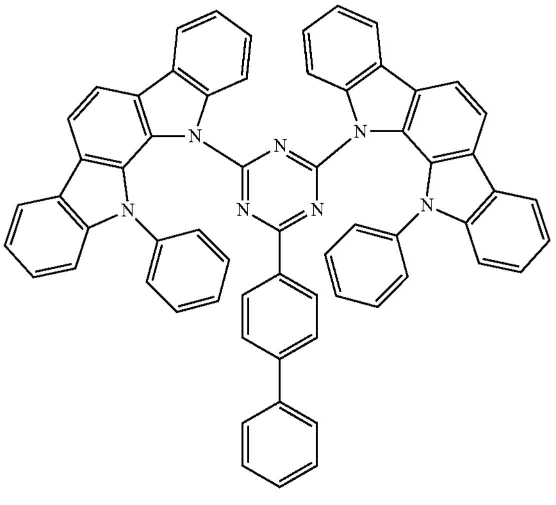

PIC-TRZ

-continued

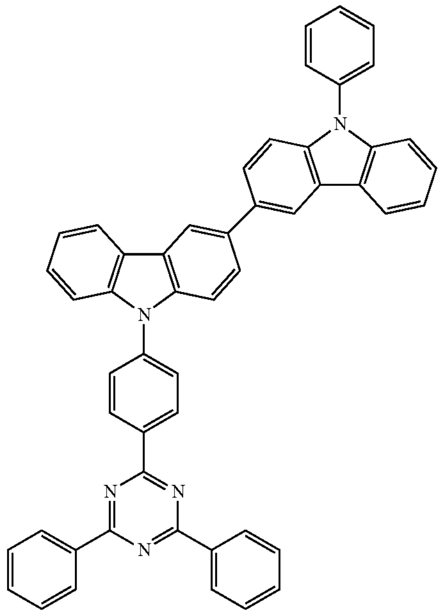

PCCzPTzn

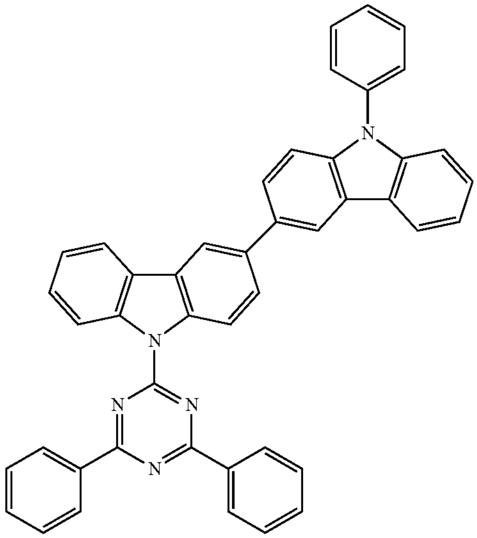

PCCzTzn

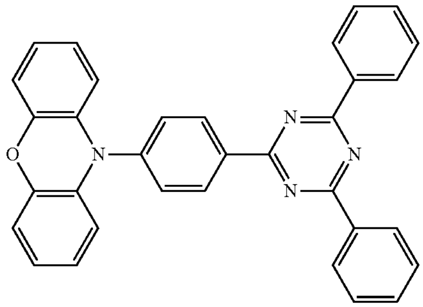

PXZ-TRZ

-continued

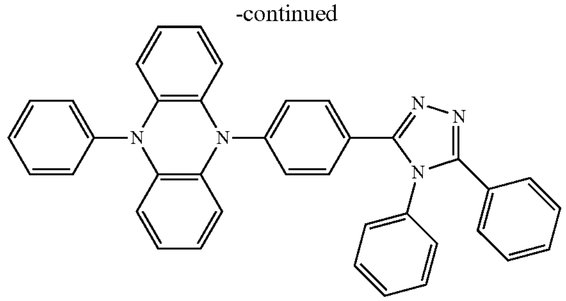

PPZ-3TPT

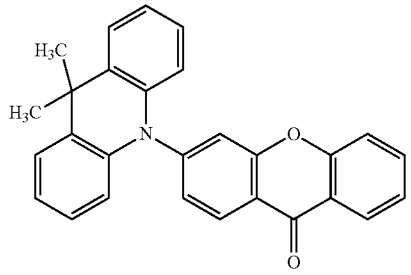

ACRXTN

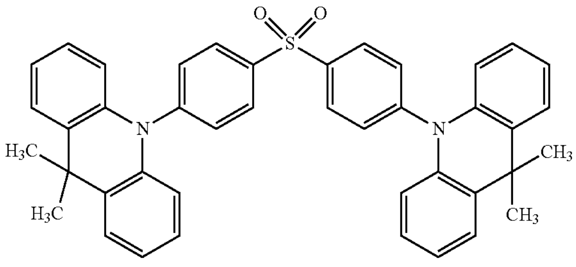

DMAC-DPS

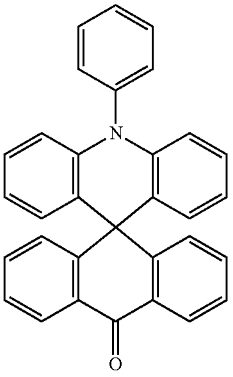

ACRSA

Such a heterocyclic compound is preferable because of having high electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-accepting properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 2 of Layer 111X

A carrier-transport material can be used as the host material. For example, a hole-transport material, an electron-transport material, a substance exhibiting thermally activated delayed fluorescence (TADF), a material having an anthracene skeleton, or a mixed material can be used as the host material. A material having a wider bandgap than the light-emitting material contained in the layer 111X is preferably used as the host material. Thus, transfer of energy from excitons generated in the layer 111X to the host material can be inhibited.

[Hole-Transport Material]

A material having a hole mobility of $1\times10^{-6}$ $cm^2/Vs$ or higher can be suitably used as the hole-transport material. For example, a hole-transport material that can be used for the layer 112X can be used for the layer 111X.

[Electron-Transport Material]

A metal complex or an organic compound having a π-electron deficient heteroaromatic ring skeleton can be used as the electron-transport material. For example, an electron-transport material that can be used for the layer 113X can be used for the layer 111X.

[Material Having Anthracene Skeleton]

An organic compound having an anthracene skeleton can be used as the host material. An organic compound having an anthracene skeleton is particularly preferable in the case where a fluorescent substance is used as the light-emitting substance. Thus, a light-emitting device with high emission efficiency and high durability can be obtained.

Among the organic compounds having an anthracene skeleton, an organic compound having a diphenylanthracene skeleton, in particular, a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

Examples of the substances that can be used include 6-[3-(9,10-diphenyl-2-anthryl)phenyl]benzo[b]naphtho[1,2-d]furan (abbreviation: 2mBnfPPA), 9-phenyl-10-[4'-(9-phenyl-9H-fluoren-9-yl)biphenyl-4-yl]anthracene (abbreviation: FLPPA), 9-(1-naphthyl)-10-[4-(2-naphthyl)phenyl]anthracene (abbreviation: αN-βNPAnth), 9-[4-(9-phenylcarbazol-3-yl)]phenyl-10-phenylanthracene (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 3-[4-(1-naphthyl)phenyl]-9-phenyl-9H-carbazole (abbreviation: PCPN), and the like.

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on the lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to carbon atoms, and a trialkylsilyl group having 3 to 10 carbon atoms. It is further preferable that the fluorescent substance have a plurality of protecting groups. The substituents having no π bond are poor in carrier-transport performance; therefore, the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of such a luminophore include a phenanthrene skeleton, a stilbene skeleton, an acridone skeleton, a phenoxazine skeleton, a phenothiazine skeleton, a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton. In particular, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material is (the hole-transport material/the electron-transport material)=(1/19) or more and (19/1) or less. Thus, the carrier-transport property of the layer 111X can be easily adjusted and a recombination region can be easily controlled.

Structure Example 2 of Mixed Material

In addition, a material mixed with a phosphorescent substance can be used as the host material. When a fluorescent substance is used as the light-emitting substance, a phosphorescent substance can be used as an energy donor for supplying excitation energy to the fluorescent substance.

Structure Example 3 of Mixed Material

A mixed material containing a material to form an exciplex can be used as the host material. For example, a material in which an emission spectrum of a formed exciplex overlaps with a wavelength on the lowest-energy-side absorption band of the light-emitting substance can be used as the host material. This enables smooth energy transfer and improves emission efficiency. The driving voltage can be suppressed. With such a structure, light emission can be efficiently obtained by exciplex-triplet energy transfer (ExTET), which is energy transfer from the exciplex to the light-emitting substance (phosphorescent material).

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The lowest unoccupied molecular orbital (LUMO) level of the hole-transport material is preferably higher than or equal to that of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to the longer wavelength side than the emission spectrum of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient PL lifetime of the mixed film has longer lifetime components or a larger proportion of delayed components than the transient PL lifetime of each of the materials, observed by comparison of transient photoluminescence (PL) of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of these materials.

This embodiment can be combined with any of the other embodiments in this specification as appropriate.

Embodiment 3

In this embodiment, a structure of the light-emitting device 550X that can be used for a display apparatus of one embodiment of the present invention is described with reference to FIGS. 15A and 15B.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

Structure Example of Light-Emitting Device 550X

The light-emitting device 550X described in this embodiment includes the electrode 551X, the electrode 552X, the unit 103X, and the layer 104X. The electrode 552X overlaps with the electrode 551X, and the unit 103X is positioned between the electrode 552X and the electrode 551X. The layer 104X is positioned between the electrode 551X and the unit 103X. For example, the structure described in Embodiment 2 can be employed for the unit 103X.

Structure Example of Electrode 551X

For example, a conductive material can be used for the electrode 551X. Specifically, a single layer or a stack using a metal, an alloy, or a film containing a conductive compound can be used for the electrode 551X.

A film that efficiently reflects light can be used for the electrode 551X, for example. Specifically, an alloy containing silver, copper, and the like, an alloy containing silver, palladium, and the like, or a metal film of aluminum or the like can be used for the electrode 551X.

For example, a metal film that transmits part of light and reflects another part of light can be used for the electrode 551X. Thus, a microcavity structure can be provided in the light-emitting device 550X. Alternatively, light with a predetermined wavelength can be extracted more efficiently than light with the other wavelengths. Alternatively, light with a narrow spectral half-width can be extracted. Alternatively, light of a bright color can be extracted.

For example, a film having a property of transmitting visible light can be used for the electrode 551X. Specifically, a single layer or a stack using a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

Structure Example 1 of Layer 104X

A hole-injection material can be used for the layer 104X, for example. The layer 104X can be referred to as a hole-injection layer.

For example, a material having a hole mobility lower than or equal to $1\times10^{-3}$ $cm^2/Vs$ when the square root of the electric field strength [V/cm] is 600 can be used for the layer 104X. A film having an electrical resistivity greater than or equal to $1\times10^4$ Ω·cm and less than or equal to $1\times10^7$ Ω·cm can be used as the layer 104X. The electrical resistivity of the layer 104X is preferably greater than or equal to $5\times10^4$ Ω·cm and less than or equal to $1\times10^7$ Ω·cm, further preferably greater than or equal to $1\times10^5$ Ω·cm and less than or equal to $1\times10^7$ Ω·cm.

Structure Example 2 of Layer 104X

Specifically, an electron-accepting substance can be used for the layer 104X. Alternatively, a composite material containing a plurality of kinds of substances can be used for the layer 104X. This can facilitate the injection of holes from the electrode 551X, for example. Alternatively, the driving voltage of the light-emitting device 550X can be reduced.

[Electron-Accepting Sub Stance]

An organic compound or an inorganic compound can be used as the electron-accepting substance. The electron-accepting substance can extract electrons from an adjacent hole-transport layer or a hole-transport material by the application of an electric field.

For example, a compound having an electron-withdrawing group (a halogen group or a cyano group) can be used as the electron-accepting substance. Note that an electron-accepting organic compound is easily evaporated, which facilitates film deposition. Thus, the productivity of the light-emitting device 550X can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the electron-accepting substance, a transition metal oxide such as a molybdenum oxide, a vanadium oxide, a ruthenium oxide, a tungsten oxide, or a manganese oxide can be used.

It is possible to use any of the following materials: phthalocyanine-based compounds such as phthalocyanine (abbreviation: $H_2Pc$); phthalocyanine-based complex compounds such as copper phthalocyanine (abbreviation: CuPc); and compounds having an aromatic amine skeleton such as 4,4'-bis[N-(4-diphenylaminophenyl)-N-phenylamino]biphenyl (abbreviation: DPAB) and N,N'-bis[4-bis(3-methylphenyl)aminophenyl]-N,N'-diphenyl-4,4'-diaminobiphenyl (abbreviation: DNTPD).

In addition, high molecular compounds such as poly(3,4-ethylenedioxythiophene)/polystyrenesulfonic acid (abbreviation: PEDOT/PSS), and the like can be used.

Structure Example 1 of Composite Material

For example, a composite material containing an electron-accepting substance and a hole-transport material can be used for the layer 104X. Accordingly, not only a material having a high work function but also a material having a low work function can also be used for the electrode 551X. Alternatively, a material used for the electrode 551X can be selected from a wide range of materials regardless of its work function.

For the hole-transport material in the composite material, for example, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ $cm^2/Vs$ or higher can be suitably used as the hole-transport material in the composite material. For example, the hole-transport material that can be used for the layer 112X can be used for the composite material.

A substance having a relatively deep HOMO level can be suitably used as the hole-transport material in the composite material. Specifically, the HOMO level is preferably higher than or equal to −5.7 eV and lower than or equal to −5.4 eV. Accordingly, hole injection to the unit 103X can be facilitated. Hole injection to the layer 112X can be facilitated. The reliability of the light-emitting device 550X can be increased.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As the aromatic hydrocarbon having a vinyl group, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

Furthermore, a substance having any of a carbazole skeleton, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the light-emitting device 550X can be increased.

Specific examples of the above-described substances include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenyl amine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation:

FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Structure Example 2 of Composite Material

For example, a composite material including an electron-accepting substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104X can be reduced. A layer with a low refractive index can be formed inside the light-emitting device 550X. The external quantum efficiency of the light-emitting device 550X can be improved.

This embodiment can be combined with any of the other embodiments in this specification as appropriate.

Embodiment 4

In this embodiment, a structure of the light-emitting device 550X that can be used for a display apparatus of one embodiment of the present invention is described with reference to FIGS. 15A and 15B.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

Structure Example of Light-Emitting Device 550X

The light-emitting device 550X described in this embodiment includes the electrode 551X, the electrode 552X, the unit 103X, and a layer 105X. The electrode 552X includes a region overlapping with the electrode 551X, and the unit 103X includes a region positioned between the electrode 551X and the electrode 552X. The layer 105X includes a region positioned between the unit 103X and the electrode 552X. For example, the structure described in Embodiment 2 can be employed for the unit 103X.

Structure Example of Electrode 552X

For example, a conductive material can be used for the electrode 552X. Specifically, a single layer or a stack using a metal, an alloy, or a material containing a conductive compound can be used for the electrode 552X.

The material that can be used for the electrode 551X described in Embodiment 3 can be used for the electrode 552X, for example. In particular, a material having a lower work function than the electrode 551X can be suitably used for the electrode 552X. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 552X.

Specifically, an element such as lithium (Li) or cesium (Cs), an element such as magnesium (Mg), calcium (Ca), or strontium (Sr), an element such as europium (Eu) or ytterbium (Yb), or an alloy containing any of these elements such as an alloy of magnesium and silver or an alloy of aluminum and lithium can be used for the electrode 552X.

Structure Example of Layer 105X

An electron-injection material can be used for the layer 105X, for example. The layer 105X can be referred to as an electron-injection layer.

Specifically, an electron-donating substance can be used for the layer 105X. Alternatively, a material in which an electron-donating substance and an electron-transport material are combined can be used for the layer 105X. Alternatively, electrode can be used for the layer 105X. This can facilitate the injection of electrons from the electrode 552X, for example. Alternatively, not only a material having a low work function but also a material having a high work function can also be used for the electrode 552X. Alternatively, a material used for the electrode 552X can be selected from a wide range of materials regardless of its work function. Specifically, Al, Ag, ITO, indium oxide-tin oxide containing silicon or silicon oxide, or the like can be used for the electrode 552X. The driving voltage of the light-emitting device 550X can be reduced.

[Electron-Donating Substance]

For example, an alkali metal, an alkaline earth metal, a rare earth metal, or a compound thereof (an oxide, a halide, a carbonate, or the like) can be used as the electron-donating substance. Alternatively, an organic compound such as tetrathianaphthacene (abbreviation: TTN), nickelocene, or decamethylnickelocene can be used as the electron-donating substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material composed of two or more kinds of substances can be used as the electron-injection material. For example, an electron-donating substance and an electron-transport material can be used for the composite material.

[Electron-Transport Material]

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the amount of electrons injected into the light-emitting layer can be controlled. The light-emitting layer can be prevented from having excess electrons.

A metal complex or an organic compound having a π-electron deficient heteroaromatic ring skeleton can be used as the electron-transport material. For example, an electron-transport material that can be used for the layer 113X can be used for the layer 105X.

Structure Example 2 of Composite Material

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or a fluoride of an alkaline earth metal at 50 wt % or higher can be suitably used. Alternatively, a composite material including an organic compound having a bipyridine skeleton can be suitably used. Thus, the refractive index of the layer 105X can be reduced. The external quantum efficiency of the light-emitting device 550X can be improved.

Structure Example 3 of Composite Material

For example, a composite material of a first organic compound including an unshared electron pair and a first metal can be used for the layer 105X. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 552X into the layer 105X, a barrier therebetween can be reduced.

The layer 105X can adopt a composite material that allows the spin density measured by an electron spin resonance (ESR) method to be preferably greater than or equal to $1\times10^{16}$ $spins/cm^3$, further preferably greater than or equal to $5\times10^{16}$ $spins/cm^3$, still further preferably greater than or equal to $1\times10^{17}$ $spins/cm^3$.

[Organic Compound Including Unshared Electron Pair]

For example, an electron-transport material can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 550X can be reduced.

Note that the LUMO level of the organic compound including an unshared electron pair is preferably higher than or equal to −3.6 eV and lower than or equal to −2.3 eV. In general, the HOMO level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), 2,2'-(1,3-phenylene)bis(9-phenyl-1,10-phenanthroline) (abbreviation: mPPhen2P), or the like can be used as the organic compound including an unshared electron pair. Note that NBPhen has a higher glass transition temperature (Tg) than BPhen and thus has high heat resistance.

Alternatively, for example, copper phthalocyanine can be used as the organic compound including an unshared electron pair. The number of electrons of the copper phthalocyanine is an odd number.

[First Metal]

When the number of electrons of the first organic compound including an unshared electron pair is an even number, for example, a composite material of the first organic compound and the first metal that belongs to an odd-numbered group in the periodic table can be used for the layer 105X.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point. By using a metal having a low reactivity with water or oxygen as the first metal, the moisture resistance of the light-emitting device 550X can be improved.

The use of Ag for the electrode 552X and the layer 105X can increase the adhesion between the layer 105X and the electrode 552X.

When the number of electrons of the first organic compound including an unshared electron pair is an odd number, a composite material of the first organic compound and the first metal that belongs to an even-numbered group in the periodic table can be used for the layer 105X. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed can be used, for example, as the electron-injection material.

This embodiment can be combined with any of the other embodiments in this specification as appropriate.

Embodiment 5

In this embodiment, a structure of the light-emitting device 550X of one embodiment of the present invention is described with reference to FIG. 16A.

Figure 16A:
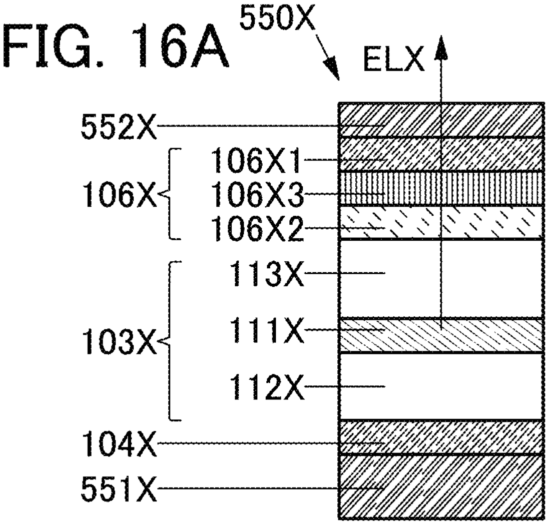
FIGS. 16A and 16B illustrate structures of a light-emitting device of an embodiment.

FIG. 16A is a cross-sectional view illustrating a structure of a light-emitting device that can be used for a display apparatus of one embodiment of the present invention.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

Structure Example of Light-Emitting Device 550X

The light-emitting device 550X described in this embodiment includes the electrode 551X, the electrode 552X, the unit 103X, and an intermediate layer 106X (see FIG. 16A). The electrode 552X includes a region overlapping with the electrode 551X, and the unit 103X includes a region positioned between the electrode 551X and the electrode 552X. The intermediate layer 106X includes a region positioned between the electrode 552X and the unit 103X.

Structure Example 1 of Intermediate Layer 106X

The intermediate layer 106X has a function of supplying electrons to the anode side and supplying holes to the cathode side when voltage is applied. The intermediate layer 106X can be referred to as a charge-generation layer.

For example, the hole-injection material that can be used for the layer 104X described in Embodiment 3 can be used for the intermediate layer 106X. Specifically, the composite material can be used for the intermediate layer 106X.

Alternatively, for example, a stacked-layer film in which a film containing the composite material and a film containing a hole-transport material are stacked can be used for the intermediate layer 106X. Note that the film containing a hole-transport material is positioned between the film containing the composite material and the cathode.

Structure Example 2 of Intermediate Layer 106X

A stacked-layer film in which a layer 106X1 and a layer 106X2 are stacked can be used for the intermediate layer 106X. The layer 106X1 includes a region positioned between the unit 103X and the electrode 552X and the layer 106X2 includes a region positioned between the unit 103X and the layer 106X1.

Structure Example of Layer 106X1

For example, the hole-injection material that can be used for the layer 104X described in Embodiment 3 can be used for the layer 106X1. Specifically, the composite material can be used for the layer 106X1. A film having an electrical resistivity greater than or equal to $1\times10^4$ Ω·cm and less than or equal to $1\times10^7$ Ω·cm can be used as the layer 106X1. The electrical resistivity of the layer 106X1 is preferably greater than or equal to $5\times10^4$ Ω·cm and less than or equal to $1\times10^7$ Ω·cm, further preferably greater than or equal to $1\times10^5$ Ω·cm and less than or equal to $1\times10^7$ Ω·cm.

Structure Example of Layer 106X2

For example, the material that can be used for the layer 105X described in Embodiment 4 can be used for the layer 106X2.

Structure Example 3 of Intermediate Layer 106X

A stacked-layer film in which the layer 106X1, the layer 106X2, and a layer 106X3 are stacked can be used for the intermediate layer 106X. The layer 106X3 includes a region positioned between the layer 106X1 and the layer 106X2.

Structure Example of Layer 106X3

For example, an electron-transport material can be used for the layer 106X3. The layer 106X3 can be referred to as an electron-relay layer. With the layer 106X3, a layer that is on the anode side and in contact with the layer 106X3 can be distanced from a layer that is on the cathode side and in contact with the layer 106X3. Interaction between the layer that is on the anode side and in contact with the layer 106X3 and the layer that is on the cathode side and in contact with the layer 106X3 can be reduced. Electrons can be smoothly supplied to the layer that is on the anode side and in contact with the layer 106X3.

A substance whose LUMO level is positioned between the LUMO level of an electron-accepting substance contained in the layer 106X1 and the LUMO level of the substance contained in the layer 106X2 can be suitably used for the layer 106X3.

For example, a material having a LUMO level in a range higher than or equal to −5.0 eV, preferably higher than or equal to −5.0 eV and lower than or equal to −3.0 eV, can be used for the layer 106X3.

Specifically, a phthalocyanine-based material can be used for the layer 106X3. For example, copper phthalocyanine (abbreviation: CuPc) or a metal complex having a metal-oxygen bond and an aromatic ligand can be used for the layer 106X3.

This embodiment can be combined with any of the other embodiments in this specification as appropriate.

Embodiment 6

In this embodiment, a structure of the light-emitting device 550X that can be used for a display apparatus of one embodiment of the present invention is described with reference to FIG. 16B.

Figure 16B:
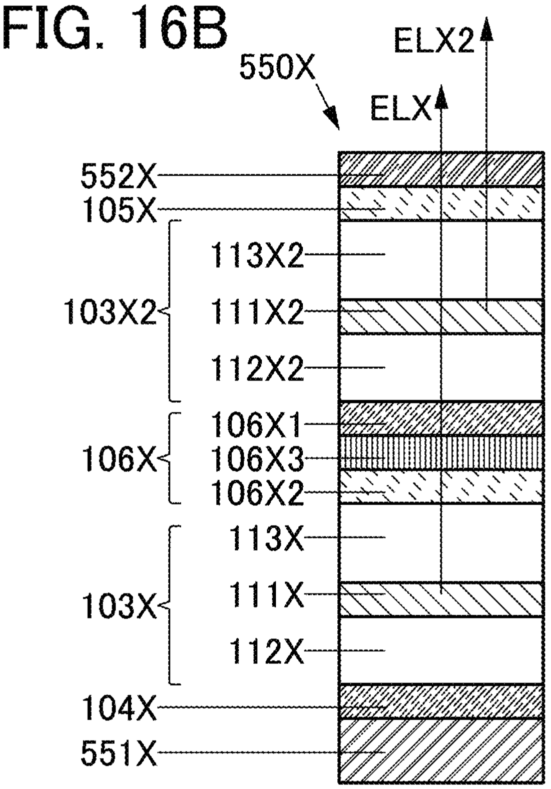

FIG. 16B is a cross-sectional view illustrating a structure of a light-emitting device of one embodiment of the present invention which is different from that in FIG. 16A.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

Structure Example of Light-Emitting Device 550X

The light-emitting device 550X described in this embodiment includes the electrode 551X, the electrode 552X, the unit 103X, the intermediate layer 106X, and a unit 103X2 (see FIG. 16B).

The unit 103X is positioned between the electrode 552X and the electrode 551X, and the intermediate layer 106X is positioned between the electrode 552X and the unit 103X.

The unit 103X2 is positioned between the electrode 552X and the intermediate layer 106X. The unit 103X2 has a function of emitting light ELX2.

In other words, the light-emitting device 550X includes the stacked units between the electrode 551X and the electrode 552X. The number of stacked units is not limited to two and may be three or more. A structure including the stacked units positioned between the electrode 551X and the electrode 552X and the intermediate layer 106X positioned between the units is referred to as a stacked light-emitting device or a tandem light-emitting device in some cases.

This structure enables high luminance emission while the current density is kept low. Reliability can be improved. The driving voltage can be reduced in comparison with that of the light-emitting device with the same luminance. The power consumption can be reduced.

Structure Example 1 of Unit 103X2

The unit 103X2 includes a layer 111X2, a layer 112X2, and a layer 113X2. The layer 111X2 is positioned between the layer 112X2 and the layer 113X2.

The structure that can be employed for the unit 103X can be employed for the unit 103X2. For example, the same structure as the unit 103X can be employed for the unit 103X2.

Structure Example 2 of Unit 103X2

The structure that is different from the structure of the unit 103X can be employed for the unit 103X2. For example, the unit 103X2 can have a structure emitting light whose hue is different from that of light emitted from the unit 103X.

Specifically, a stack including the unit 103X emitting red light and green light and the unit 103X2 emitting blue light can be employed. With this structure, a light-emitting device emitting light of a desired color can be provided. A light-emitting device emitting white light can be provided, for example.

Structure Example of Intermediate Layer 106X

The intermediate layer 106X has a function of supplying electrons to one of the unit 103X and the unit 103X2 and supplying holes to the other. For example, the intermediate layer 106X described in Embodiment 5 can be used.

<Method for Fabricating Light-Emitting Device 550X>

For example, each of the electrode 551X, the electrode 552X, the unit 103X, the intermediate layer 106X, and the unit 103X2 can be formed by a dry process, a wet process, an evaporation method, a droplet discharging method, a coating method, a printing method, or the like. A formation method may differ between components of the device.

Specifically, the light-emitting device 550X can be manufactured with a vacuum evaporation apparatus, an inkjet apparatus, a coating apparatus such as a spin coater, a gravure printing apparatus, an offset printing apparatus, a screen printing apparatus, or the like.

For example, the electrode can be formed by a wet process or a sol-gel method using a paste of a metal material. In addition, an indium oxide-zinc oxide film can be formed by a sputtering method using a target obtained by adding zinc oxide to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

This embodiment can be combined with any of the other embodiments in this specification as appropriate.

Embodiment 7

In this embodiment, a structure of a display apparatus of one embodiment of the present invention is described with reference to FIGS. 17A to 17C and FIG. 18.

Figure 17A:
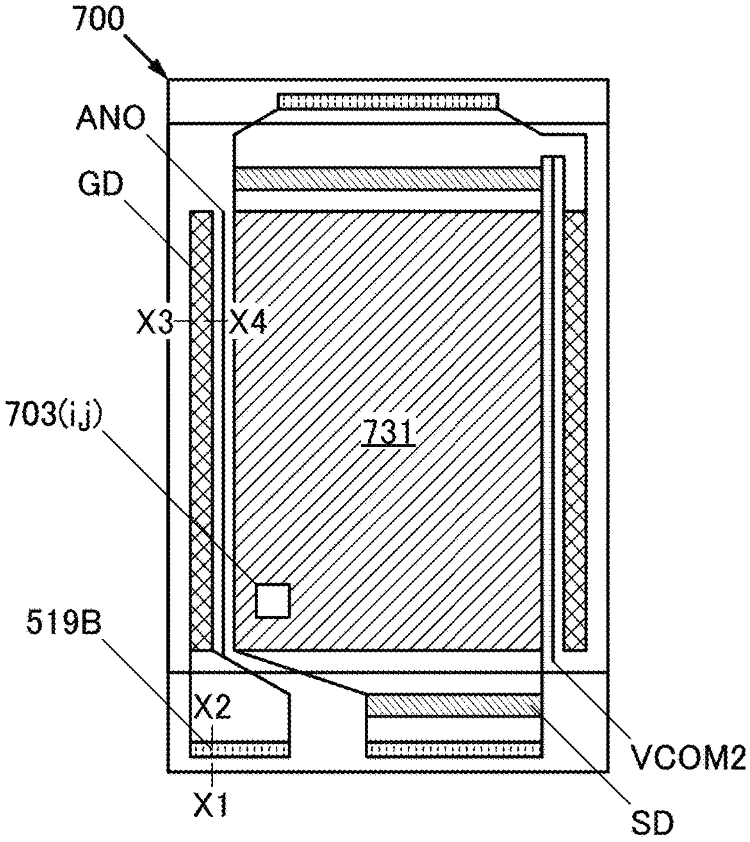
FIGS. 17A to 17C illustrate a structure of a display apparatus of an embodiment.
Figure 17B:
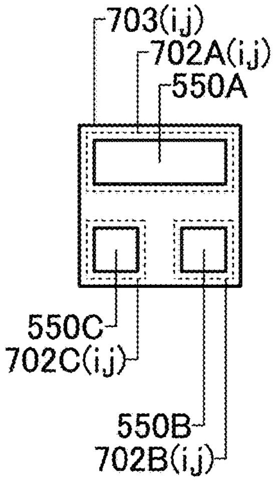
Figure 17C:
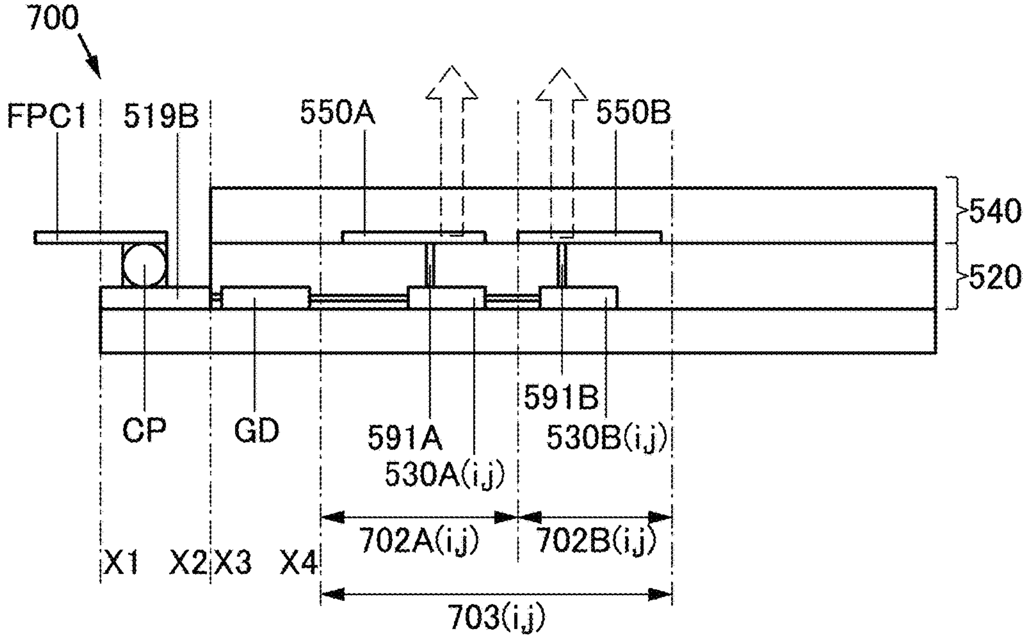

FIGS. 17A to 17C illustrate a structure of a display apparatus of one embodiment of the present invention. FIG. 17A is a top view of the display apparatus of one embodiment of the present invention, and FIG. 17B is a top view illustrating part of FIG. 17A. FIG. 17C illustrates cross sections taken along cutting lines X1-X2 and X3-X4 in FIG. 17A and a cross section of a pixel set 703(*i,j*).

Figure 18:
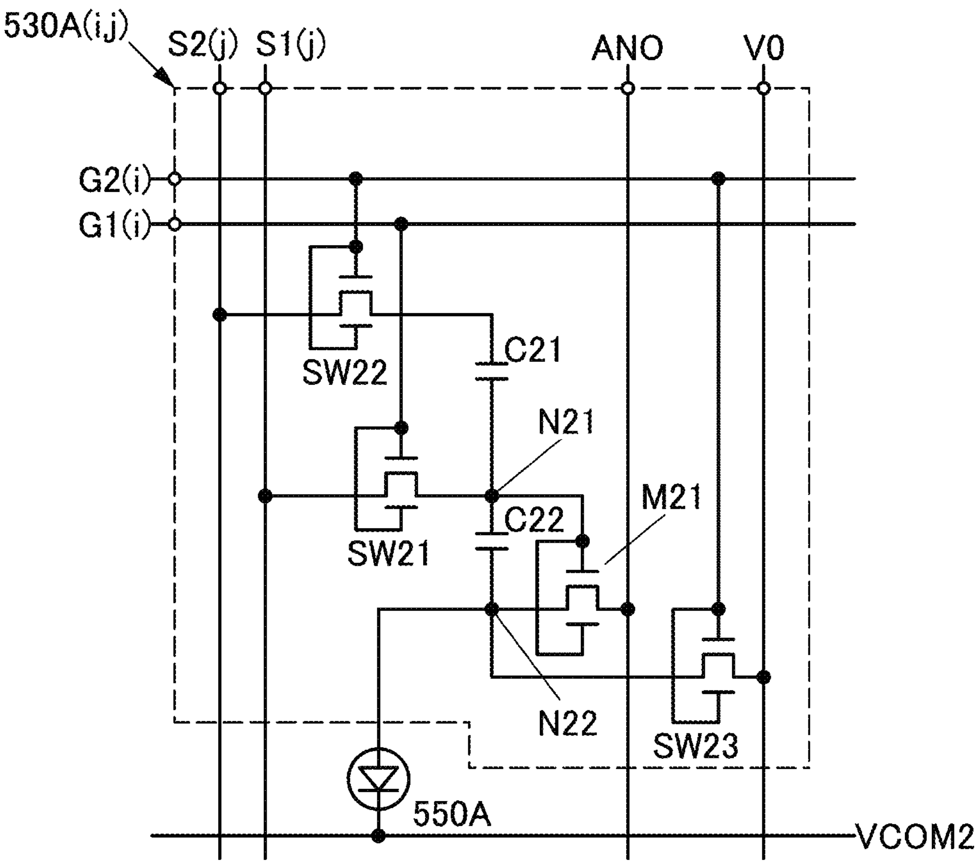
FIG. 18 illustrates a configuration of a display apparatus of an embodiment.

FIG. 18 is a circuit diagram illustrating the structure of the display apparatus of one embodiment of the present invention.

In this specification, an integer variable of 1 or more may be used for reference numerals. For example, "(p)" where p is an integer variable of 1 or more may be used for part of a reference numeral that specifies any one of up top components. For another example, "(m,n)" where each of m and n is an integer variable of 1 or more may be used for part of a reference numeral that specifies any one of up to m×n components.

Structure Example 1 of Display Apparatus 700

The display apparatus 700 of one embodiment of the present invention includes a region 731 (see FIG. 17A). The region 731 includes the pixel set 703(*i,j*).

Structure Example 1 of Pixel Set 703(*i,j*)

The pixel set 703(*i,j*) includes a pixel 702A(i,j), a pixel 702B(i,j), and a pixel 702C(i,j) (see FIGS. 17B and 17C).

The pixel 702A(i,j) includes a pixel circuit 530A(i,j) and the light-emitting device 550A. The light-emitting device 550A is electrically connected to the pixel circuit 530A(i,j).

For example, the light-emitting device described in any one of Embodiments 2 to 6 can be used as the light-emitting device 550A.

The pixel 702B(i,j) includes a pixel circuit 530B(i,j) and the light-emitting device 550B. The light-emitting device 550B is electrically connected to the pixel circuit 530B(i,j). Similarly, the pixel 702C(i,j) includes the light-emitting device 550C.

For example, the structure described in Embodiments 2 to 6 can be employed for the light-emitting devices 550A to 550C.

Structure Example 2 of Display Apparatus 700

The display apparatus 700 of one embodiment of the present invention includes a functional layer 540 and the functional layer 520 (see FIG. 17C). The functional layer 540 overlaps with the functional layer 520.

The functional layer 540 includes the light-emitting device 550A.

The functional layer 520 includes the pixel circuit 530A (i,j) and a wiring (see FIG. 17C). The pixel circuit 530A(i,j) is electrically connected to the wiring. For example, a conductive film provided in an opening 591A in the functional layer 520 can be used for the wiring. The wiring electrically connects a terminal 519B to the pixel circuit 530A(i,j). Note that a conductive material CP electrically connects the terminal 519B to a flexible printed circuit board FPC1. In addition, a conductive film provided in an opening 591B in the functional layer 520 can be used for the wiring, for example.

Structure Example 3 of Display Apparatus 700

In addition, the display apparatus 700 of one embodiment of the present invention includes a driver circuit GD and a driver circuit SD (see FIG. 17A).

Structure Example of Driver Circuit GD

The driver circuit GD supplies a first selection signal and a second selection signal.

Structure Example of Driver Circuit SD

The driver circuit SD supplies a first control signal and a second control signal.

Structure Example of Wiring

As the wiring, a conductive film G1(*i*), a conductive film G2(*i*), a conductive film S1(*j*), a conductive film S2(*j*), a conductive film ANO, a conductive film VCOM2, and a conductive film V0 are included (see FIG. 18).

The conductive film G1(*i*) is supplied with the first selection signal, and the conductive film G2(*i*) is supplied with the second selection signal.

The conductive film S1(*j*) is supplied with the first control signal, and the conductive film S2(*j*) is supplied with the second control signal.

Structure Example 1 of Pixel Circuit 530A(i,j)

The pixel circuit 530A(i,j) is electrically connected to the conductive film G1(*i*) and the conductive film S1(*j*). The conductive film G1(*i*) supplies the first selection signal, and the conductive film S1(*j*) supplies the first control signal.

The pixel circuit 530A(i,j) drives the light-emitting device 550A in response to the first selection signal and the first control signal. The light-emitting device 550A emits light.

In the light-emitting device 550A, one of the electrodes is electrically connected to the pixel circuit 530A(i,j) and the other electrode is electrically connected to the conductive film VCOM2.

Structure Example 2 of Pixel Circuit 530A(i,j)

The pixel circuit 530A(i,j) includes a switch SW21, a switch SW22, a transistor M21, a capacitor C21, and a node N21.

The transistor M21 includes a gate electrode electrically connected to the node N21, a first electrode electrically connected to the light-emitting device 550A, and a second electrode electrically connected to the conductive film ANO.

The switch SW21 includes a first terminal electrically connected to the node N21, a second terminal electrically connected to the conductive film S1(*j*), and a gate electrode having a function of controlling an on/off state of the switch SW21 according to the potential of the conductive film G1(*i*).

The switch SW22 includes a first terminal electrically connected to the conductive film S2(*j*), and a gate electrode having a function of controlling an on/off state of the switch SW22 according to the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550A can be controlled with the potential of the node N21. As a result, a novel apparatus that is highly convenient, useful, or reliable can be provided.

Structure Example 3 of Pixel Circuit 530A(i,j)

The pixel circuit 530A(i,j) includes a switch SW23, a node N22, and a capacitor C22.

The switch SW23 includes a first terminal electrically connected to the conductive film V0, a second terminal electrically connected to the node N22, and a gate electrode having a function of controlling an on/off state of the switch SW23 according to the potential of the conductive film G2(*i*).

The capacitor C22 includes a conductive film electrically connected to the node N21 and a conductive film electrically connected to the node N22.

The first electrode of the transistor M21 is electrically connected to the node N22.

This embodiment can be combined with any of the other embodiments in this specification as appropriate.

Embodiment 8

In this embodiment, a display module of one embodiment of the present invention is described.

<Display Module>

Figure 19:
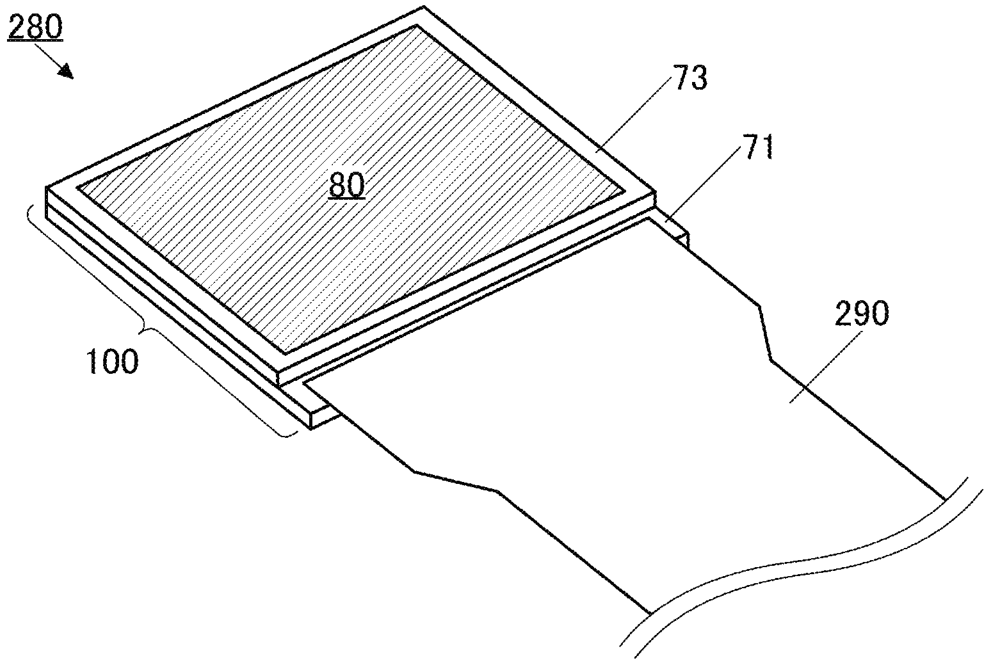
FIG. 19 illustrates a structure of a display module of an embodiment.

FIG. 19 is a perspective view illustrating a structure of a display module 280.

The display module 280 includes a display apparatus 100, and an FPC 290 or a connector. The display apparatus described in Embodiment 1 can be used as the display apparatus 100, for example.

The FPC 290 is supplied with a signal and electric power from the outside and supplies the signal and the electric power to the display apparatus 100. An IC may be mounted on the FPC 290. Note that a connector is a mechanical component for electrical connection through a conductor, and the conductor can electrically connect the display apparatus 100 to a component to be connected. For example, the FPC 290 can be used as the conductor. The connector can detach the display apparatus 100 from the connected component.

<<Display Apparatus 100A>>

Figure 20A:
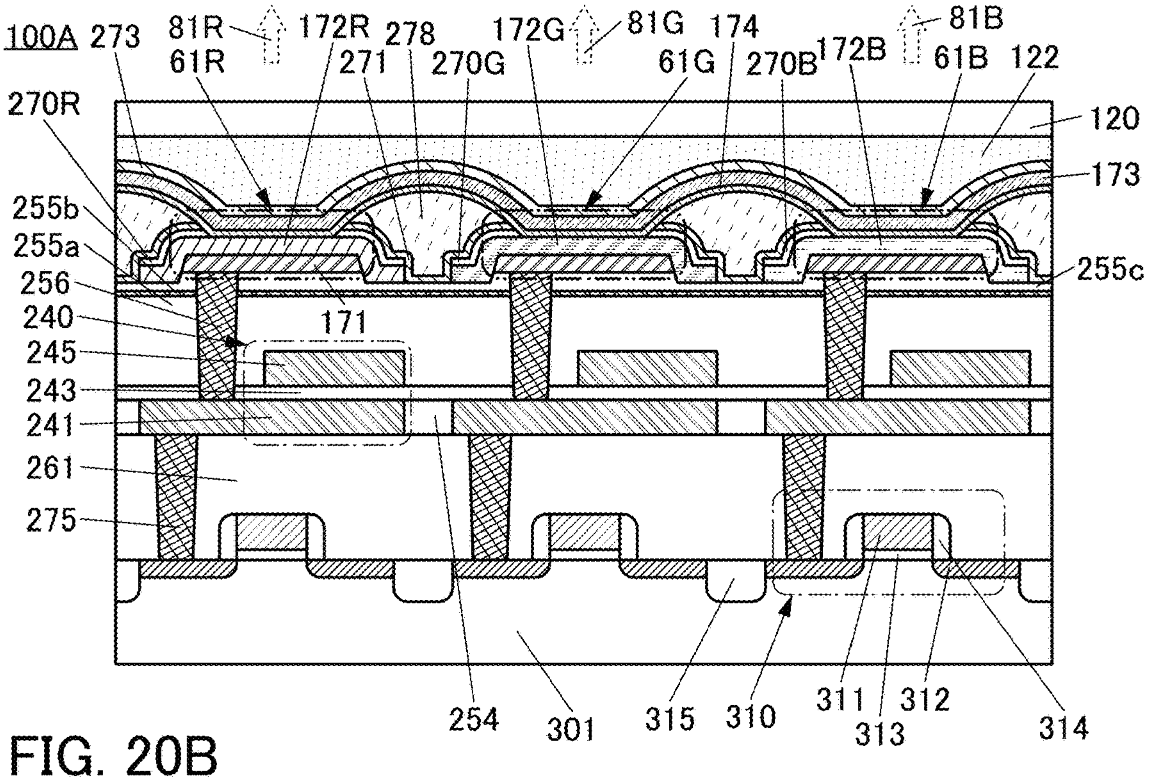
FIGS. 20A and 20B illustrate structures of display apparatuses of an embodiment.

FIG. 20A is a cross-sectional view illustrating a structure of a display apparatus 100A. The display apparatus 100A can be used as the display apparatus 100 of the display module 280, for example. A substrate 301 corresponds to a substrate 71 in FIG. 19.

The display apparatus 100A includes the substrate 301, a transistor 310, an element isolation layer 315, an insulating layer 261, a capacitor 240, an insulating layer 255 (an insulating layer 255*a*, an insulating layer 255*b*, and an insulating layer 255*c*), a light-emitting device 61R, a light-emitting device 61G, and a light-emitting device 61B. The insulating layer 261 is provided over the substrate 301, and the transistor 310 is positioned between the substrate 301 and the insulating layer 261. The insulating layer 255*a* is provided over the insulating layer 261, the capacitor 240 is positioned between the insulating layer 261 and the insulating layer 255*a*, and the insulating layer 255*a* is positioned between the capacitors 240 and the light-emitting devices 61R, 61G, and 61B.

[Transistor 310]

The transistor 310 includes a conductive layer 311, a pair of low-resistance regions 312, an insulating layer 313, and an insulating layer 314, and its channel is formed in part of the substrate 301. The conductive layer 311 functions as a gate electrode. The insulating layer 313 is positioned between the substrate 301 and the conductive layer 311 and functions as a gate insulating layer. The substrate 301 includes the pair of low-resistance regions 312 doped with an impurity. Note that such regions function as a source and a drain. The side surface of the conductive layer 311 is covered with the insulating layer 314.

The element isolation layer 315 is embedded in the substrate 301, and positioned between two adjacent transistors 310.

[Capacitor 240]

The capacitor 240 includes a conductive layer 241, a conductive layer 245, and an insulating layer 243, and the insulating layer 243 is positioned between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is positioned over the insulating layer 261 and is embedded in an insulating layer 254. The conductive layer 241 is electrically connected to one of the source and the drain of the transistor 310 through a plug 275 embedded in the insulating layer 261. The insulating layer 243 covers the conductive layer 241. The conductive layer 245 overlaps with the conductive layer 241 with the insulating layer 243 therebetween.

[Insulating Layer 255]

The insulating layer 255 includes the insulating layer 255*a*, the insulating layer 255*b*, and the insulating layer 255*c*, and the insulating layer 255*b* is positioned between the insulating layer 255*a* and the insulating layer 255*c*.

[Light-Emitting Device 61R, Light-Emitting Device 61G, and Light-Emitting Device 61B]

The light-emitting devices 61R, 61G, and 61B are provided over the insulating layer 255*c*. For example, the light-emitting device described in any of Embodiments 2 to 6 can be used as any of the light-emitting devices 61R, 61G, and 61B.

The light-emitting device 61R includes a conductive layer 171 and an EL layer 172R, and the EL layer 172R covers the top and side surfaces of the conductive layer 171. A sacrificial layer 270R is positioned over the EL layer 172R. The light-emitting device 61G includes the conductive layer 171 and an EL layer 172G, and the EL layer 172G covers the top and side surfaces of the conductive layer 171. A sacrificial layer 270G is positioned over the EL layer 172G. The light-emitting device 61B includes the conductive layer 171 and an EL layer 172B, and the EL layer 172B covers the top and side surfaces of the conductive layer 171. A sacrificial layer 270B is positioned over the EL layer 172B.

The conductive layer 171 is electrically connected to one of the source and the drain of the transistor 310 through a plug 256 embedded in the insulating layers 243, 255*a*, 255*b*, and 255*c*, the conductive layer 241 embedded in the insulating layer 254, and the plug 275 embedded in the insulating layer 261. The top surface of the insulating layer 255*c* and the top surface of the plug 256 are level with or substantially level with each other. Any of a variety of conductive materials can be used for the plugs.

[Protective Layer 271, Insulating Layer 278, Protective Layer 273, and Bonding Layer 122]

A protective layer 271 and an insulating layer 278 are positioned between adjacent light-emitting devices, e.g., between the light-emitting device 61R and the light-emitting device 61G, and the insulating layer 278 is provided over the protective layer 271. A protective layer 273 is provided over the light-emitting devices 61R, 61G, and 61B.

A bonding layer 122 attaches the protective layer 273 to a substrate 120.

[Substrate 120]

The substrate 120 corresponds to a substrate 73 in FIG. 19. A light-blocking layer can be provided for the surface of the substrate 120 on the bonding layer 122 side, for example. A variety of optical members can be provided on the outer side of the substrate 120.

A film can be used as the substrate. In particular, a film with a low water absorption rate can be suitably used. For example, the water absorption rate is preferably 1% or lower, further preferably 0.1% or lower. Thus, a change in size of the film can be inhibited. Furthermore, generation of wrinkles or the like can be inhibited. Moreover, a change in shape of the display apparatus can be inhibited.

For example, a polarizing plate, a retardation plate, a light diffusion layer (e.g., a diffusion film), an anti-reflection layer, a light-condensing film, or the like can be used as the optical member.

It is possible that a highly optically isotropic material, in other words, a material with a low birefringence index is used for the substrate and a circular polarizing plate is provided to overlap with the display apparatus. For example, it is possible to use, for the substrate, a material that has an absolute value of a retardation (phase difference) of 30 nm or less, preferably 20 nm or less, further preferably 10 nm or less. For example, a triacetyl cellulose (TAC, also referred to as cellulose triacetate) film, a cycloolefin polymer (COP) film, a cycloolefin copolymer (COC) film, or an acrylic resin film can be used as a highly optically isotropic film.

Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120. For example, a glass layer, a silica layer ($SiO_x$ layer), diamond like carbon (DLC), aluminum oxide ($AlO_x$), a polyester-based material, a polycarbonate-based material, or the like can be used for the surface protective layer. Note that a material having a high visible light transmittance can be suitably used for the surface protective layer. In addition, a material having high hardness can be suitably used for the surface protective layer.

<<Display Apparatus 100B>>

Figure 20B:
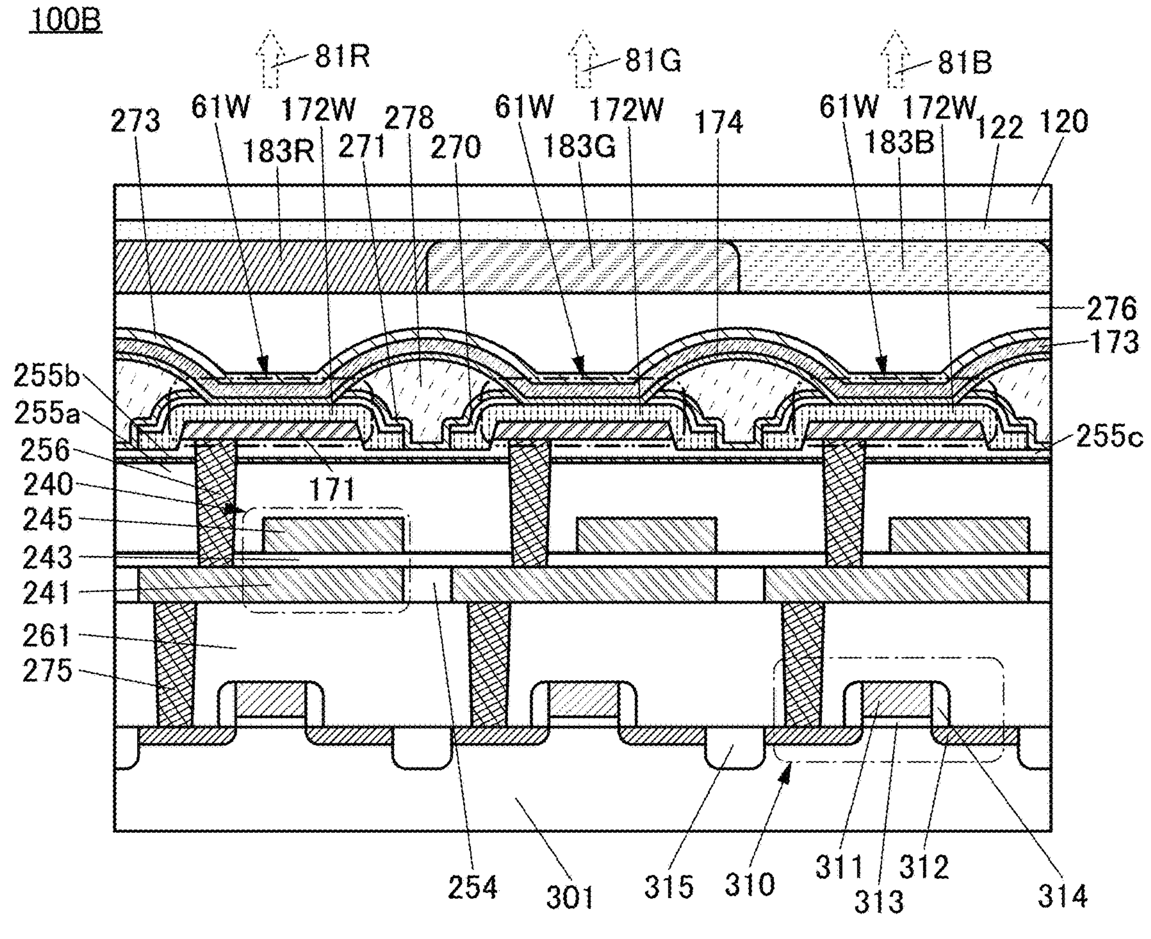

FIG. 20B is a cross-sectional view illustrating a structure of a display apparatus 100B. For example, the display apparatus 100B can be used as the display apparatus 100 of the display module 280 (see FIG. 19).

The display apparatus 100B includes the substrate 301, a light-emitting device 61W, the capacitor 240, and the transistor 310. The light-emitting device 61W can emit white light, for example.

The display apparatus 100B includes a coloring layer 183R, a coloring layer 183G, and a coloring layer 183B. The coloring layer 183R overlaps with one light-emitting device 61W, the coloring layer 183G overlaps with another light-emitting device 61W, and the coloring layer 183B overlaps with another light-emitting device 61W.

For example, the coloring layer 183R, the coloring layer 183G, and the coloring layer 183B can transmit red light, green light, and blue light, respectively.

<<Display Apparatus 100C>>

Figure 21:
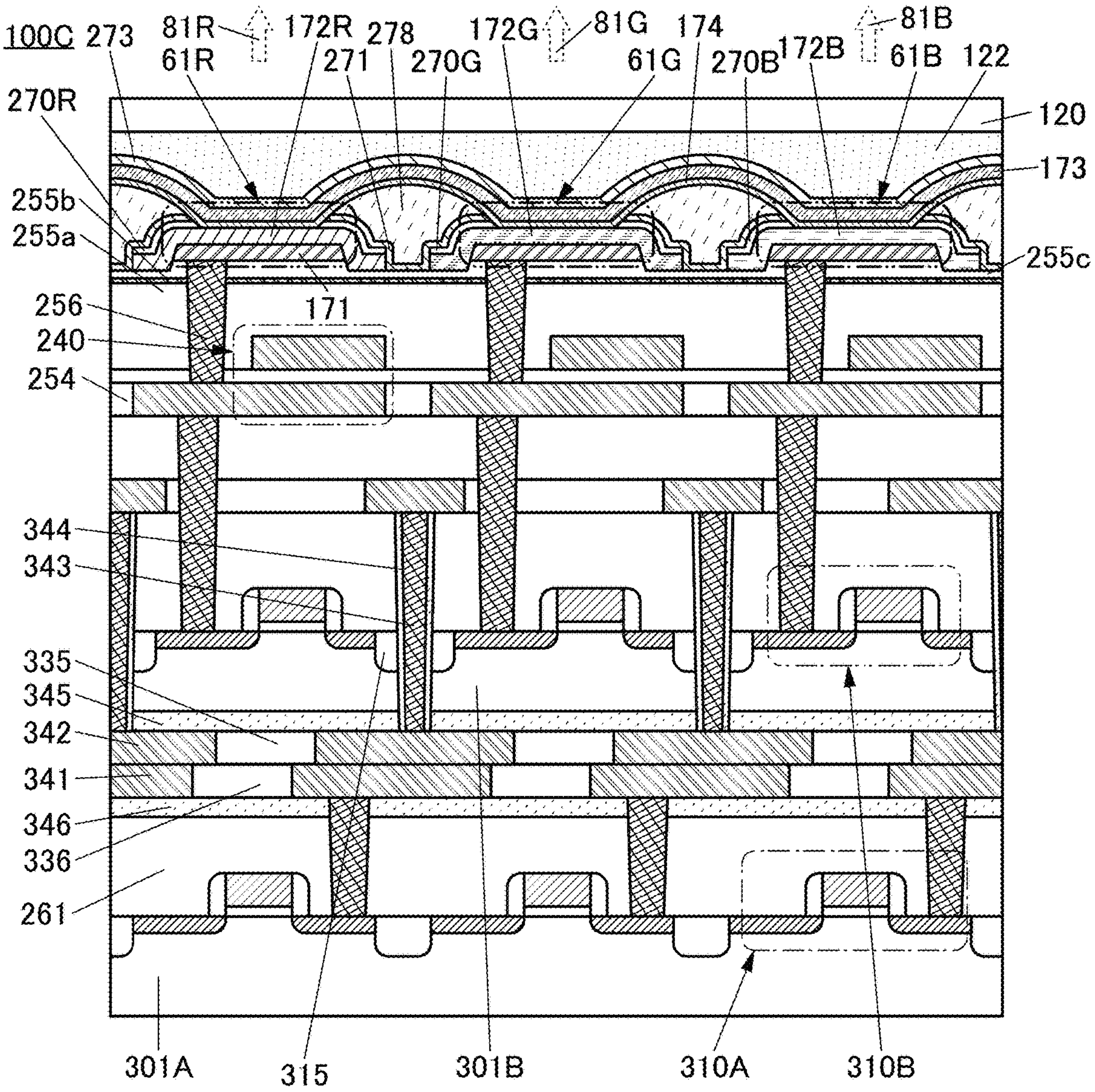
FIG. 21 illustrates a structure of a display apparatus of an embodiment.

FIG. 21 is a cross-sectional view illustrating a structure of a display apparatus 100C. The display apparatus 100C can be used as the display apparatus 100 of the display module 280, for example (see FIG. 19). Note that in the following description of display apparatuses, the description of portions similar to those of the above-described display apparatuses may be omitted.

The display apparatus 100C includes a substrate 301B and a substrate 301A. The display apparatus 100C includes a transistor 310B, the capacitor 240, the light-emitting devices 61R, 61G, and 61B, and a transistor 310A. A channel of the transistor 310A is formed in part of the substrate 301A and a channel of the transistor 310B is formed in part of the substrate 301B.

[Insulating Layer 345 and Insulating Layer 346]

An insulating layer 345 is in contact with the bottom surface of the substrate 301B, and an insulating layer 346 is positioned over the insulating layer 261. For example, the inorganic insulating film that can be used as the protective layer 273 can be used as the insulating layers 345 and 346. The insulating layers 345 and 346 function as protective layers and can inhibit impurities from being diffused into the substrates 301B and 301A.

[Plug 343]

A plug 343 penetrates the substrate 301B and the insulating layer 345. An insulating layer 344 covers the side surface of the plug 343. For example, the inorganic insulating film that can be used as the protective layer 273 can be used as the insulating layer 344. The insulating layer 344 functions as a protective layer and can inhibit impurities from being diffused into the substrate 301B.

[Conductive Layer 342]

A conductive layer 342 is positioned between the insulating layer 345 and the insulating layer 346. It is preferable that the conductive layer 342 be embedded in an insulating layer 335 and a plane formed by the conductive layer 342 and the insulating layer 335 be preferably flat. Note that the conductive layer 342 is electrically connected to the plug 343.

[Conductive Layer 341]

A conductive layer 341 is positioned between the insulating layer 346 and the insulating layer 335. It is preferable that the conductive layer 341 be embedded in an insulating layer 336 and a plane formed by the conductive layer 341 and the insulating layer 336 be flat. The conductive layer 341 is bonded to the conductive layer 342. Thus, the substrate 301A is electrically connected to the substrate 301B.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

<<Display Apparatus 100D>>

Figure 22:
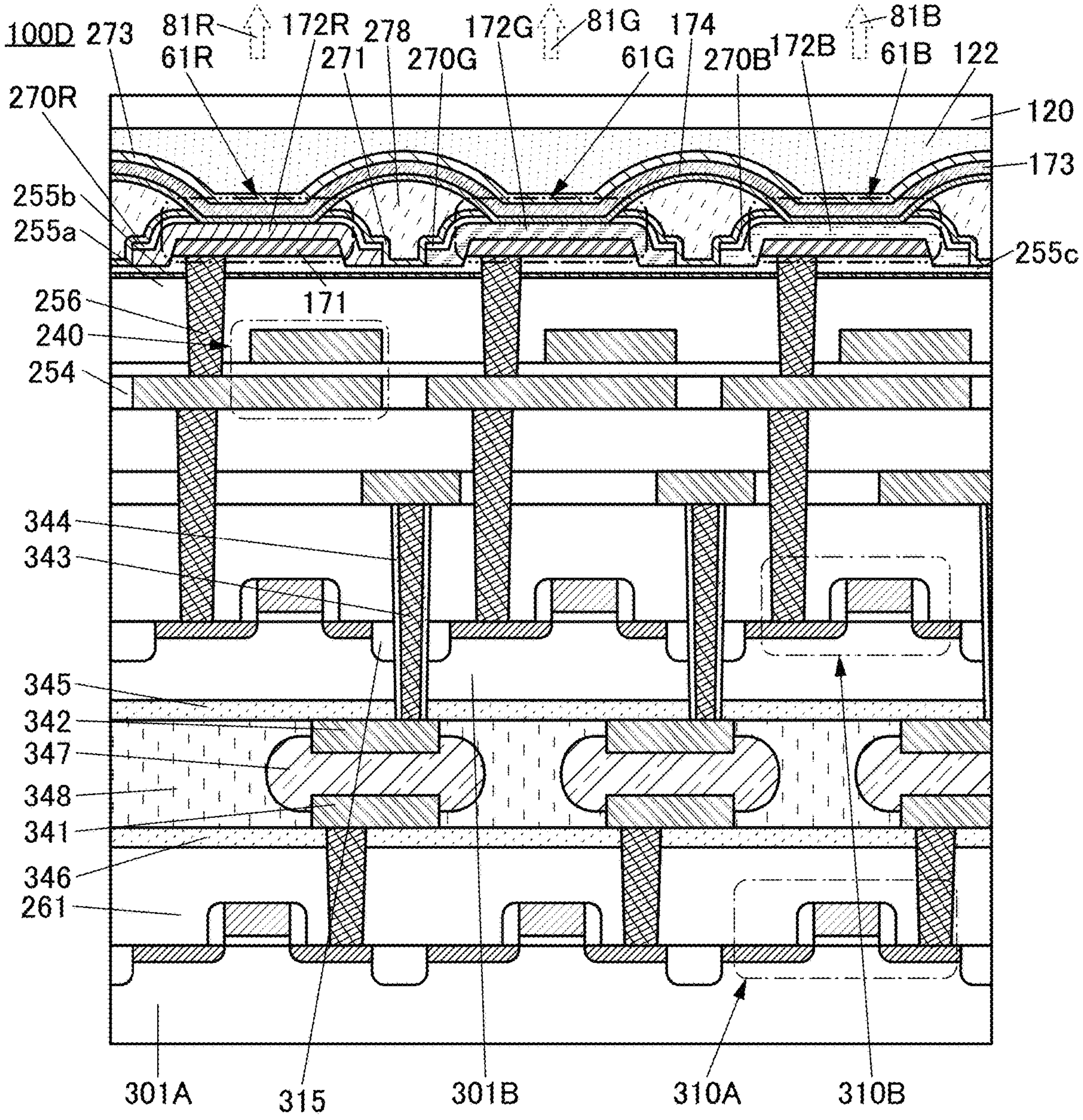
FIG. 22 illustrates a structure of a display apparatus of an embodiment.

FIG. 22 is a cross-sectional view illustrating a structure of a display apparatus 100D. The display apparatus 100D can be used as the display apparatus 100 of the display module 280, for example (see FIG. 19).

The display apparatus 100D includes a bump 347, and the bump 347 bonds the conductive layer 341 to the conductive layer 342. The bump 347 electrically connects the conductive layer 341 to the conductive layer 342. The bump 347 can be formed using a conductive material containing gold (Au), nickel (Ni), indium (In), tin (Sn), or the like, for example. Solder can be used for the bump 347, for example.

The display apparatus 100D includes a bonding layer 348. The bonding layer 348 attaches the insulating layer 345 to the insulating layer 346.

<<Display Apparatus 100E>>

Figure 23:
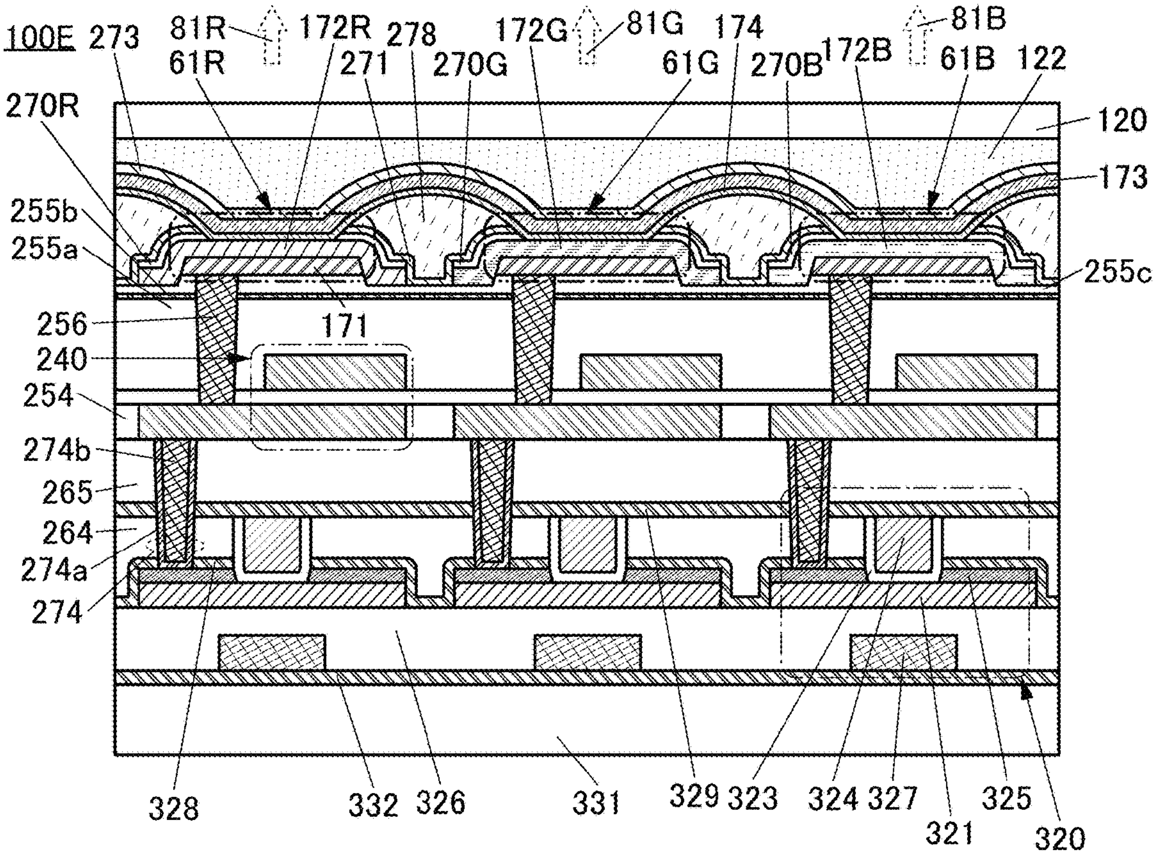
FIG. 23 illustrates a structure of a display apparatus of an embodiment.

FIG. 23 is a cross-sectional view illustrating a structure of a display apparatus 100E. The display apparatus 100E can be used as the display apparatus 100 of the display module 280, for example (see FIG. 19). A substrate 331 corresponds to the substrate 71 in FIG. 19. An insulating substrate or a semiconductor substrate can be used as the substrate 331. The display apparatus 100E includes a transistor 320. Note that the display apparatus 100E is different from the display apparatus 100A in that the transistor is an OS transistor.

[Insulating Layer 332]

An insulating layer 332 is provided over the substrate 331. For example, a film in which hydrogen or oxygen is less likely to be diffused than in a silicon oxide film can be used as the insulating layer 332. Specifically, an aluminum oxide film, a hafnium oxide film, a silicon nitride film, or the like can be used as the insulating layer 332. Thus, the insulating layer 332 can prevent impurities such as water and hydrogen from being diffused from the substrate 331 into the transistor 320. Furthermore, oxygen can be prevented from being released from a semiconductor layer 321 to the insulating layer 332 side.

[Transistor 320]

The transistor 320 includes the semiconductor layer 321, an insulating layer 323, a conductive layer 324, a pair of conductive layers 325, an insulating layer 326, and a conductive layer 327.

The conductive layer 327 is provided over the insulating layer 332 and functions as a first gate electrode of the transistor 320. The insulating layer 326 covers the conductive layer 327. Part of the insulating layer 326 functions as a first gate insulating layer. The insulating layer 326 includes an oxide insulating film at least in a region in contact with the semiconductor layer 321. Specifically, a silicon oxide film or the like is preferably used. The insulating layer 326 has a flat top surface. The semiconductor layer 321 is provided over the insulating layer 326. A metal oxide film having semiconductor characteristics can be used as the semiconductor layer 321. The pair of conductive layers 325 is provided on and in contact with the semiconductor layer 321, and functions as a source electrode and a drain electrode.

[Insulating Layer 328 and Insulating Layer 264]

An insulating layer 328 covers the top and side surfaces of the pair of conductive layers 325, the side surface of the semiconductor layer 321, and the like. An insulating layer 264 is provided over the insulating layer 328 and functions as an interlayer insulating layer. The insulating layers 328 and 264 have an opening reaching the semiconductor layer 321. For example, an insulating film similar to the insulating layer 332 can be used as the insulating layer 328. Thus, the insulating layer 328 can prevent impurities such as water and hydrogen from being diffused from the insulating layer 264 into the semiconductor layer 321. Furthermore, oxygen can be prevented from being released from the semiconductor layer 321.

[Insulating Layer 323]

The insulating layer 323 is in contact with the side surfaces of the insulating layers 264 and 328 and the conductive layer 325 and the top surface of the semiconductor layer 321 inside the opening.

[Conductive Layer 324]

Inside the opening, the conductive layer 324 is embedded and in contact with the insulating layer 323. The conductive layer 324 has a top surface subjected to planarization treatment, and is level with or substantially level with the top surface of the insulating layer 323 and the top surface of the insulating layer 264. The conductive layer 324 functions as a second gate electrode, and the insulating layer 323 functions as a second gate insulating layer.

[Insulating Layer 329 and Insulating Layer 265]

An insulating layer 329 covers the conductive layer 324 and the insulating layers 323 and 264. An insulating layer 265 is provided over the insulating layer 329 and functions as an interlayer insulating layer. For example, an insulating film similar to the insulating layers 328 and 332 can be used as the insulating layer 329. Thus, impurities such as water and hydrogen can be prevented from being diffused from the insulating layer 265 into the transistor 320, for example.

[Plug 274]

A plug 274 is embedded in the insulating layers 265, 329, 264, and 328 and is electrically connected to one of the pair of conductive layers 325. The plug 274 includes a conductive layer 274*a* and a conductive layer 274*b*. The conductive layer 274*a* is in contact with each of the side surfaces of openings in the insulating layers 265, 329, 264, and 328. In addition, the conductive layer 274*a* covers part of the top surface of the conductive layer 325. The conductive layer 274*b* is in contact with the top surface of the conductive layer 274*a*. For example, a conductive material in which hydrogen and oxygen are less likely to be diffused can be suitably used for the conductive layer 274*a*.

<<Display Apparatus 100F>>

Figure 24:
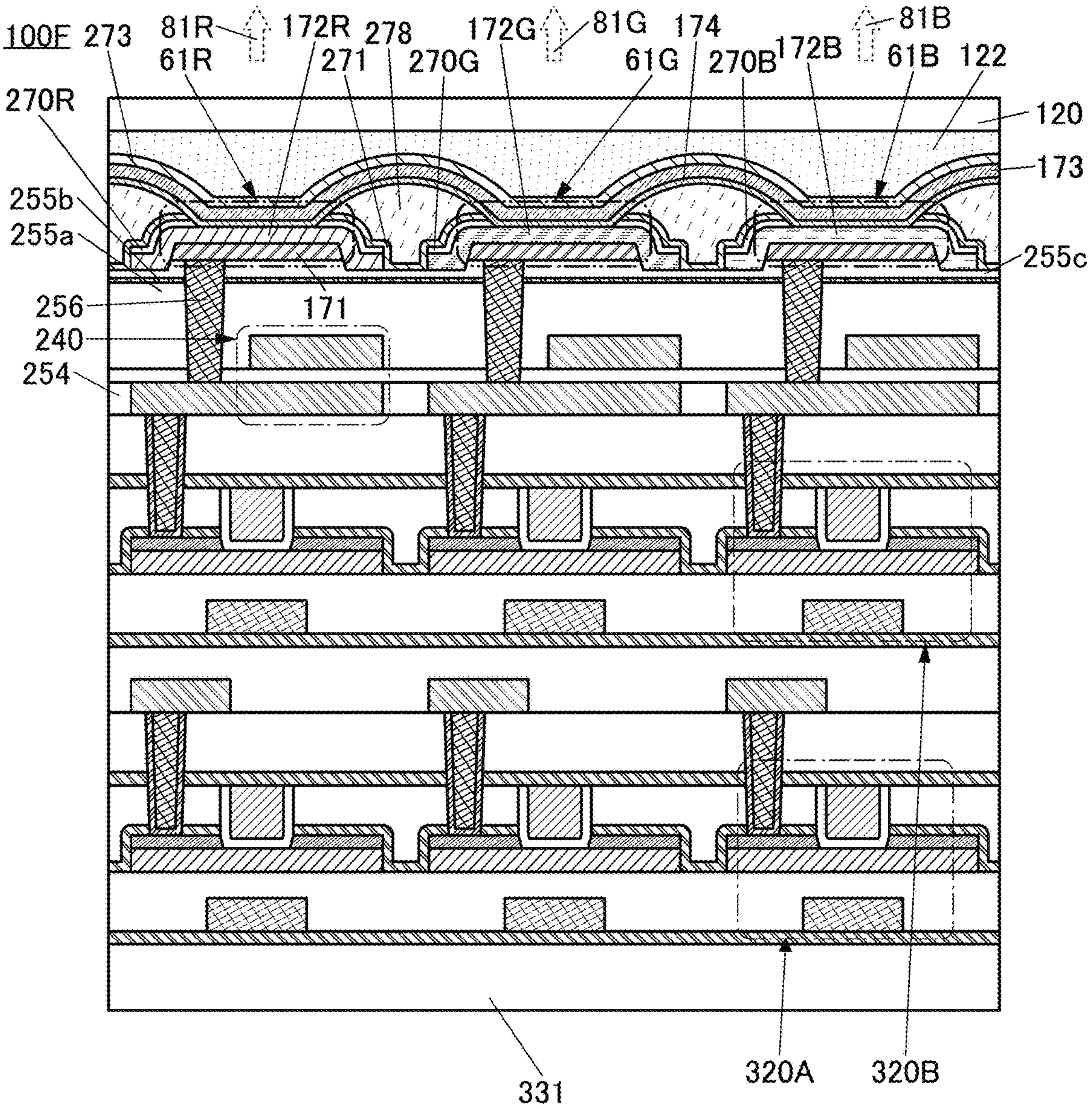
FIG. 24 illustrates a structure of a display apparatus of an embodiment.

FIG. 24 is a cross-sectional view illustrating a structure of a display apparatus 100F. The display apparatus 100F has a structure in which a transistor 320A and a transistor 320B are stacked. Each of the transistors 320A and 320B includes an oxide semiconductor and a channel formed in the oxide semiconductor. Note that the structure of the display apparatus 100F is not limited to the stacked-layer structure of two transistors, and may be a structure in which three or more transistors are stacked, for example.

The structures of the transistor 320A and the peripheral components are the same as those of the transistor 320 and the peripheral components of the display apparatus 100E. The structures of the transistor 320B and the peripheral components are the same as those of the transistor 320 and the peripheral components of the display apparatus 100E.

<<Display Apparatus 100G>>

Figure 25:
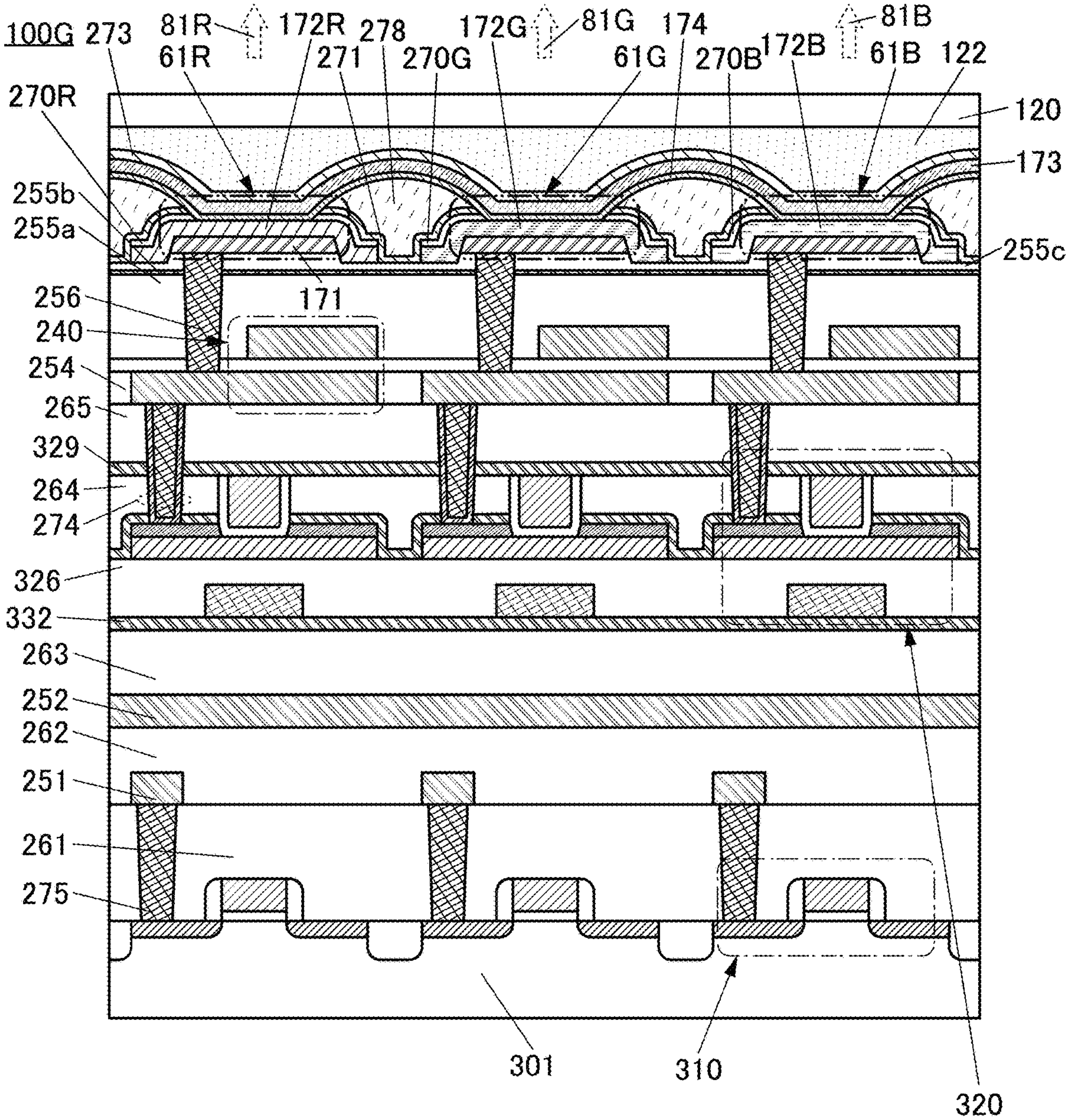
FIG. 25 illustrates a structure of a display apparatus of an embodiment.

FIG. 25 is a cross-sectional view illustrating a structure of a display apparatus 100G. The display apparatus 100G has a structure in which the transistor 310 and the transistor 320 are stacked. The channel of the transistor 310 is formed in the substrate 301. The transistor 320 includes an oxide semiconductor and the channel formed in the oxide semiconductor.

The insulating layer 261 covers the transistor 310 and a conductive layer 251 is provided over the insulating layer 261. An insulating layer 262 covers the conductive layer 251 and a conductive layer 252 is provided over the insulating layer 262. An insulating layer 263 and the insulating layer 332 covers the conductive layer 252. The conductive layer 251 and the conductive layer 252 each function as a wiring.

The transistor 320 is provided over the insulating layer 332 and the insulating layer 265 covers the transistor 320. The capacitor 240 is provided over the insulating layer 265 and is electrically connected to the transistor 320 through the plug 274.

For example, the transistor 320 can be used as a transistor included in a pixel circuit. For another example, the transistor 310 can be used as a transistor included in a pixel circuit or for a driver circuit (e.g., a gate driver circuit or a source driver circuit) for driving the pixel circuit. The transistor 310 and the transistor 320 can be used for a variety of circuits such as an arithmetic circuit and a memory circuit. Thus, not only a pixel circuit but also a driver circuit can be provided directly under the light-emitting device, for example. The display apparatus can be downsized as compared to the case where a driver circuit is provided around a display region.

At least part of this embodiment can be implemented in combination with any of the other embodiments described in this specification, as appropriate.

Embodiment 9

In this embodiment, a display module of one embodiment of the present invention is described.

<Display Module>

Figure 26:
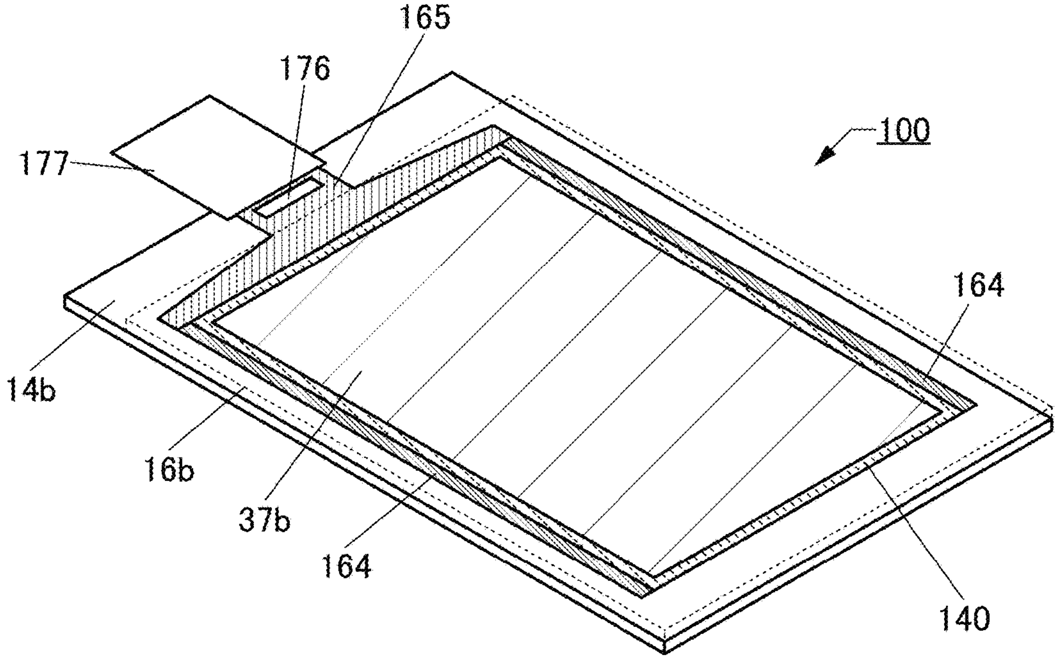
FIG. 26 illustrates a structure of a display module of an embodiment.

FIG. 26 is a perspective view illustrating a structure of a display module.

The display module includes the display apparatus 100, an integrated circuit (IC) 176, and one of an FPC 177 and a connector. The display apparatus described in Embodiment 1 can be used as the display apparatus 100, for example.

The display apparatus 100 is electrically connected to the IC 176 and the FPC 177. The FPC 177 is supplied with a signal and electric power from the outside and supplies the signal and the electric power to the display apparatus 100. Note that a connector is a mechanical component for electrical connection through a conductor, and the conductor can electrically connect the display apparatus 100 to a component to be connected. For example, the FPC 177 can be used as the conductor. The connector can detach the display apparatus 100 from the connected component.

The display module includes the IC 176. For example, the IC 176 can be provided for a substrate 14*b* by a chip on glass (COG) method. Alternatively, the IC 176 can be provided for an FPC by a chip on film (COF) method, for example. Note that a gate driver circuit, a source driver circuit, or the like can be used as the IC 176.

<<Display Apparatus 100H>>

Figure 27A:
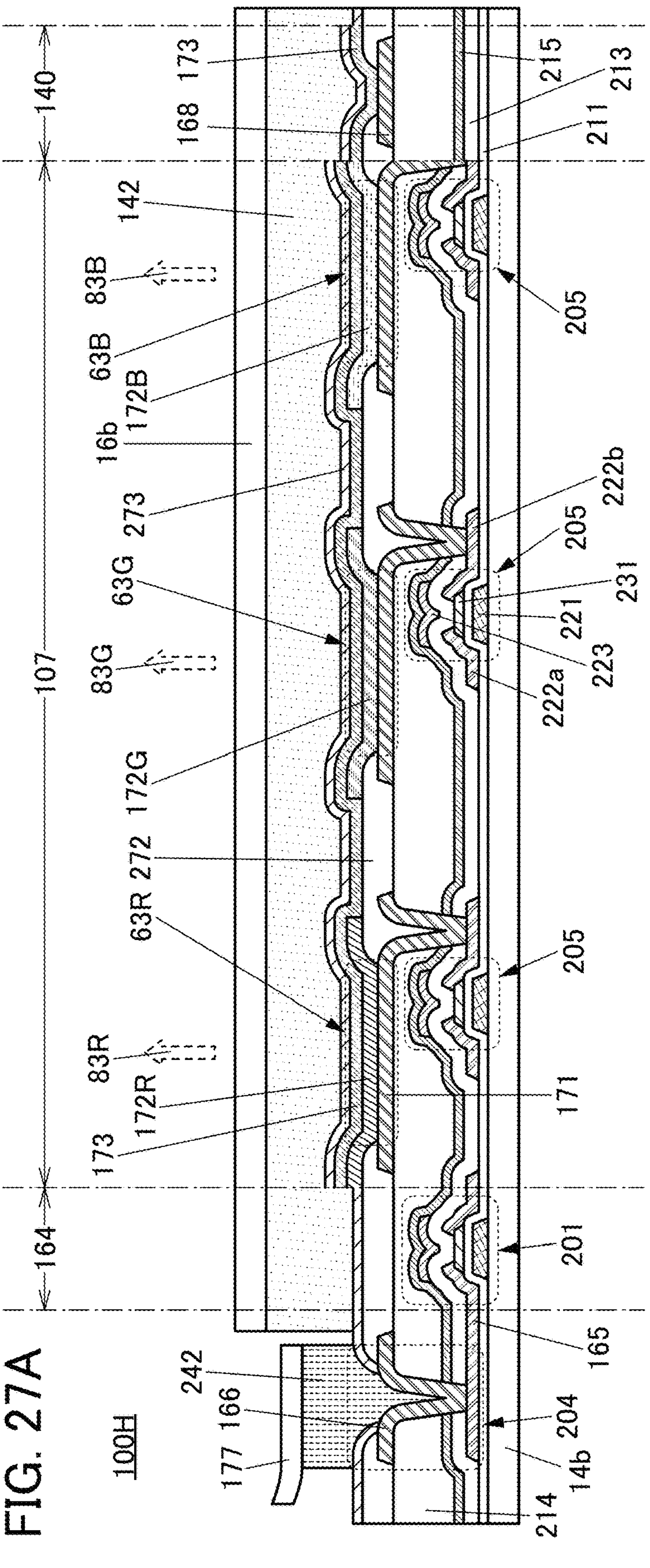
FIGS. 27A to 27C illustrate a structure of a display apparatus of an embodiment.

FIG. 27A is a cross-sectional view illustrating a structure of a display apparatus 100H.

The display apparatus 100H includes a display portion 37*b*, a connection portion 140, a circuit 164, a wiring 165, and the like. The display apparatus 100H includes a substrate 16*b* and the substrate 14*b*, which are bonded to each other. The display apparatus 100H includes one or more connection portions 140. The connection portion(s) 140 can be provided outside the display portion 37*b*. For example, the connection portion 140 can be provided along one side of the display portion 37*b*. Alternatively, the connection portion(s) 140 can be provided along a plurality of sides, for example, the connection portion(s) 140 can be provided to surround four sides. In the connection portion 140, a common electrode of a light-emitting device is electrically connected to a conductive layer, which supplies a predetermined potential to the common electrode.

The wiring 165 is supplied with a signal or electric power from the FPC 177 or the IC 176. The wiring 165 supplies a signal and electric power to the display portion 37*b* and the circuit 164.

For example, a gate driver circuit can be used as the circuit 164.

The display apparatus 100H includes the substrate 14*b*, the substrate 16*b*, a transistor 201, a transistor 205, a light-emitting device 63R, a light-emitting device 63G, a light-emitting device 63B, and the like (see FIG. 27A). For example, the light-emitting device 63R emits red light 83R, the light-emitting device 63G emits green light 83G, and the light-emitting device 63B emits blue light 83B. Note that a variety of optical members can be provided on the outer side of the substrate 16*b*. For example, a polarizing plate, a retardation plate, a light diffusion layer (e.g., a diffusion film), an anti-reflection layer, a light-condensing film, or the like can be provided.

For example, the light-emitting device described in any of Embodiments 2 to 6 can be used as each of the light-emitting devices 63R, 63G, and 63B.

The light-emitting device includes the conductive layer 171, which functions as a pixel electrode. The conductive layer 171 includes a recessed portion, which overlaps with an opening provided in an insulating layer 214, an insulating layer 215, and an insulating layer 213. The transistor 205 includes a conductive layer 222*b*, which is electrically connected to the conductive layer 171.

The display apparatus 100H includes an insulating layer 272. The insulating layer 272 covers an end portion of the conductive layer 171 to fill the recessed portion of the conductive layer 171 (see FIG. 27A).

The display apparatus 100H includes the protective layer 273 and a bonding layer 142. The protective layer 273 covers the light-emitting devices 63R, 63G, and 63B. The protective layer 273 and the substrate 16*b* are bonded to each other with the bonding layer 142. The bonding layer 142 fills a gap between the substrate 16*b* and the protective layer 273. Note that the bonding layer 142 may be formed in a frame shape so as not to overlap with the light-emitting devices and a region surrounded by the bonding layer 142, the substrate 16*b*, and the protective layer 273 may be filled with a resin different from the material of the bonding layer 142. Alternatively, a hollow sealing structure may be employed, in which the region is filled with an inert gas (e.g., nitrogen or argon). For example, the material that can be used for the bonding layer 122 can be used for the bonding layer 142.

The display apparatus 100H includes the connection portion 140, which includes a conductive layer 168. Note that a power supply potential is supplied to the conductive layer 168. The light-emitting device includes a conductive layer 173. The conductive layer 168 is electrically connected to the conductive layer 173, to which a power supply potential is supplied. Note that the conductive layer 173 functions as a common electrode. For example, the conductive layer 171 and the conductive layer 168 can be formed by processing one conductive film.

The display apparatus 100H has a top-emission structure. The light-emitting device emits light to the substrate 16*b* side. The conductive layer 171 contains a material reflecting visible light, and the conductive layer 173 transmits visible light.

[Insulating Layer 211, Insulating Layer 213, Insulating Layer 215, and Insulating Layer 214]

An insulating layer 211, the insulating layer 213, the insulating layer 215, and the insulating layer 214 are provided in this order over the substrate 14*b*. Note that the number of insulating layers is not limited and each insulating layer may be a single layer or a stacked layer of two or more layers.

For example, an inorganic insulating film can be used as each of the insulating layers 211, 213, and 215. A silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

The insulating layers 215 and 214 cover the transistors. The insulating layer 214 functions as a planarization layer. For example, a material in which impurities such as water and hydrogen are less likely to be diffused is preferably used for the insulating layer 215 or the insulating layer 214. This can effectively inhibit impurities from being diffused to the transistors from the outside. Furthermore, the reliability of the display apparatus can be improved.

For example, an organic insulating layer can be favorably used as the insulating layer 214. Specifically, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used for the organic insulating layer. Alternatively, the insulating layer 214 can have a stacked-layer structure of an organic insulating layer and an inorganic insulating layer. Thus, the outermost layer of the insulating layer 214 can be used as an etching protective layer. For example, in the case where a phenomenon of forming a recessed portion in the insulating layer 214 should be avoided in processing the conductive layer 171 into a predetermined shape, the phenomenon can be inhibited.

[Transistor 201 and Transistor 205]

The transistor 201 and the transistor 205 are formed over the substrate 14*b*. These transistors can be fabricated using the same materials in the same steps.

Each of the transistors 201 and 205 includes a conductive layer 221, the insulating layer 211, a conductive layer 222*a*, the conductive layer 222*b*, a semiconductor layer 231, the insulating layer 213, and a conductive layer 223. The insulating layer 211 is positioned between the conductive layer 221 and the semiconductor layer 231. The conductive layer 221 functions as a gate and the insulating layer 211 functions as a first gate insulating layer. The conductive layer 222*a* and the conductive layer 222*b* function as a source and a drain. The insulating layer 213 is positioned between the conductive layer 223 and the semiconductor layer 231. The conductive layer 223 functions as a gate and the insulating layer 213 functions as a second gate insulating layer. Here, a plurality of layers obtained by processing the same conductive film are shown with the same hatching pattern.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor layer of the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be suppressed.

The semiconductor layer of the transistor preferably contains a metal oxide. That is, an OS transistor is preferably used as the transistor included in the display apparatus of this embodiment.

[Semiconductor Layer]

For example, indium oxide, gallium oxide, and zinc oxide can be used for the semiconductor layer. The metal oxide preferably contains two or three kinds selected from indium, an element M, and zinc. The element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more of aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc (also referred to as ITZO (registered trademark)). It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the metal oxide used for the semiconductor layer is In-M-Zn oxide, the atomic ratio of In is preferably greater than or equal to the atomic ratio of M in the In-M-Zn oxide. Examples of the atomic ratio of the metal elements in such In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic ratio of Ga is greater than or equal to 1 and less than or equal to 3 and the atomic ratio of Zn is greater than or equal to 2 and less than or equal to 4 with the atomic ratio of In being 4. In addition, when the atomic ratio is described as In:Ga:Zn=5:1:6 or a composition in the vicinity thereof, the case is included where the atomic ratio of Ga is greater than 0.1 and less than or equal to 2 and the atomic ratio of Zn is greater than or equal to 5 and less than or equal to 7 with the atomic ratio of In being 5. Furthermore, when the atomic ratio is described as In:Ga:Zn=1:1:1 or a composition in the vicinity thereof, the case is included where the atomic ratio of Ga is greater than 0.1 and less than or equal to 2 and the atomic ratio of Zn is greater than 0.1 and less than or equal to 2 with the atomic ratio of In being 1.

The semiconductor layer may include two or more metal oxide layers having different compositions. For example, a stacked-layer structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed. In particular, gallium or aluminum is preferably used as the element M.

Alternatively, a stacked-layer structure of one selected from indium oxide, indium gallium oxide, and IGZO, and one selected from IAZO, IAGZO, and ITZO (registered trademark) may be employed, for example.

Examples of an oxide semiconductor having crystallinity include a c-axis-aligned crystalline oxide semiconductor (CAAC-OS) and a nanocrystalline oxide semiconductor (nc-OS).

Alternatively, a transistor using silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (also referred to as an LTPS transistor) can be used. The LTPS transistor has high field-effect mobility and excellent frequency characteristics.

With the use of Si transistors such as LTPS transistors, a circuit required to be driven at a high frequency (e.g., a data driver circuit) can be formed on the same substrate as the display portion. This allows simplification of an external circuit mounted on the display apparatus and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Therefore, when an OS transistor is used as the driving transistor in the pixel circuit, the amount of current flowing through the light-emitting device can be increased, so that the luminance of the light-emitting device can be increased.

When transistors are driven in a saturation region, a change in source-drain current relative to a change in gate-source voltage can be smaller in an OS transistor than in a Si transistor. Accordingly, when an OS transistor is used as the driving transistor included in the pixel circuit, a current flowing between the source and the drain can be minutely determined by controlling the gate-source voltage. Thus, the amount of current flowing through the light-emitting device can be controlled. Consequently, the number of gray levels expressed by the pixel circuit can be increased.

Regarding saturation characteristics of current flowing when transistors are driven in the saturation region, even when the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the light-emitting devices vary, for example. In other words, when the OS transistor is driven in the saturation region, the source-drain current hardly changes with an increase in the source-drain voltage. Hence, the luminance of the light-emitting device can be stable.

As described above, by using OS transistors as the driving transistors included in the pixel circuits, it is possible to inhibit black-level degradation, increase the luminance, increase the number of gray levels, and suppress variations in characteristics of light-emitting devices, for example.

The transistors included in the circuit 164 and the transistors included in the display portion 107 may have the same structure or different structures. One structure or two or more kinds of structures may be employed for a plurality of transistors included in the circuit 164. Similarly, one structure or two or more kinds of structures may be employed for a plurality of transistors included in the display portion 107.

All transistors included in the display portion 107 may be OS transistors, or all transistors included in the display portion 107 may be Si transistors. Alternatively, some of the transistors included in the display portion 107 may be OS transistors and the others may be Si transistors.

For example, when both an LTPS transistor and an OS transistor are used in the display portion 107, the display apparatus can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling current.

For example, one transistor included in the display portion 107 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased.

Another transistor included in the display portion 107 functions as a switch for controlling selection or non-selection of a pixel and can be referred to as a selection transistor. A gate of the selection transistor is electrically connected to a gate line, and one of a source and a drain thereof is electrically connected to a signal line. An OS transistor is preferably used as the selection transistor. In that case, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML structure. This structure can significantly reduce a leakage current that would flow through a transistor and a leakage current that would flow between adjacent light-emitting devices. Displaying images on the display apparatus having this structure can bring one or more of image crispness, image sharpness, high color saturation, and a high contrast ratio to the viewer. When a leakage current that would flow through the transistor and a lateral leakage current that would flow between light-emitting devices are extremely low, display with little leakage of light at the time of black display (black-level degradation), for example, can be achieved.

In particular, current flowing between adjacent light-emitting devices having the MML structure can be extremely reduced.

[Transistor 209 and Transistor 210]

Figure 27B:
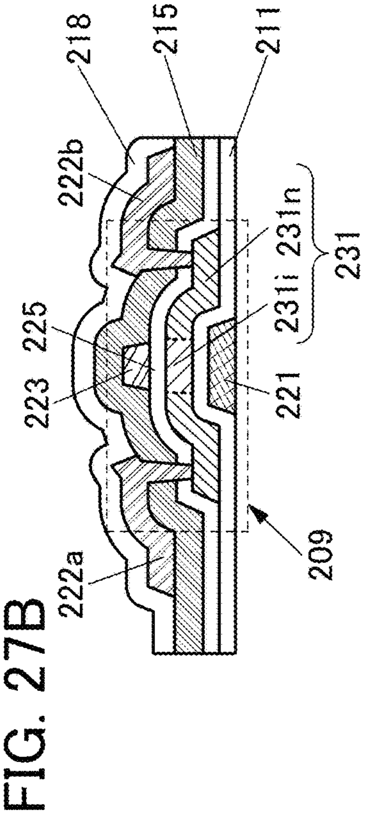
Figure 27C:
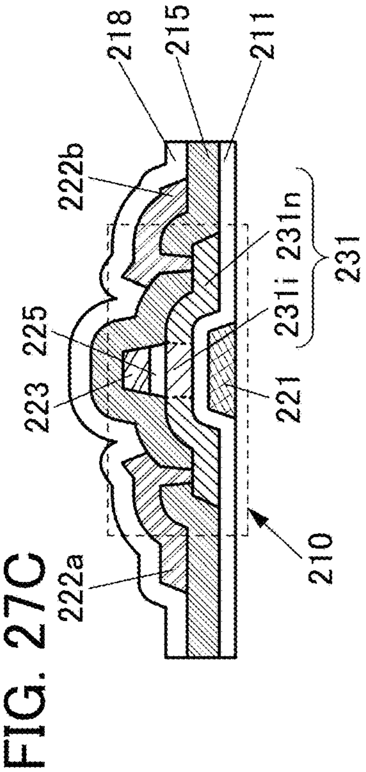

FIGS. 27B and 27C are cross-sectional views each illustrating another example of a cross-sectional structure of a transistor that can be used for the display apparatus 100H.

A transistor 209 and a transistor 210 each include the conductive layer 221, the insulating layer 211, the semiconductor layer 231, the conductive layer 222*a*, the conductive layer 222*b*, an insulating layer 225, the conductive layer 223, and the insulating layer 215. The semiconductor layer 231 includes a channel formation region 231*i* and a pair of low-resistance regions 231*n*. The insulating layer 211 is positioned between the conductive layer 221 and the channel formation region 231*i*. The conductive layer 221 functions as a gate and the insulating layer 211 functions as a first gate insulating layer. The insulating layer 225 is positioned at least between the conductive layer 223 and the channel formation region 231*i*. The conductive layer 223 functions as a gate, and the insulating layer 225 functions as a second gate insulating layer. The conductive layer 222*a* is electrically connected to one of the pair of low-resistance regions 231*n* and the conductive layer 222*b* is electrically connected to the other of the pair of low-resistance regions 231*n*. The insulating layer 215 covers the conductive layer 223. An insulating layer 218 covers the transistor.

Structure Example 1 of Insulating Layer 225

In the transistor 209, the insulating layer 225 covers the top and side surfaces of the semiconductor layer 231 (see FIG. 27B). The insulating layer 225 and the insulating layer 215 have openings, through which the conductive layers 222*a* and 222*b* are electrically connected to the low-resistance regions 231*n*. One of the conductive layers 222*a* and 222*b* functions as a source, and the other functions as a drain.

Structure Example 2 of Insulating Layer 225

In the transistor 210, the insulating layer 225 overlaps with the channel formation region 231*i* of the semiconductor layer 231 and does not overlap with the low-resistance regions 231*n* (see FIG. 27C). For example, the insulating layer 225 can be processed into a predetermined shape using the conductive layer 223 as a mask. The insulating layer 215 covers the insulating layer 225 and the conductive layer 223.

The insulating layer 215 has openings, and the conductive layers 222*a* and 222*b* are electrically connected to the low-resistance regions 231*n*.

[Connection Portion 204]

A connection portion 204 is provided for the substrate 14*b*. The connection portion 204 includes a conductive layer 166, which is electrically connected to the wiring 165. Note that the connection portion 204 does not overlap with the substrate 16*b*, and the conductive layer 166 is exposed. Note that the conductive layer 166 and the conductive layer 171 can be formed by processing one conductive film. The conductive layer 166 is electrically connected to the FPC 177 through a connection layer 242. As the connection layer 242, for example, an anisotropic conductive film (ACF) or an anisotropic conductive paste (ACP) can be used.

<<Display Apparatus 100I>>

Figure 28:
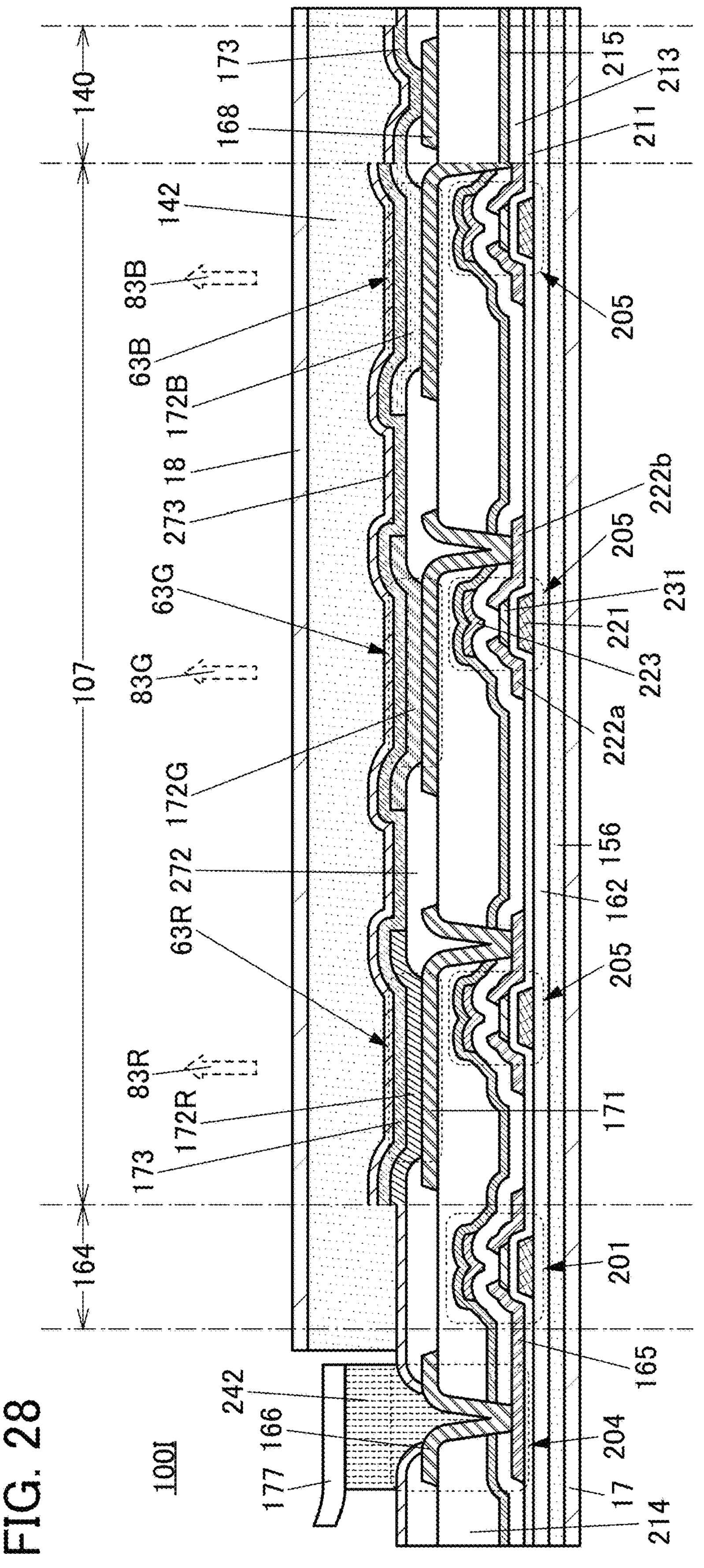
FIG. 28 illustrates a structure of a display apparatus of an embodiment.

FIG. 28 is a cross-sectional view illustrating a structure of a display apparatus 100I. The display apparatus 100I is different from the display apparatus 100H in having flexibility. In other words, the display apparatus 100I is a flexible display. The display apparatus 100I includes a substrate 17 and a substrate 18 instead of the substrate 14*b* and the substrate 16*b*, respectively. The substrates 17 and 18 both have flexibility.

The display apparatus 100I includes a bonding layer 156 and an insulating layer 162. The insulating layer 162 and the substrate 17 are bonded to each other with the bonding layer 156. For example, the material that can be used for the bonding layer 122 can be used for the bonding layer 156. For example, the material that can be used for the insulating layer 211, the insulating layer 213, or the insulating layer 215 can be used for the insulating layer 162. Note that the transistors 201 and 205 are provided over the insulating layer 162.

For example, the insulating layer 162 is formed over a formation substrate, and the transistors, the light-emitting devices, and the like are formed over the insulating layer 162. Then, the bonding layer 142 is formed over the light-emitting devices, and the formation substrate and the substrate 18 are bonded to each other with the bonding layer 142. After that, the formation substrate is separated from the insulating layer 162 and the surface of the insulating layer 162 is exposed. Then, the bonding layer 156 is formed on the exposed surface of the insulating layer 162, and the insulating layer 162 and the substrate 17 are bonded to each other with the bonding layer 156. In this manner, the components formed over the formation substrate can be transferred onto the substrate 17, whereby the display apparatus 100I can be manufactured.

<<Display Apparatus 100J>>

Figure 29:
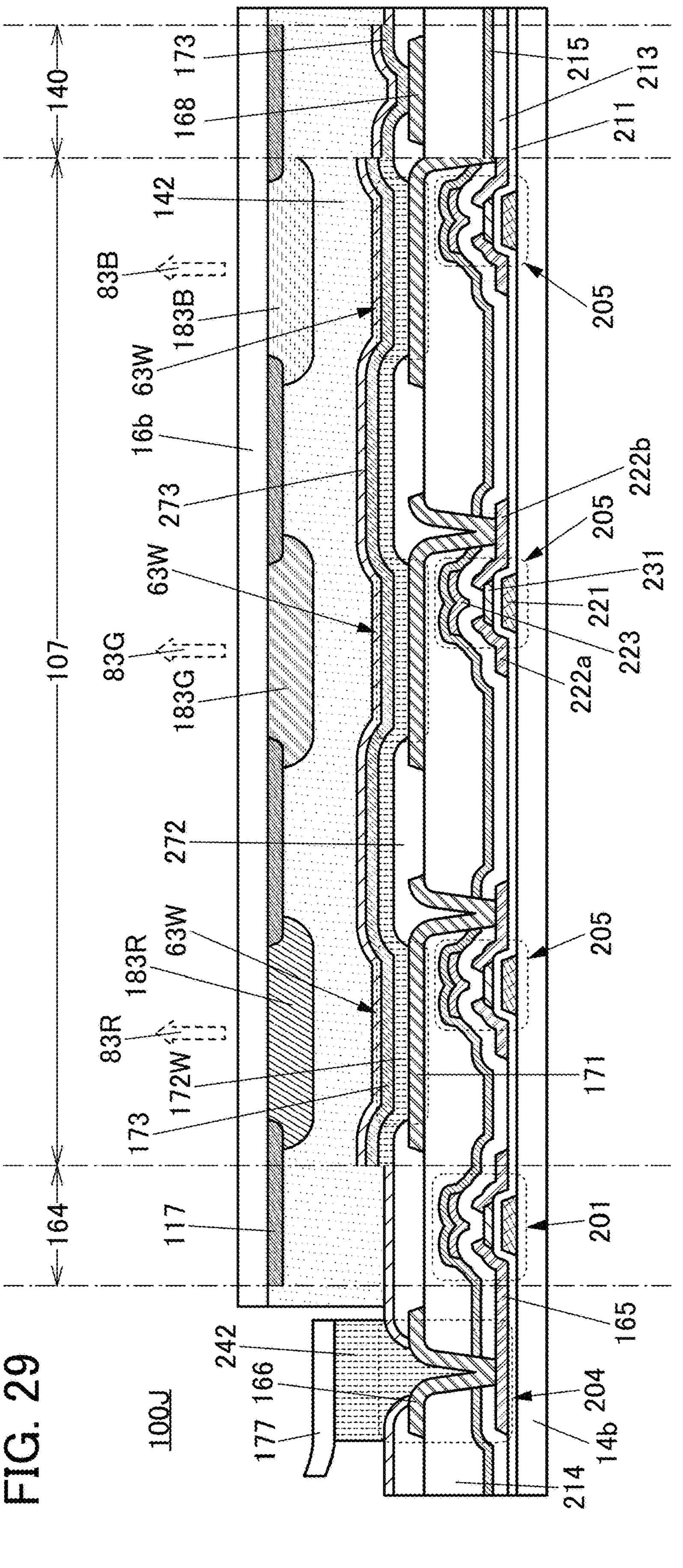
FIG. 29 illustrates a structure of a display apparatus of an embodiment.

FIG. 29 is a cross-sectional view illustrating a structure of a display apparatus 100J. The display apparatus 100J is different from the display apparatus 100H in including light-emitting devices 63W, instead of the light-emitting devices 63R, 63G and 63B, and the coloring layers 183R, 183G, and 183B.

The display apparatus 100J includes the coloring layers 183R, 183G, and 183B between the substrate 16*b* and the substrate 14*b*. The coloring layer 183R overlaps with one light-emitting device 63W, the coloring layer 183G overlaps with another light-emitting device 63W, and the coloring layer 183B overlaps with another light-emitting device 63W.

The display apparatus 100J includes a light-blocking layer 117. For example, the light-blocking layer 117 is provided between the coloring layers 183R and 183G, between the coloring layers 183G and 183B, and between the coloring layers 183B and 183R. The light-blocking layer 117 includes a region overlapping with the connection portion 140 and a region overlapping with the circuit 164.

The light-emitting device 63W can emit white light, for example. For example, the coloring layer 183R, the coloring layer 183G, and the coloring layer 183B can transmit red light, green light, and blue light, respectively. In this manner, the display apparatus 100J can emit the red light 83R, the green light 83G, and the blue light 83B, for example, to perform full color display.

<<Display Apparatus 100K>>

Figure 30:
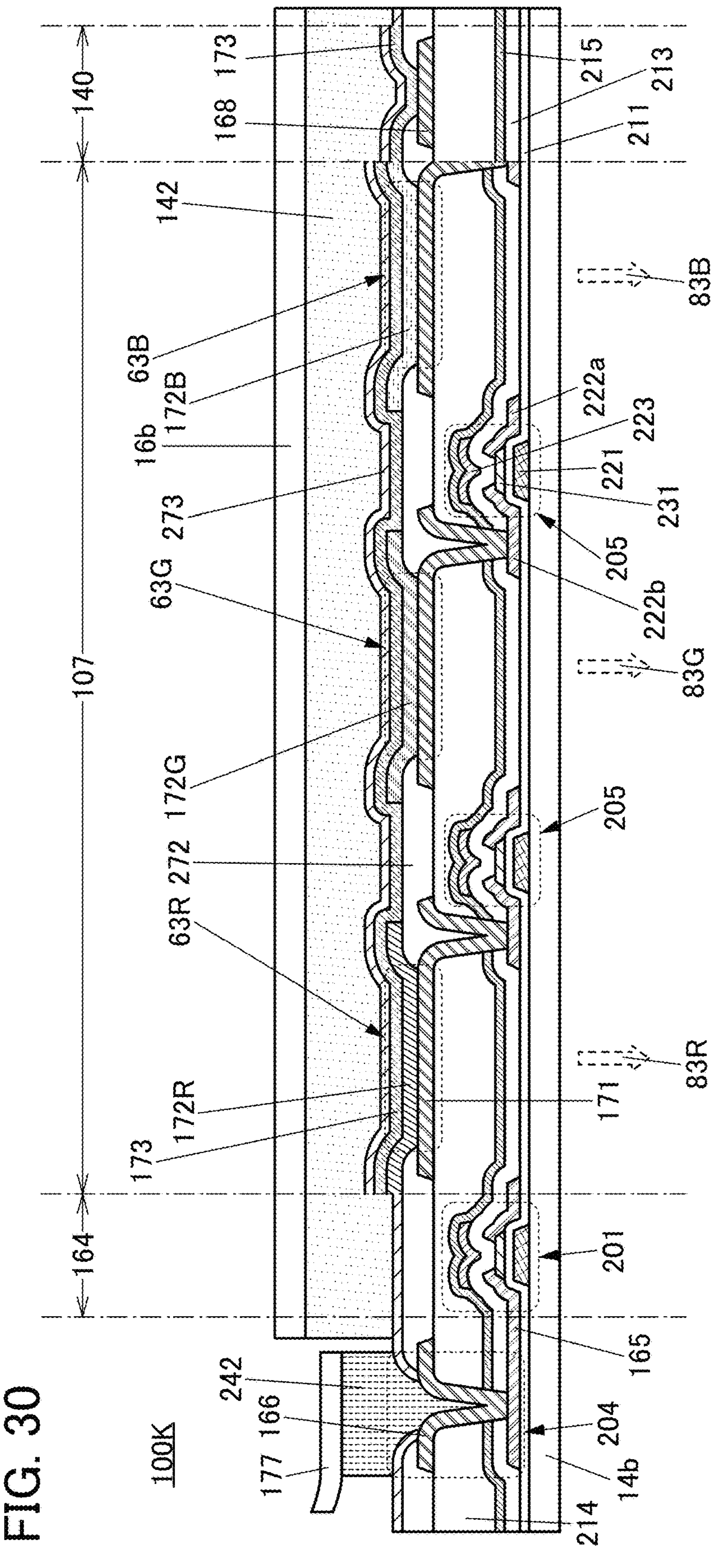
FIG. 30 illustrates a structure of a display apparatus of an embodiment.

FIG. 30 is a cross-sectional view illustrating a structure of a display apparatus 100K. The display apparatus 100K is different from the display apparatus 100H in having a bottom-emission structure. The light-emitting devices emit the light 83R, the light 83G, and the light 83B to the substrate 14*b* side. A visible-light-transmitting material is used for the conductive layer 171. A visible-light-reflecting material is used for the conductive layer 173.

<<Display Apparatus 100L>>

Figure 31:
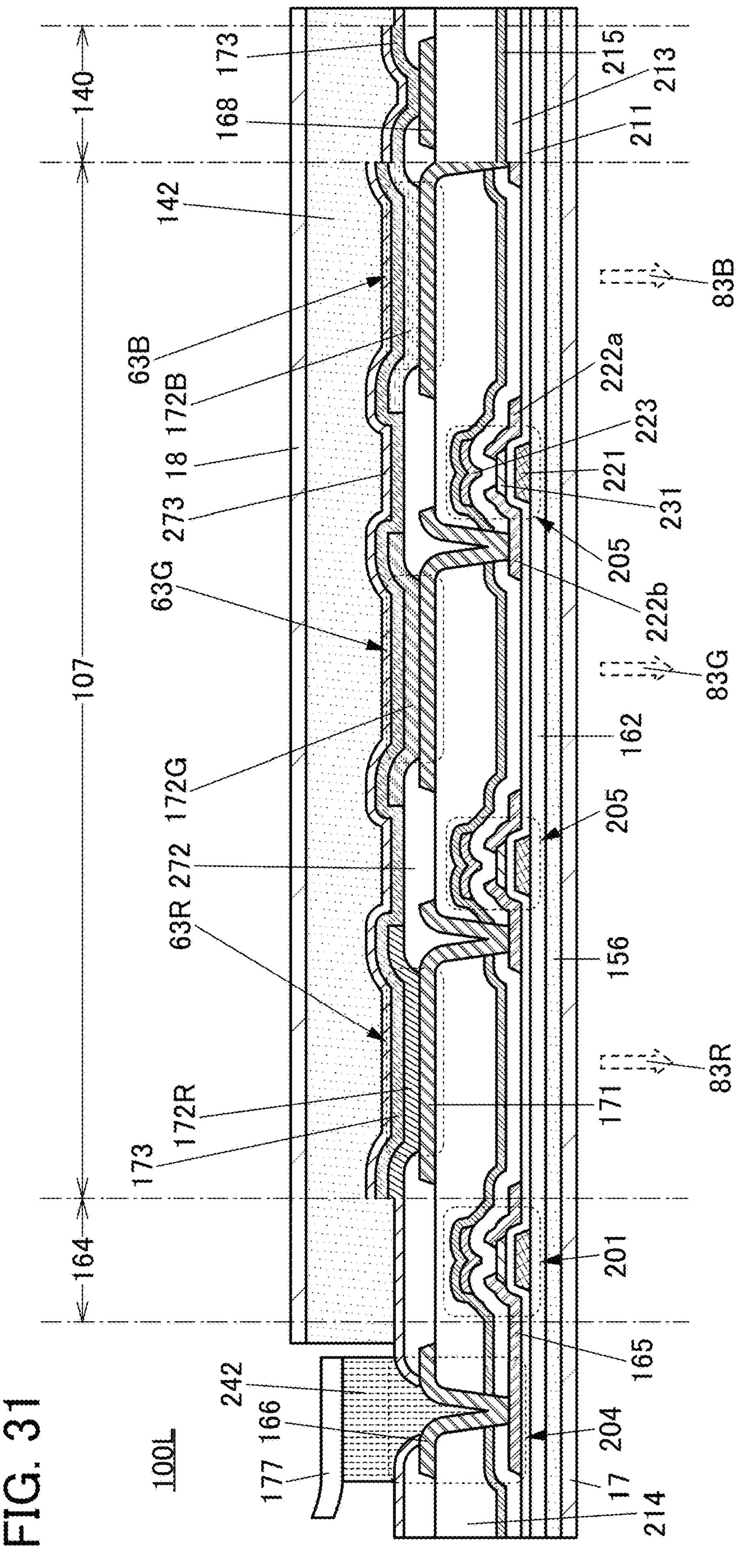
FIG. 31 illustrates a structure of a display apparatus of an embodiment.

FIG. 31 is a cross-sectional view illustrating a structure of a display apparatus 100L. The display apparatus 100L is different from the display apparatus 100H in having flexibility and a bottom-emission structure. The display apparatus 100L includes the substrate 17 and the substrate 18 instead of the substrate 14*b* and the substrate 16*b*, respectively. The substrates 17 and 18 both have flexibility. The light-emitting devices emit the light 83R, the light 83G, and the light 83B to the substrate 17 side.

The conductive layer 221 and the conductive layer 223 may have a property of transmitting visible light and a property of reflecting visible light. When the conductive layers 221 and 223 have a property of transmitting visible light, the visible-light transmittance in the display portion 107 can be improved. Meanwhile, when the conductive layers 221 and 223 have a property of reflecting visible light, the amount of visible light entering the semiconductor layer 231 can be reduced. In addition, damage to the semiconductor layer 231 can be reduced. Accordingly, the reliability of the display apparatus 100K or the display apparatus 100L can be increased.

Even in a top-emission display apparatus such as the display apparatus 100H or the display apparatus 100I, at least part of the layers included in the transistor 205 may have a property of transmitting visible light. In this case, the conductive layer 171 also has a property of transmitting visible light. Accordingly, the visible-light transmittance in the display portion 107 can be improved.

<<Display Apparatus 100M>>

Figure 32:
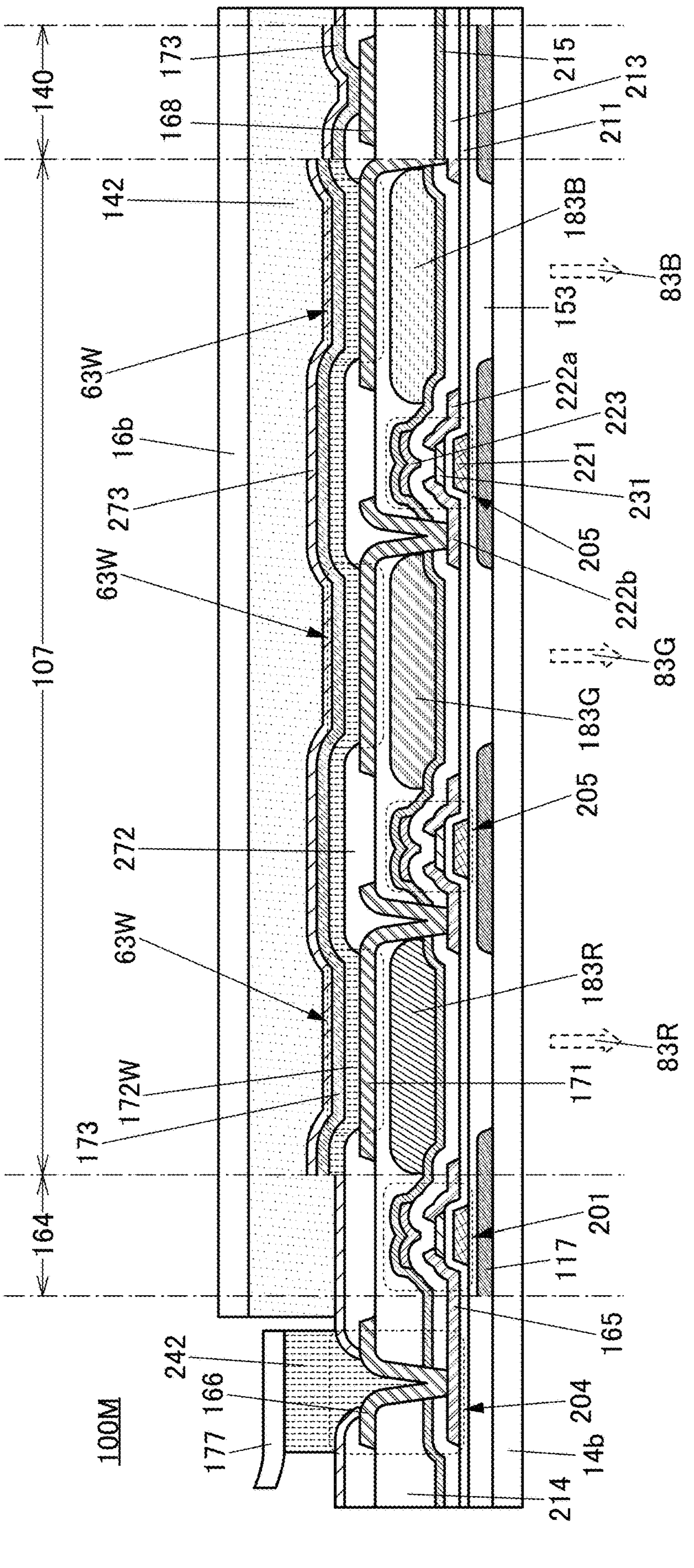
FIG. 32 illustrates a structure of a display apparatus of an embodiment.

FIG. 32 is a cross-sectional view illustrating a structure of a display apparatus 100M. The display apparatus 100M is different from the display apparatus 100H in having a bottom-emission structure and including the light-emitting devices 63W, instead of the light-emitting devices 63R, 63G and 63B, and the coloring layers 183R, 183G, and 183B.

The display apparatus 100M includes the coloring layers 183R, 183G, and 183B. The display apparatus 100M includes the light-blocking layer 117.

[Coloring Layer 183R, Coloring Layer 183G, and Coloring Layer 183B]

The coloring layers 183R, 183G, and 183B are positioned between the substrate 14*b* and the respective light-emitting devices 63W. For example, the coloring layers 183R, 183G, and 183B can be provided between the insulating layer 215 and the insulating layer 214.

[Light-Blocking Layer 117]

The light-blocking layer 117 is provided over the substrate 14*b* and positioned between the substrate 14*b* and the transistor 205. The insulating layer 153 is positioned between the light-blocking layer 117 and the transistor 205. For example, the light-blocking layer 117 does not overlap with a light-emitting region of the light-emitting device 63W. For example, the light-blocking layer 117 overlaps with the connection portion 140 and the circuit 164.

The light-blocking layer 117 can also be provided in the display apparatus 100K or the display apparatus 100L. In this case, light emitted from the light-emitting devices 63R, 63G, and 63B can be inhibited from being reflected by the substrate 14*b* and being diffused inside the display apparatus 100K or the display apparatus 100L, for example. Thus, the display apparatus 100K and the display apparatus 100L can provide high display quality. Meanwhile, when the light-blocking layer 117 is not provided, the extraction efficiency of light emitted from the light-emitting devices 63R, 63G, and 63B can be increased.

At least part of this embodiment can be implemented in combination with any of the other embodiments described in this specification, as appropriate.

Embodiment 10

In this embodiment, electronic devices of embodiments of the present invention will be described.

Electronic devices of this embodiment are each provided with the display apparatus of one embodiment of the present invention in a display portion. The display apparatus of one embodiment of the present invention is highly reliable and can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have high definition, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With such a display apparatus having one or both of high definition and high resolution, the electronic device can have higher realistic sensation, sense of depth, and the like in personal use such as portable use or home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device in this embodiment can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 33A to 33D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 33A:
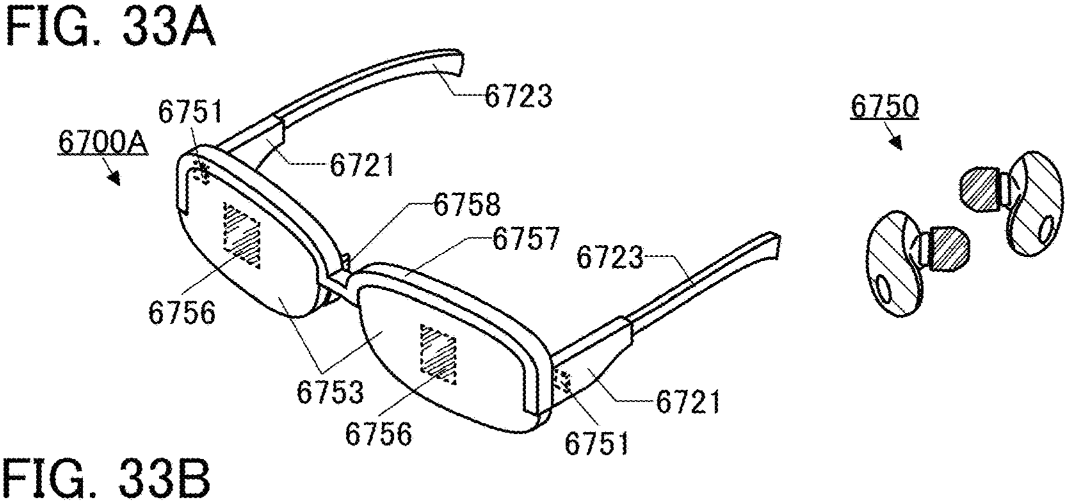
FIGS. 33A to 33D illustrate examples of electronic devices of an embodiment.
Figure 33B:
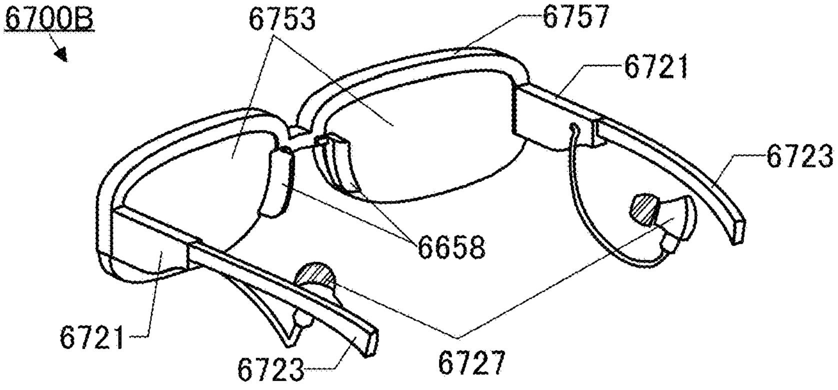

An electronic device 6700A illustrated in FIG. 33A and an electronic device 6700B illustrated in FIG. 33B each include a pair of display panels 6751, a pair of housings 6721, a communication portion (not illustrated), a pair of wearing portions 6723, a control portion (not illustrated), an image capturing portion (not illustrated), a pair of optical members 6753, a frame 6757, and a pair of nose pads 6758.

The display apparatus of one embodiment of the present invention can be used for the display panels 6751. Thus, a highly reliable electronic device is obtained.

The electronic devices 6700A and 6700B can each project images displayed on the display panels 6751 onto display regions 6756 of the optical members 6753. Since the optical members 6753 have a light-transmitting property, the user can see images displayed on the display regions, which are superimposed on transmission images seen through the optical members 6753. Accordingly, the electronic devices 6700A and 6700B are electronic devices capable of AR display.

In the electronic devices 6700A and 6700B, a camera capable of capturing images of the front side may be provided as the image capturing portion. Furthermore, when the electronic devices 6700A and 6700B are provided with an acceleration sensor such as a gyroscope sensor, the orientation of the user's head can be sensed and an image corresponding to the orientation can be displayed on the display regions 6756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 6700A and 6700B are provided with a battery so that they can be charged wirelessly and/or by wire.

A touch sensor module may be provided in the housing 6721. The touch sensor module has a function of detecting a touch on the outer surface of the housing 6721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 6721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element (also referred to as a photoelectric conversion device) can be used as a light-receiving element. One or both of an inorganic semiconductor and an organic semiconductor can be used for an active layer of the photoelectric conversion element.

Figure 33C:
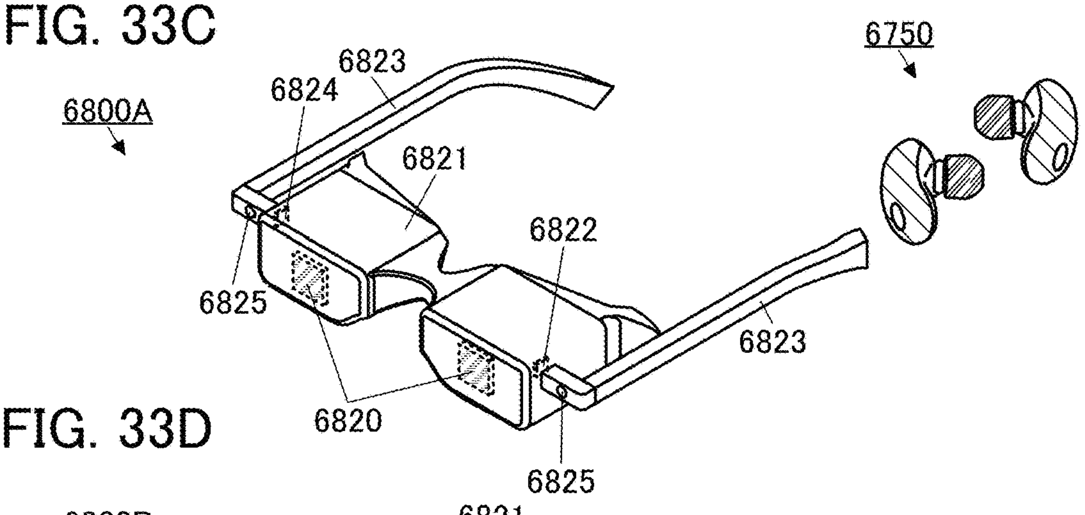
Figure 33D:
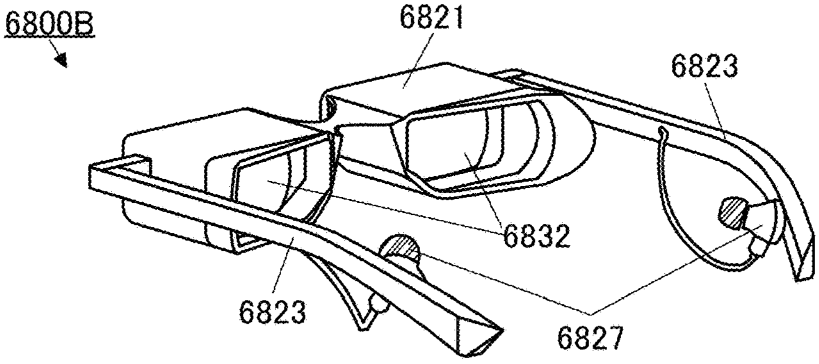

An electronic device 6800A illustrated in FIG. 33C and an electronic device 6800B illustrated in FIG. 33D each include a pair of display portions 6820, a housing 6821, a communication portion 6822, a pair of wearing portions 6823, a control portion 6824, a pair of image capturing portions 6825, and a pair of lenses 6832.

The display apparatus of one embodiment of the present invention can be used in the display portions 6820. Thus, a highly reliable electronic device is obtained.

The display portions 6820 are positioned inside the housing 6821 so as to be seen through the lenses 6832. When the pair of display portions 6820 display different images, three-dimensional display using parallax can be performed.

The electronic devices 6800A and 6800B can be regarded as electronic devices for VR. The user who wears the electronic device 6800A or the electronic device 6800B can see images displayed on the display portions 6820 through the lenses 6832.

The electronic devices 6800A and 6800B preferably include a mechanism for adjusting the lateral positions of the lenses 6832 and the display portions 6820 so that the lenses 6832 and the display portions 6820 are positioned optimally in accordance with the positions of the user's eyes. Moreover, the electronic devices 6800A and 6800B preferably include a mechanism for adjusting focus by changing the distance between the lenses 6832 and the display portions 6820.

The electronic device 6800A or the electronic device 6800B can be mounted on the user's head with the wearing portions 6823. FIG. 33C, for instance, shows an example where the wearing portion 6823 has a shape like a temple (also referred to as a joint or the like) of glasses; however, one embodiment of the present invention is not limited thereto. The wearing portion 6823 can have any shape with which the user can wear the electronic device, for example, a shape of a helmet or a band.

The image capturing portion 6825 has a function of obtaining information on the external environment. Data obtained by the image capturing portion 6825 can be output to the display portion 6820. An image sensor can be used for the image capturing portion 6825. Moreover, a plurality of cameras may be provided so as to support a plurality of fields of view, such as a telescope field of view and a wide field of view.

Although an example where the image capturing portions 6825 are provided is shown here, a range sensor (also referred to as a sensing portion) capable of measuring a distance between the user and an object just needs to be provided. In other words, the image capturing portion 6825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 6800A may include a vibration mechanism that functions as bone-conduction earphones. For example, at least one of the display portion 6820, the housing 6821, and the wearing portion 6823 can include the vibration mechanism. Thus, without additionally requiring an audio device such as headphones, earphones, or a speaker, the user can enjoy video and sound only by wearing the electronic device 6800A.

The electronic devices 6800A and 6800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 6750. The earphones 6750 include a communication portion (not illustrated) and have a wireless communication function. The earphones 6750 can receive information (e.g., audio data) from the electronic device with the wireless communication function. For example, the electronic device 6700A in FIG. 33A has a function of transmitting information to the earphones 6750 with the wireless communication function. As another example, the electronic device 6800A in FIG. 33C has a function of transmitting information to the earphones 6750 with the wireless communication function.

The electronic device may include an earphone portion. The electronic device 6700B in FIG. 33B includes earphone portions 6727. For example, the earphone portion 6727 can be connected to the control portion by wire. Part of a wiring that connects the earphone portion 6727 and the control portion may be positioned inside the housing 6721 or the wearing portion 6723.

Similarly, the electronic device 6800B in FIG. 33D includes earphone portions 6827. For example, the earphone portion 6827 can be connected to the control portion 6824 by wire. Part of a wiring that connects the earphone portion 6827 and the control portion 6824 may be positioned inside the housing 6821 or the wearing portion 6823. Alternatively, the earphone portions 6827 and the wearing portions 6823 may include magnets. This is preferred because the earphone portions 6827 can be fixed to the wearing portions 6823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 6700A and 6700B) and the goggles-type device (e.g., the electronic devices 6800A and 6800B) are preferable as the electronic device of one embodiment of the present invention.

The electronic device of one embodiment of the present invention can transmit information to earphones by wire or wirelessly.

Figure 34A:
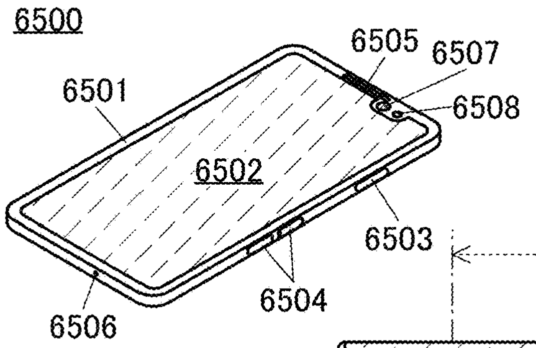
FIGS. 34A to 34F illustrate examples of electronic devices of an embodiment.

An electronic device 6500 illustrated in FIG. 34A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. Thus, a highly reliable electronic device is obtained.

Figure 34B:
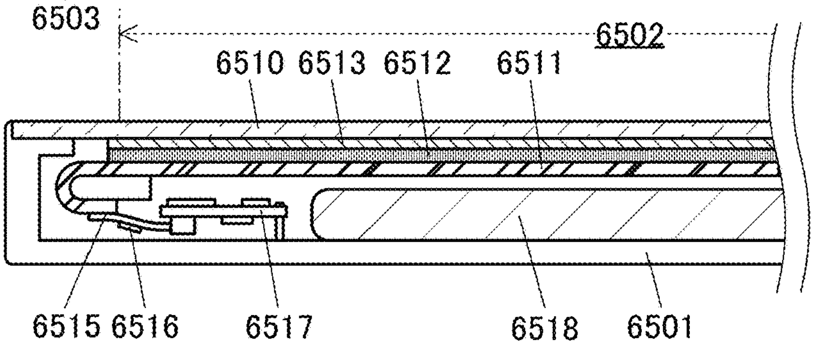

FIG. 34B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with a bonding layer (not illustrated).

Part of the display panel 6511 is folded back in a region outside the display portion 6502, and an FPC 6515 is connected to the region that is folded back. An IC 6516 is mounted on the FPC 6515. The FPC 6515 is connected to a terminal provided on the printed circuit board 6517.

The flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 34C:
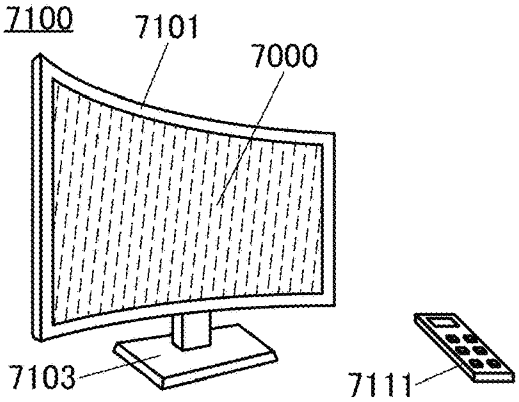

FIG. 34C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000. Thus, a highly reliable electronic device is obtained.

Operation of the television device 7100 illustrated in FIG. 34C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 34D:
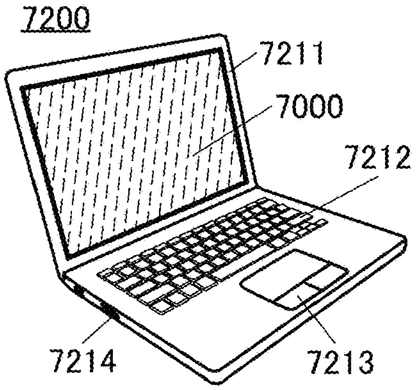

FIG. 34D illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. Thus, a highly reliable electronic device is obtained.

Figure 34E:
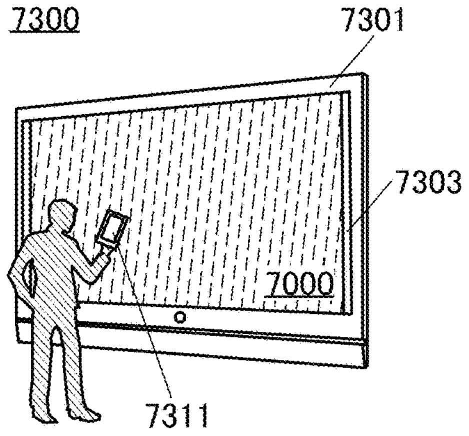
Figure 34F:
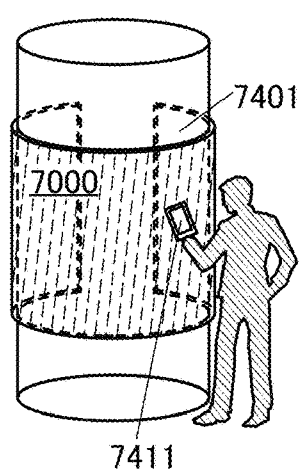

FIGS. 34E and 34F illustrate examples of digital signage.

Digital signage 7300 illustrated in FIG. 34E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 34F shows digital signage 7400 attached to a cylindrical pillar 7401. The digital signage 7400 includes the display portion 7000 provided along a curved surface of the pillar 7401.

In FIGS. 34E and 34F, the display apparatus of one embodiment of the present invention can be used in the display portion 7000. Thus, a highly reliable electronic device is obtained.

A larger area of the display portion 7000 can increase the amount of information that can be provided at a time. The larger display portion 7000 attracts more attention, so that the effectiveness of the advertisement can be increased, for example.

The use of the touch panel in the display portion 7000 is preferable because in addition to display of still or moving images on the display portion 7000, intuitive operation by a user is possible. Moreover, for an application for providing information such as route information or traffic information, usability can be enhanced by intuitive operation.

As illustrated in FIGS. 34E and 34F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 35A to 35G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 35A to 35G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices in FIGS. 35A to 35G are described in detail below.

Figure 35A:
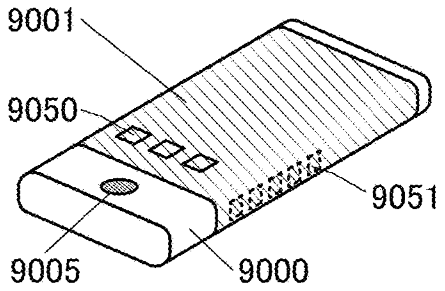
FIGS. 35A to 35G illustrate examples of electronic devices of an embodiment.

FIG. 35A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 35A illustrates an example where three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050, for example, may be displayed at the position where the information 9051 is displayed.

Figure 35B:
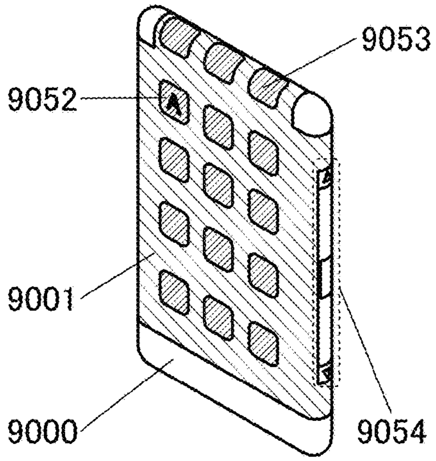

FIG. 35B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of user's clothes. Thus, the user can see the display without taking out the portable information terminal 9102 from the pocket and decide whether to answer the call, for example.

Figure 35C:
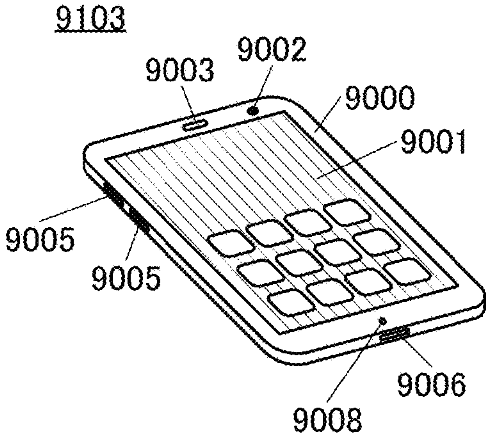

FIG. 35C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 35D:
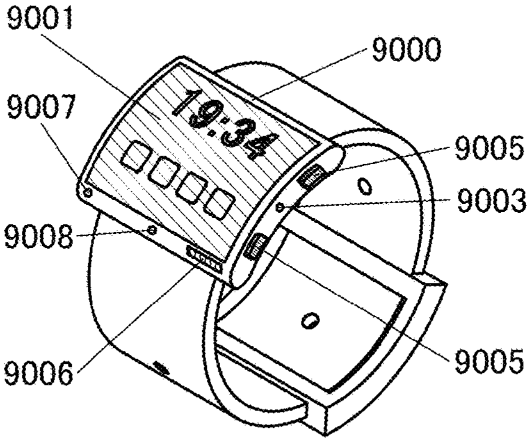

FIG. 35D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 35E:
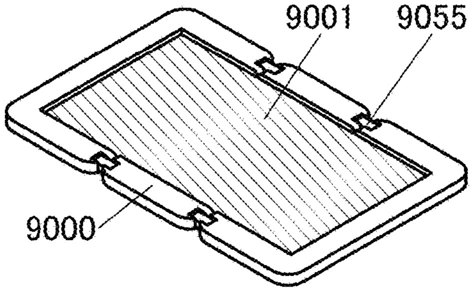
Figure 35F:
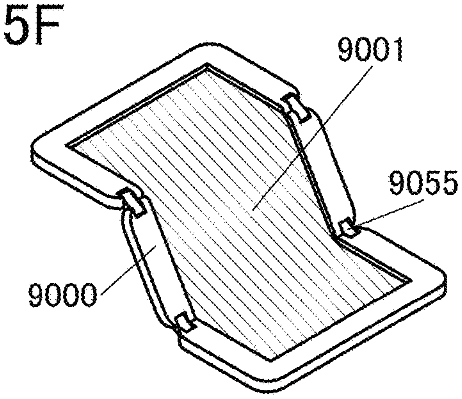
Figure 35G:
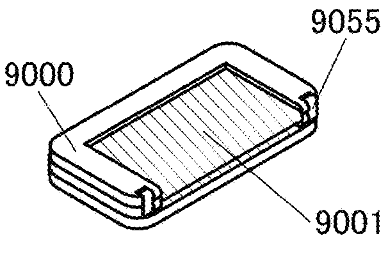

FIGS. 35E to 35G are perspective views of a foldable portable information terminal 9201. FIG. 35E is a perspective view showing the portable information terminal 9201 that is opened. FIG. 35G is a perspective view showing the portable information terminal 9201 that is folded. FIG. 35F is a perspective view showing the portable information terminal 9201 that is shifted from one of the states in FIGS. 35E and 35G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate. In this specification, in the case where a plurality of structure examples are shown in one embodiment, the structure examples can be combined as appropriate.

Example 1

In this example, a light-emitting device 1, a light-emitting device 2, and a light-emitting device 3 that can be used for a display apparatus of one embodiment of the present invention are described with reference to FIGS. 36A to 36C, FIG. 37, FIG. 38, FIG. 39, FIG. 40, FIG. 41, FIG. 41, FIG. 43, FIG. 44, FIG. 45, FIG. 46, FIG. 47, FIG. 48, FIG. 49, and FIGS. 50A to 50C.

Figure 36A:
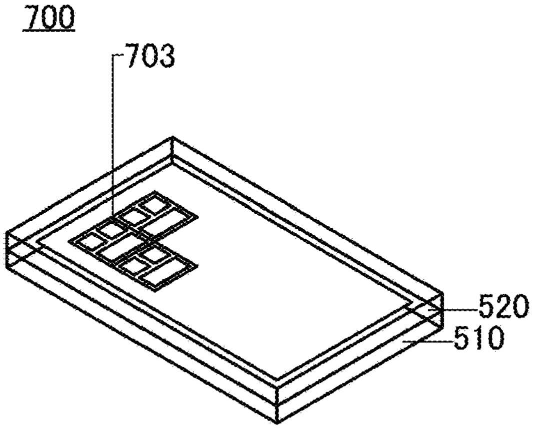
FIGS. 36A to 36C illustrate a structure of a display apparatus of an example.
Figure 36B:
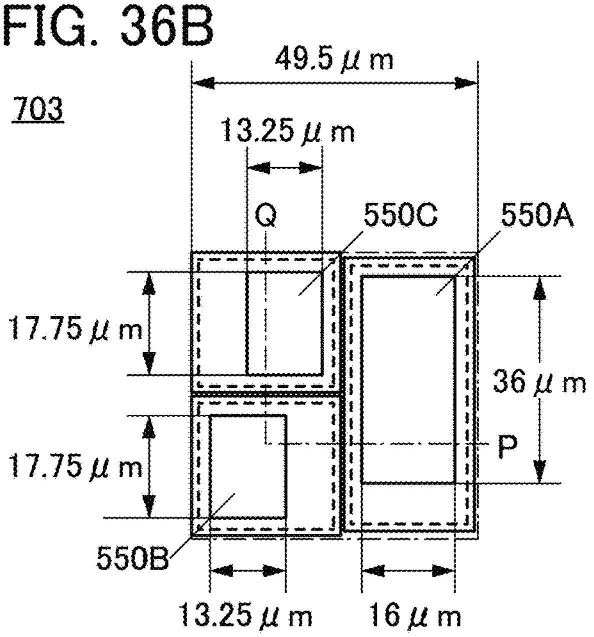
Figure 36C:
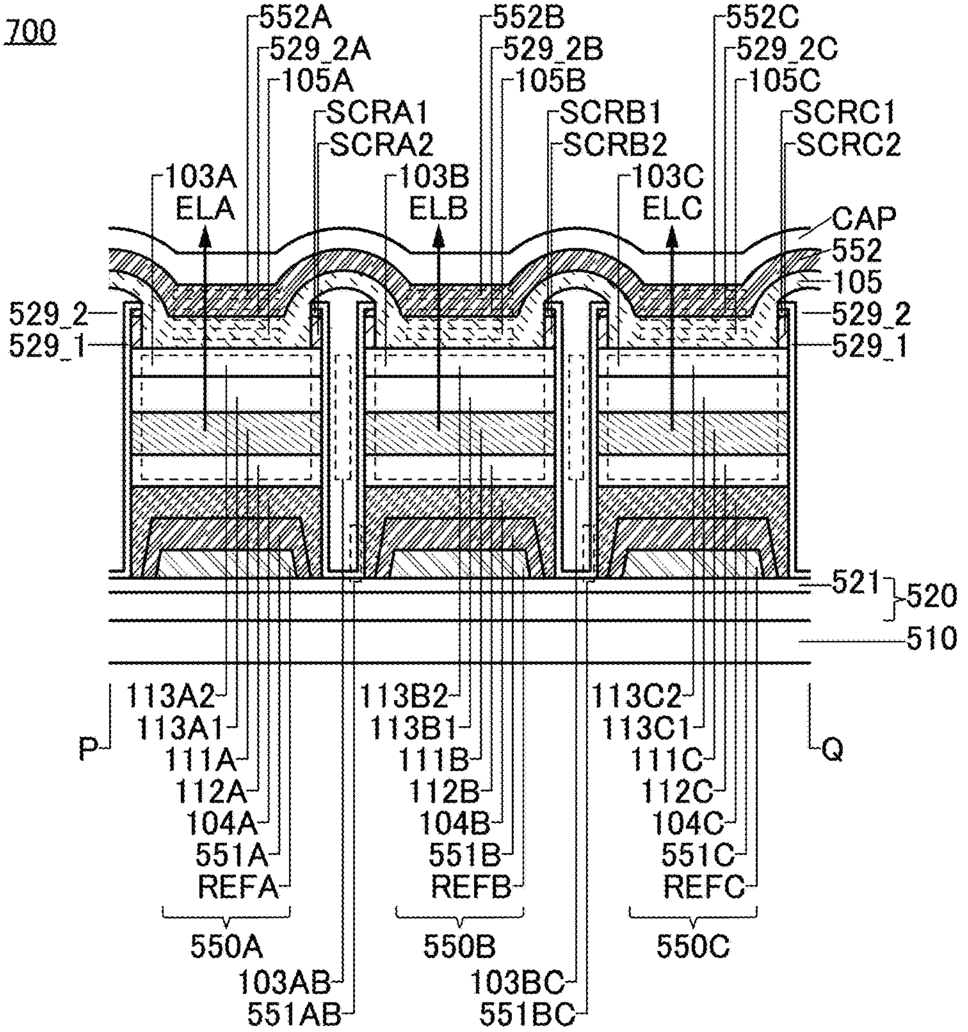

FIG. 36A illustrates a structure of the display apparatus 700. FIG. 36B illustrates part of FIG. 36A and FIG. 36C illustrates a cross section taken along a cutting line P-Q in FIG. 36B.

Figure 37:
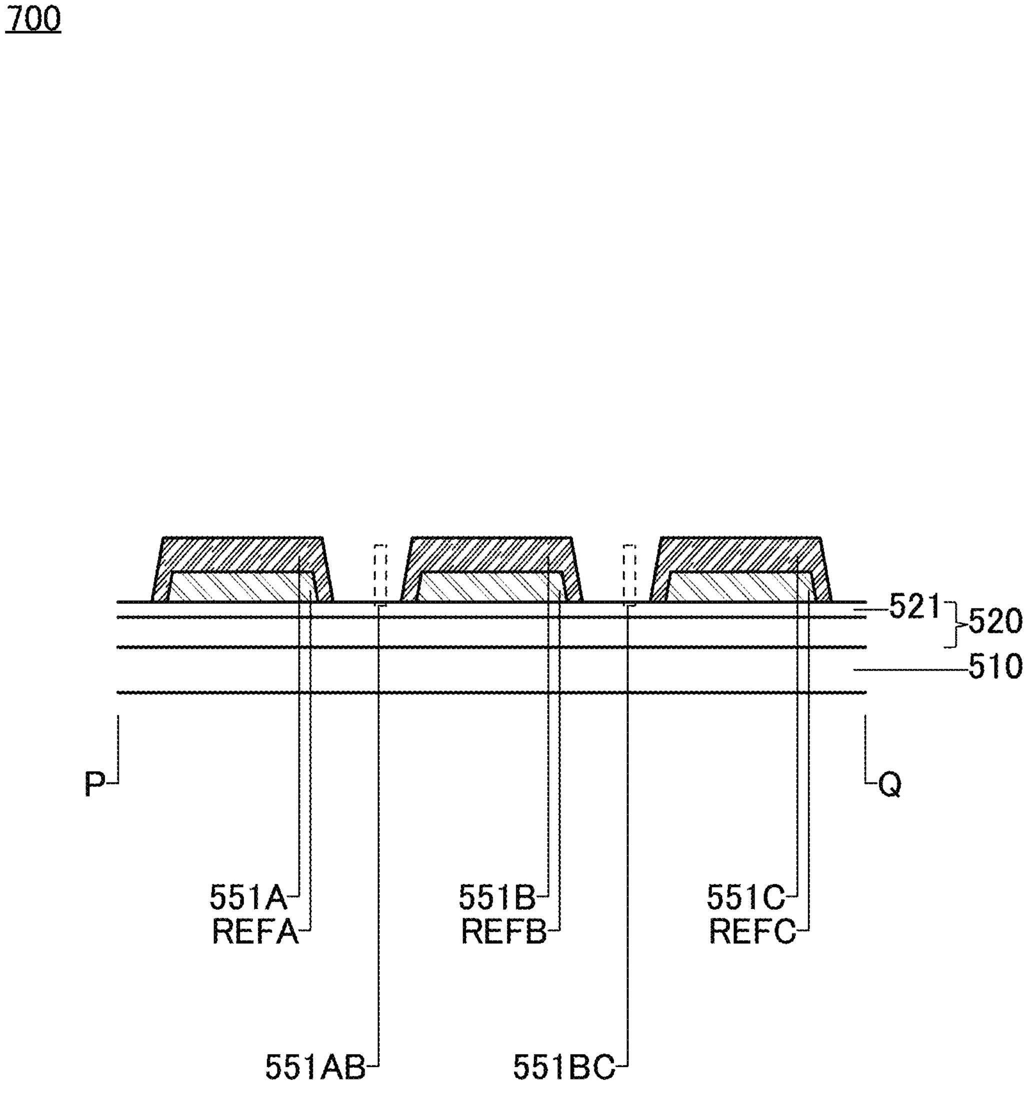
FIG. 37 illustrates a method for fabricating a display apparatus of an example.

FIG. 37 illustrates a fabrication method of the display apparatus.

Figure 38:
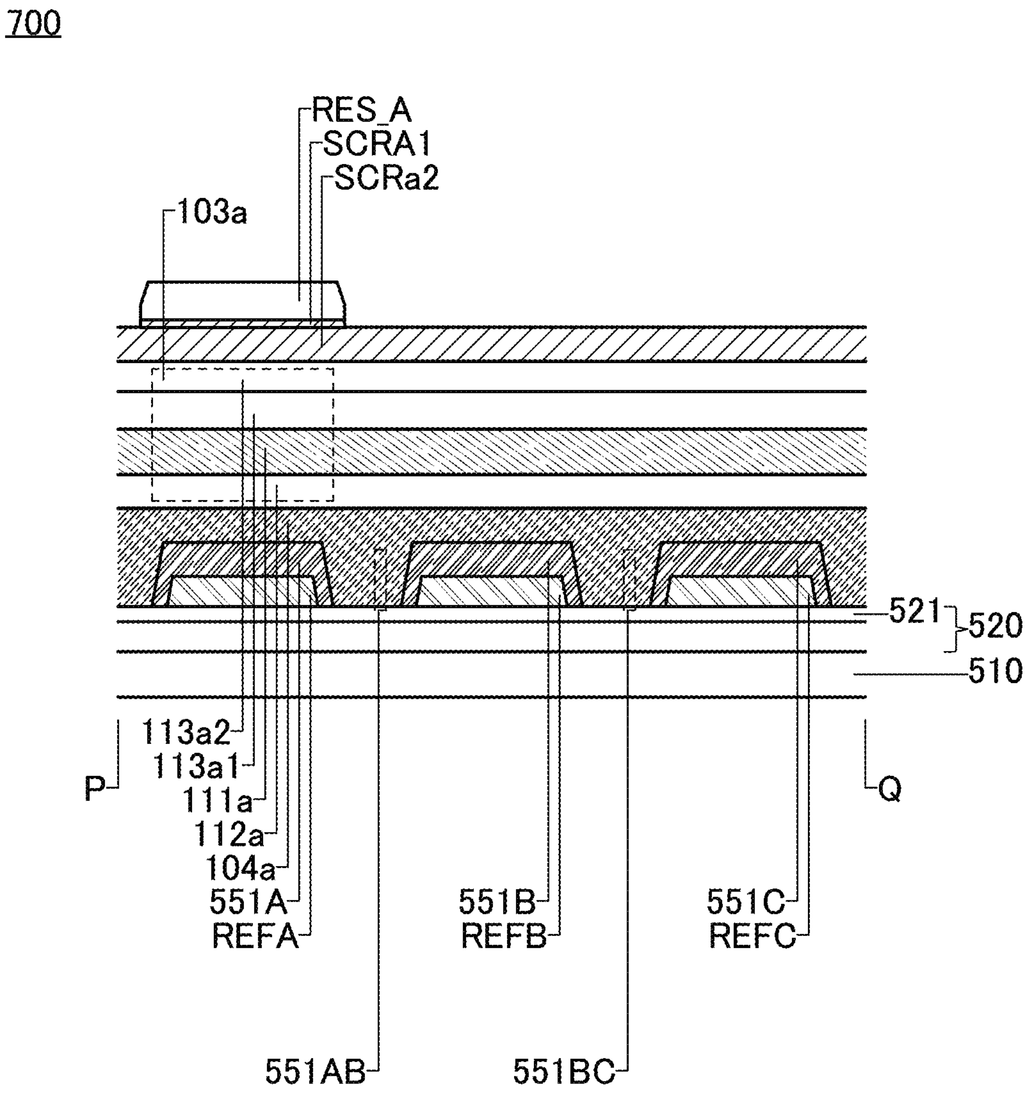
FIG. 38 illustrates a method for fabricating a display apparatus of an example.

FIG. 38 illustrates the fabrication method of the display apparatus.

Figure 39:
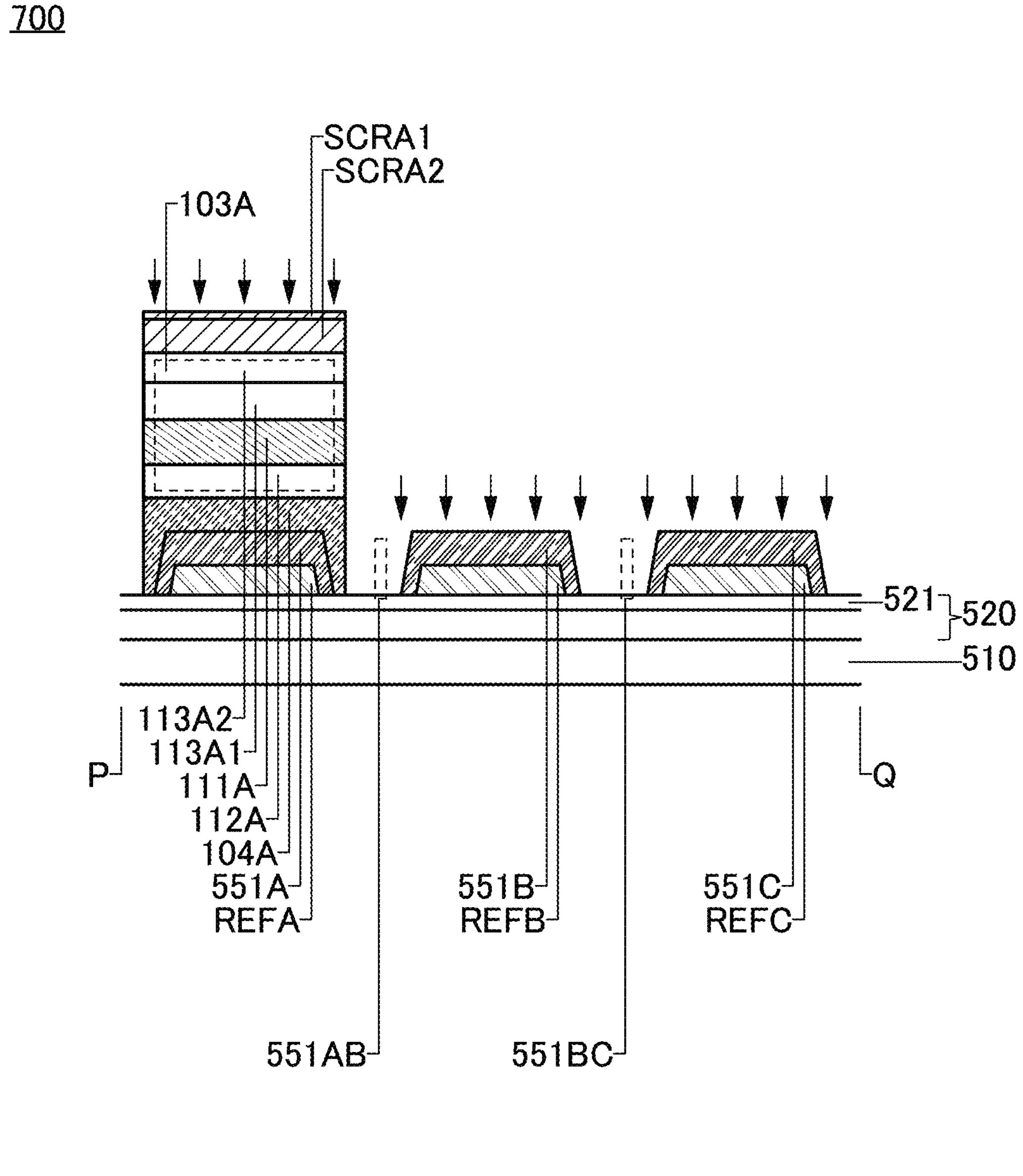
FIG. 39 illustrates a method for fabricating a display apparatus of an example.

FIG. 39 illustrates the fabrication method of the display apparatus.

Figure 40:
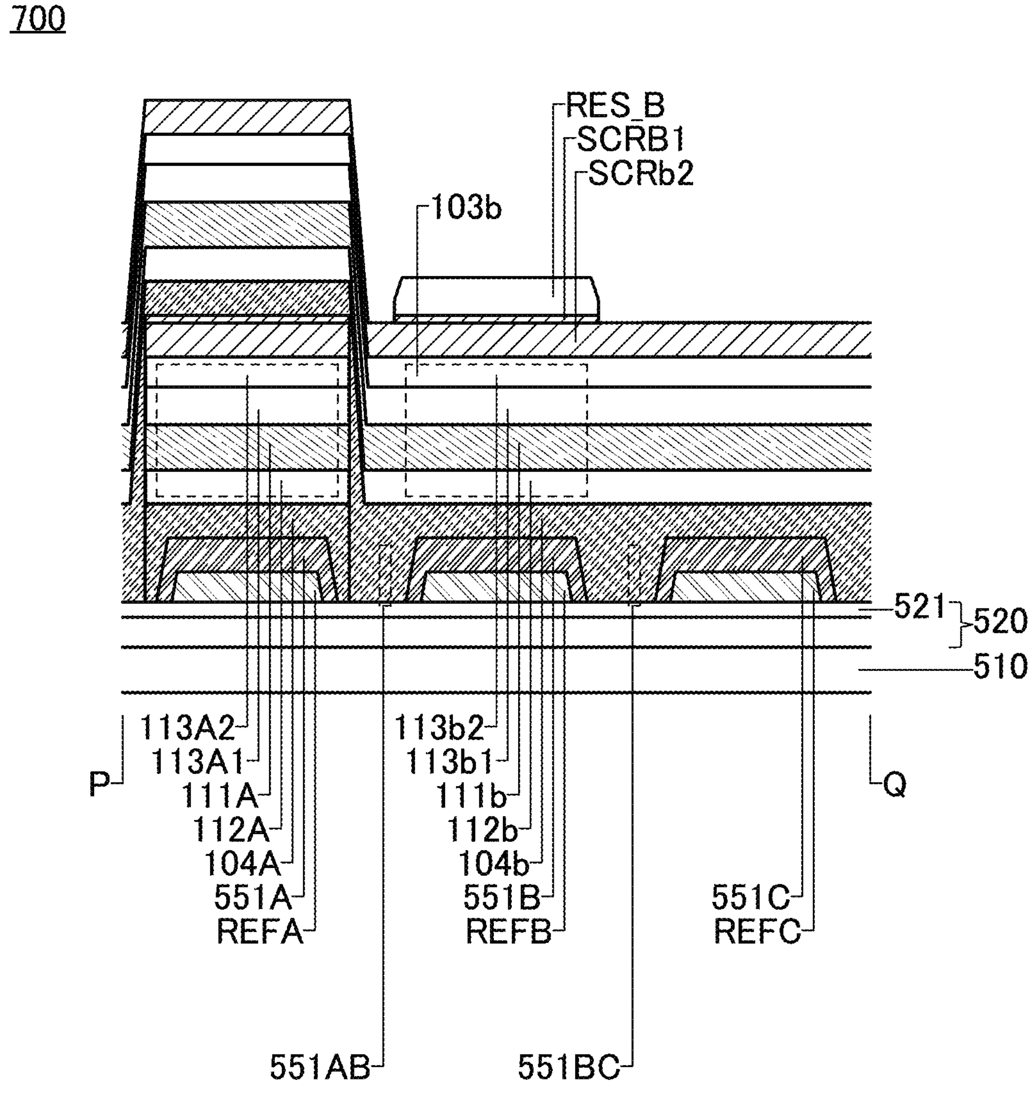
FIG. 40 illustrates a method for fabricating a display apparatus of an example.

FIG. 40 illustrates the fabrication method of the display apparatus.

Figure 41:
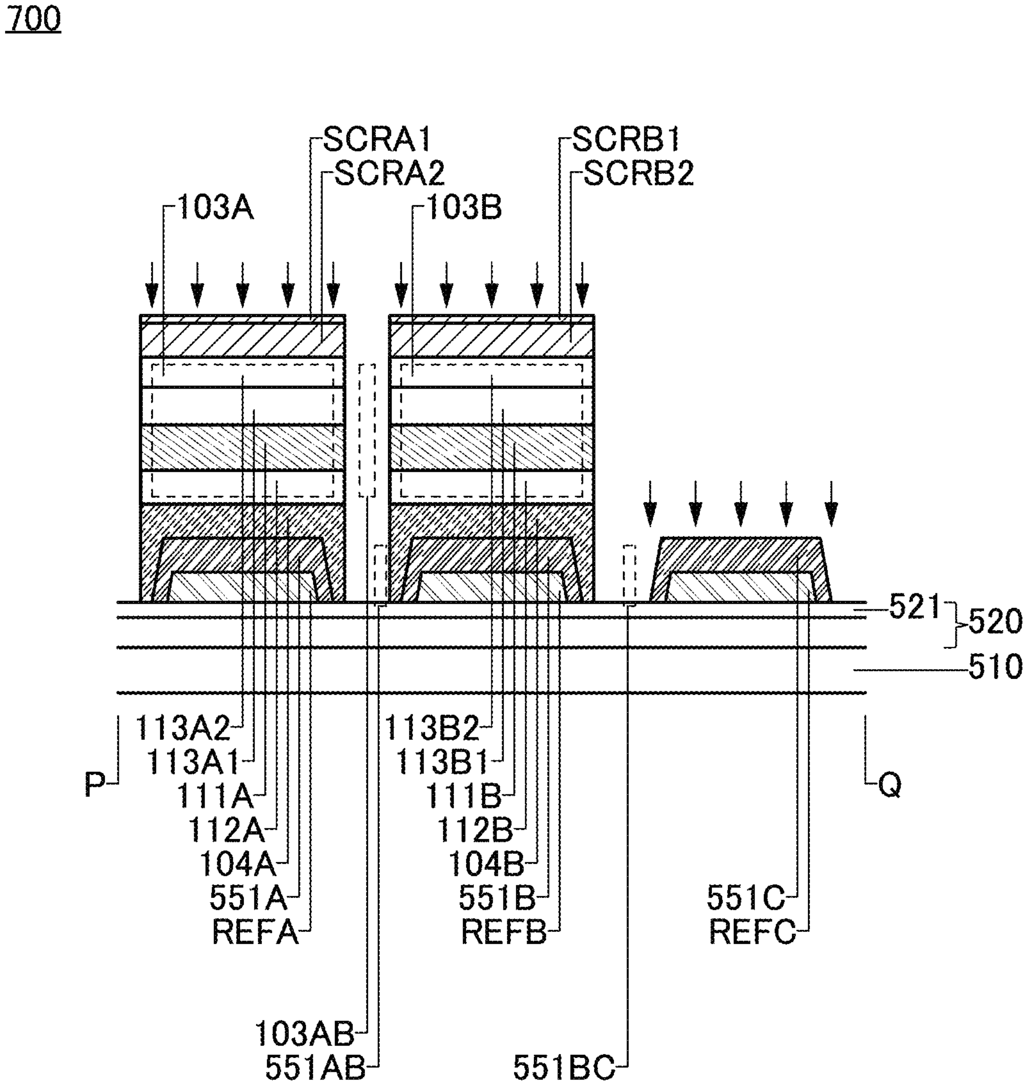
FIG. 41 illustrates a method for fabricating a display apparatus of an example.

FIG. 41 illustrates the fabrication method of the display apparatus.

Figure 42:
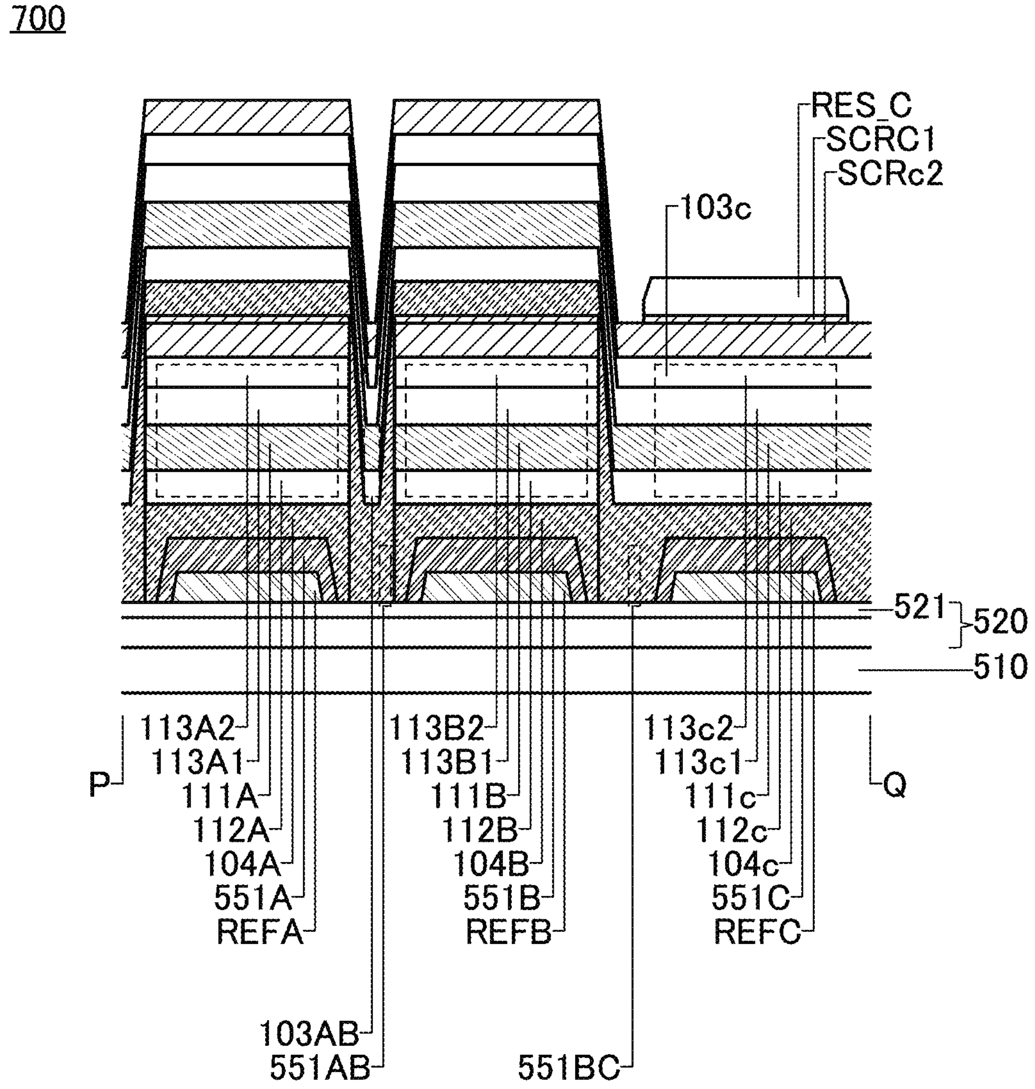
FIG. 42 illustrates a method for fabricating a display apparatus of an example.

FIG. 42 illustrates the fabrication method of the display apparatus.

Figure 43:
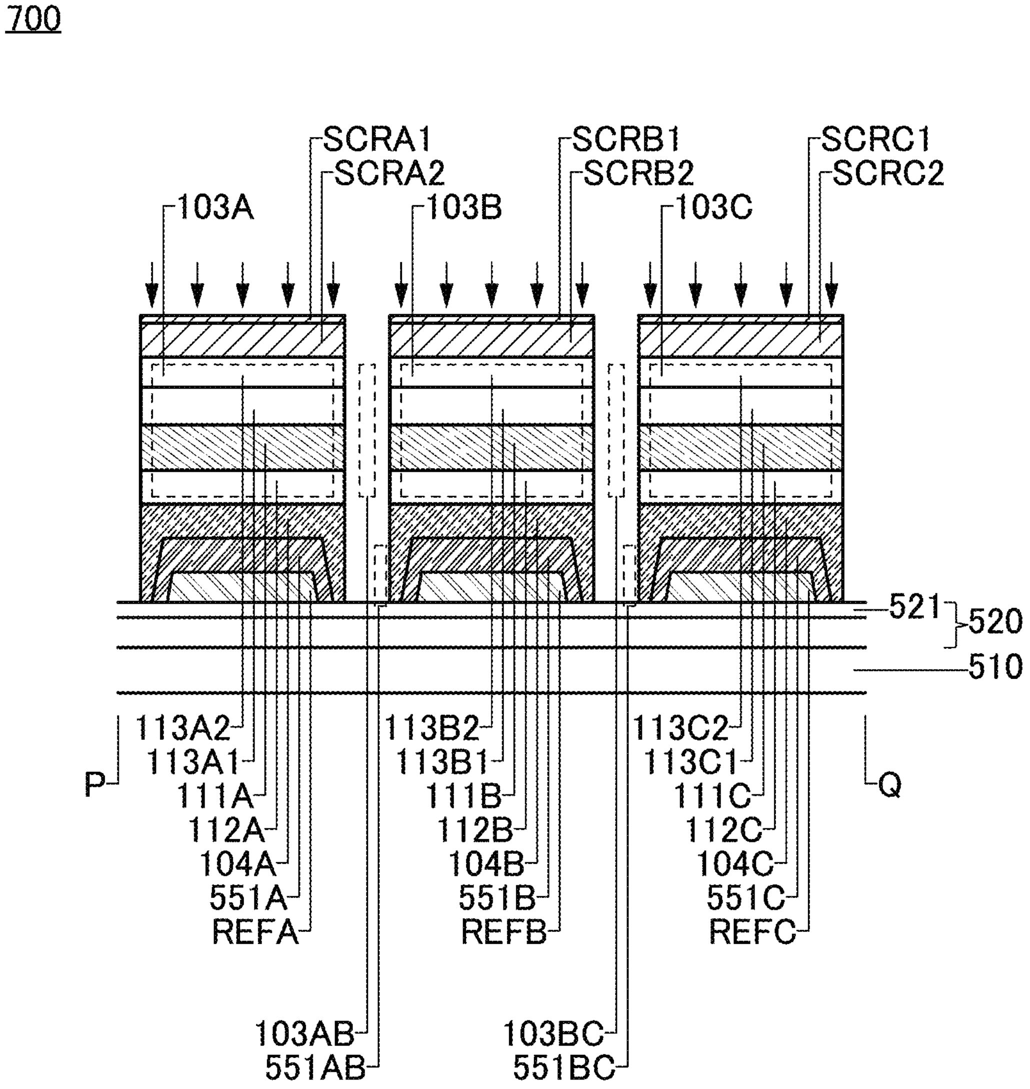
FIG. 43 illustrates a method for fabricating a display apparatus of an example.

FIG. 43 illustrates the fabrication method of the display apparatus.

Figure 44:
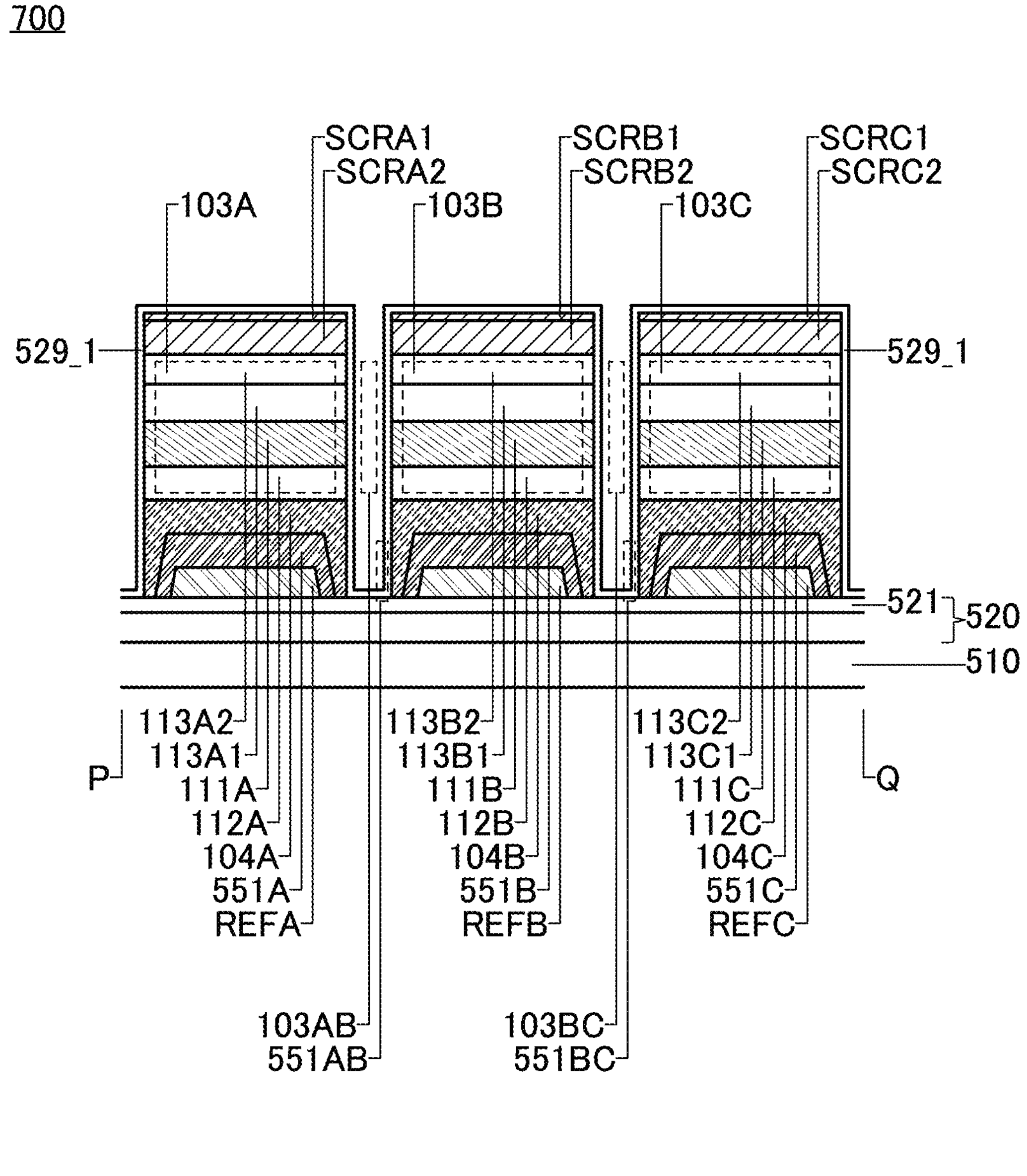
FIG. 44 illustrates a method for fabricating a display apparatus of an example.

FIG. 44 illustrates the fabrication method of the display apparatus.

Figure 45:
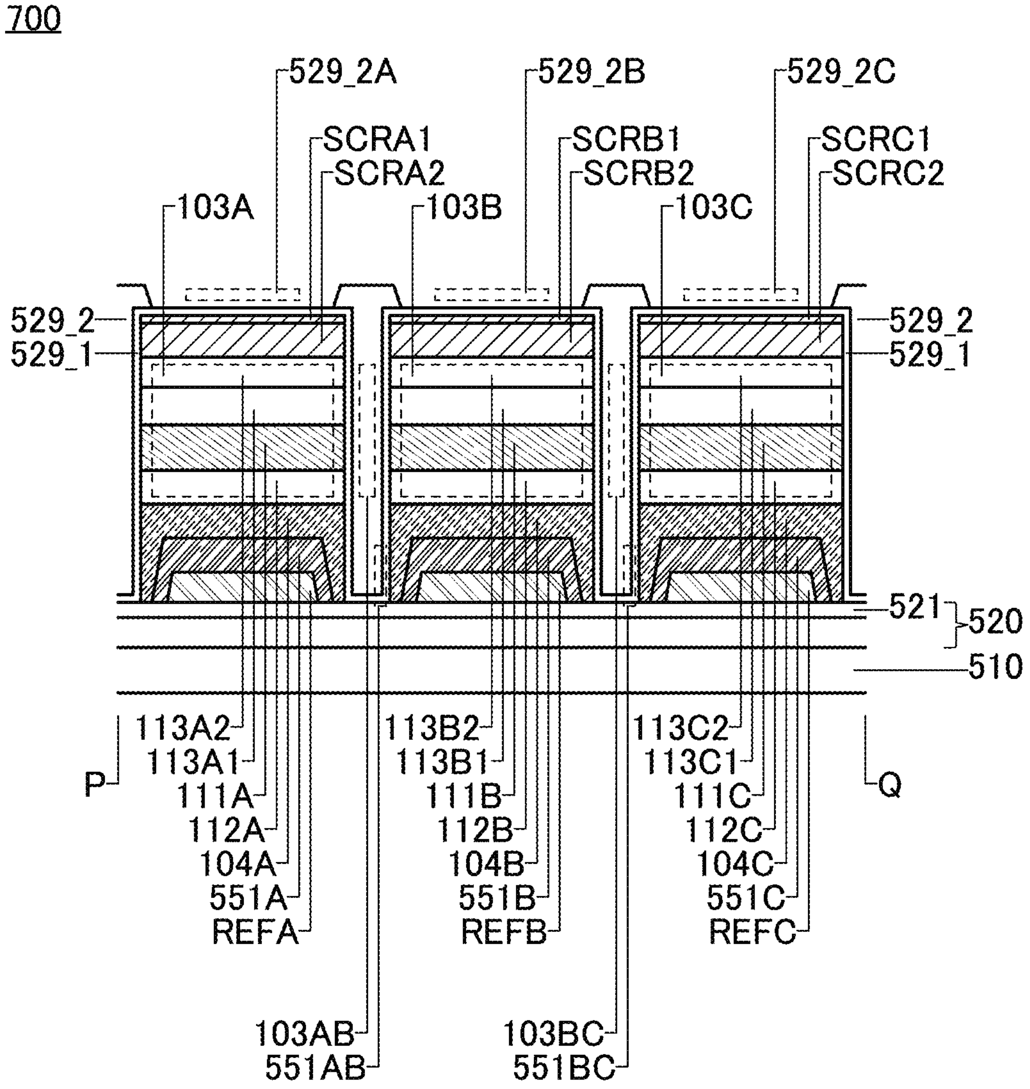
FIG. 45 illustrates a method for fabricating a display apparatus of an example.

FIG. 45 illustrates the fabrication method of the display apparatus.

Figure 46:
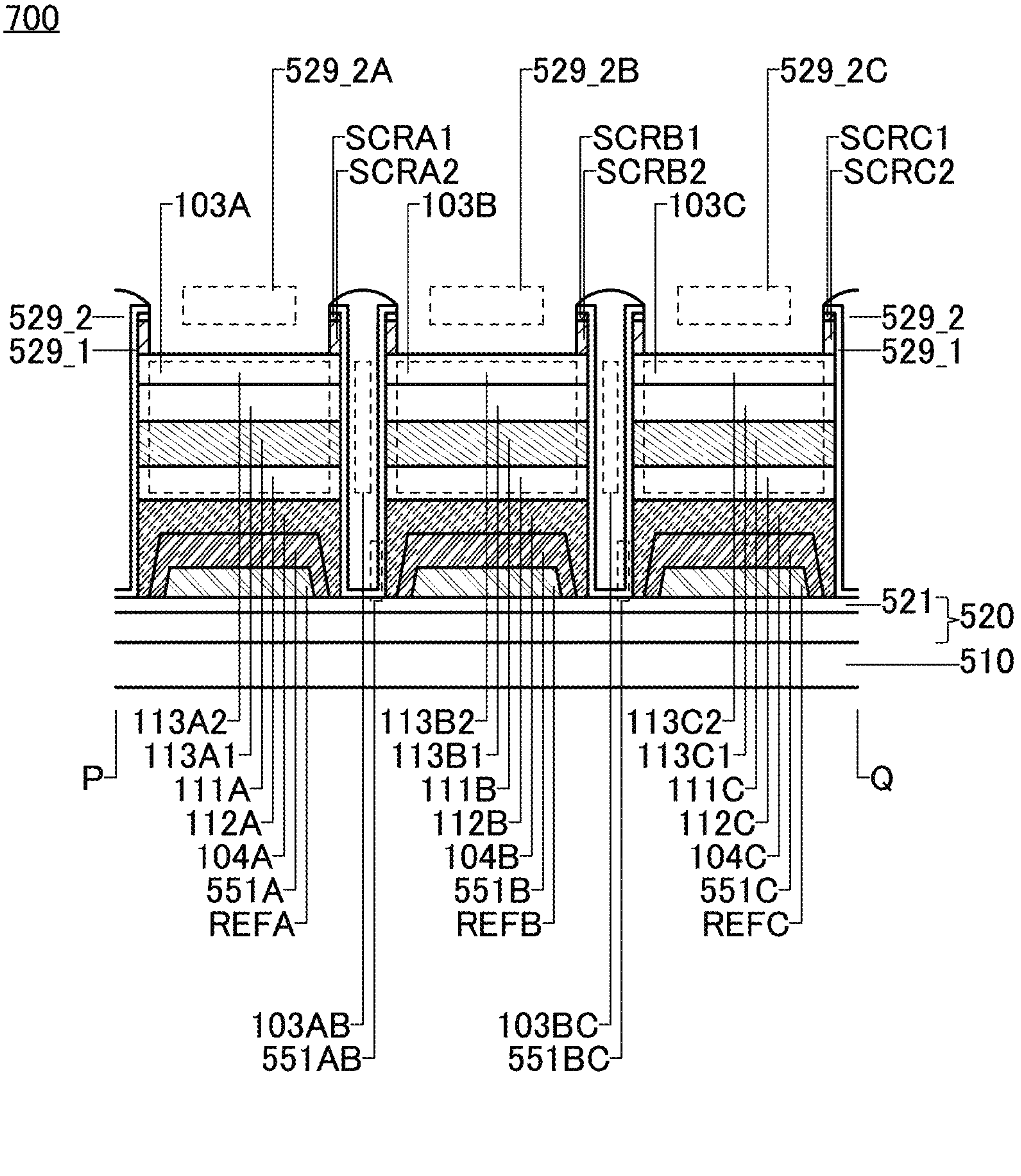
FIG. 46 illustrates a method for fabricating a display apparatus of an example.

FIG. 46 illustrates the fabrication method of the display apparatus.

Figure 47:
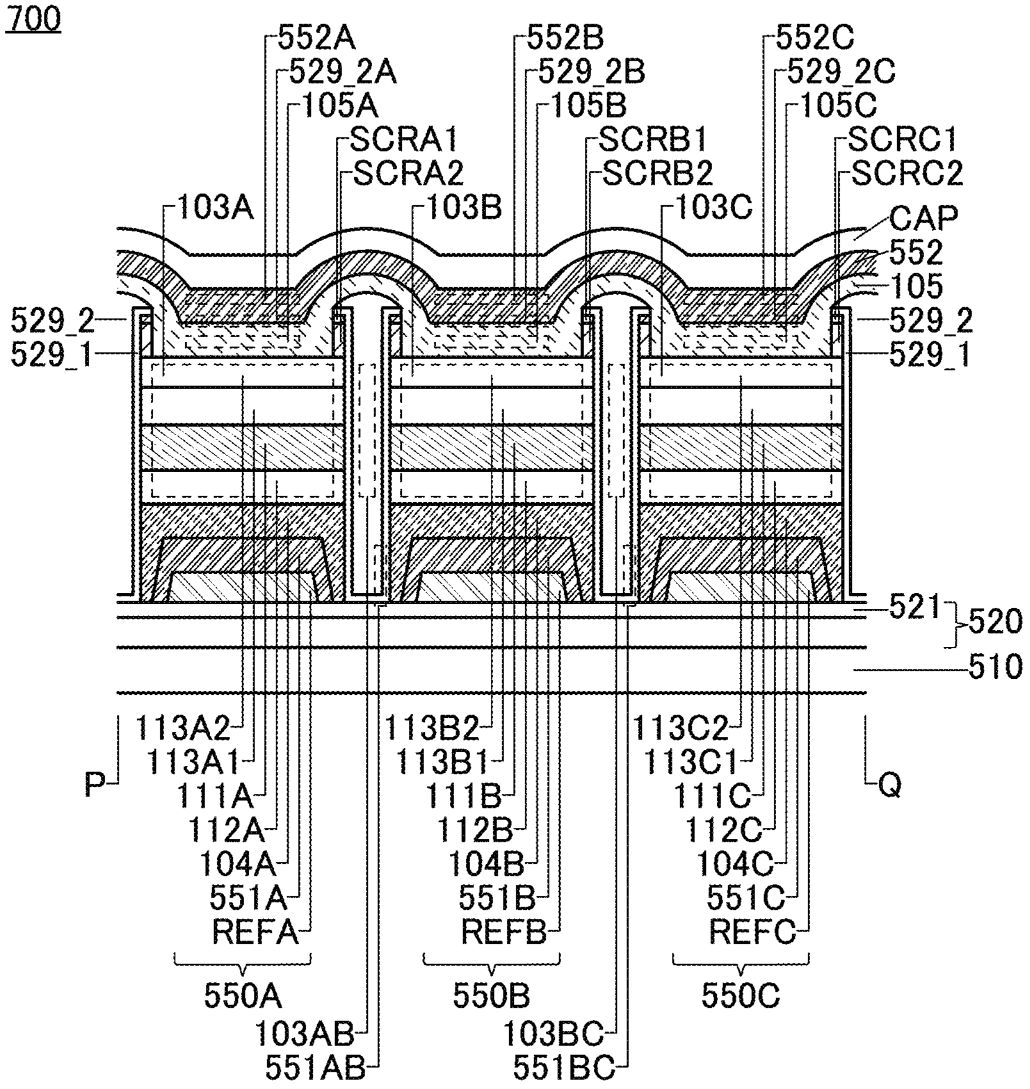
FIG. 47 illustrates a method for fabricating a display apparatus of an example.

FIG. 47 illustrates the fabrication method of the display apparatus.

Figure 48:
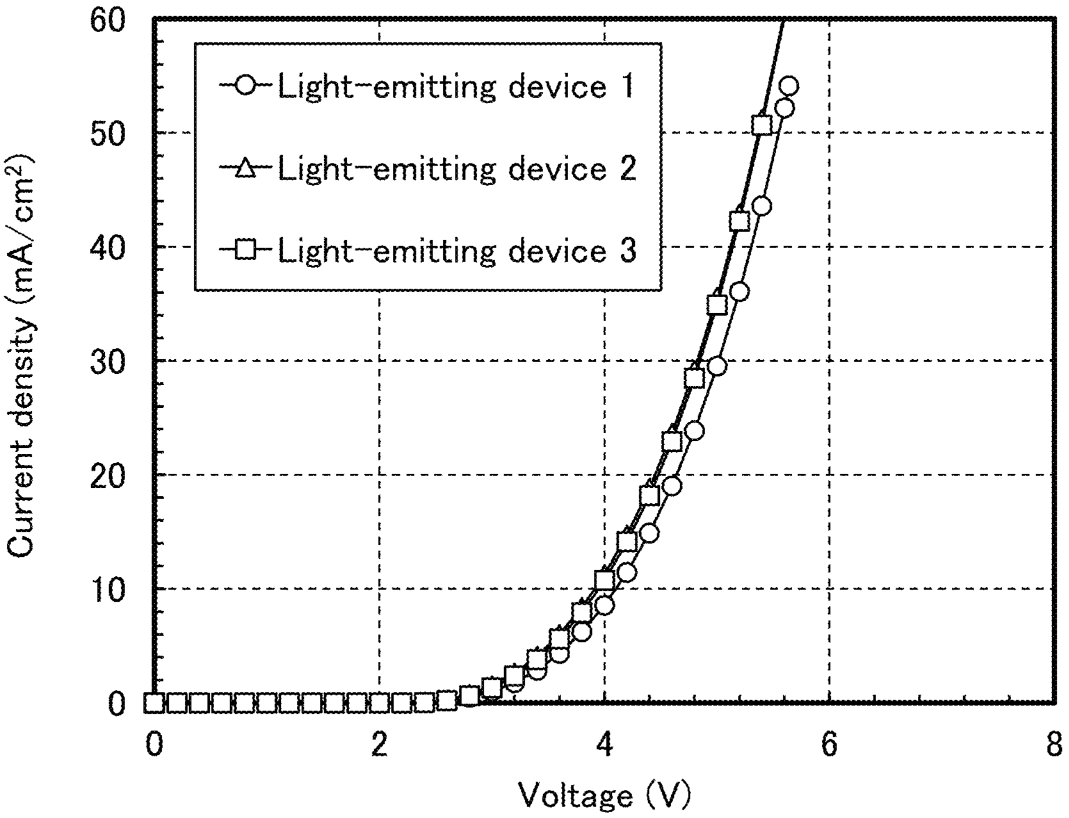
FIG. 48 shows voltage-current density characteristics of light-emitting devices of an example.

FIG. 48 shows voltage-current density characteristics of the light-emitting device 1, the light-emitting device 2, and the light-emitting device 3.

Figure 49:
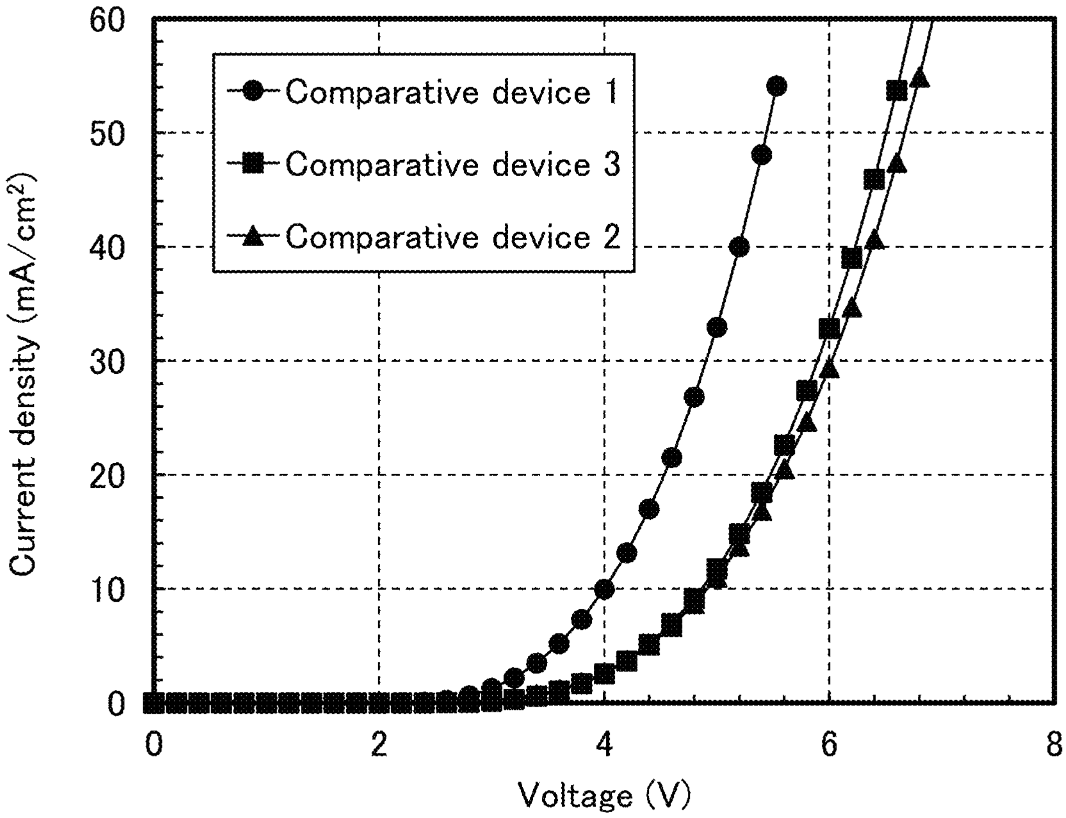
FIG. 49 shows voltage-current density characteristics of comparative devices of an example.

FIG. 49 shows voltage-current density characteristics of a comparative device 1, a comparative device 2, and a comparative device 3.

Figure 50A:
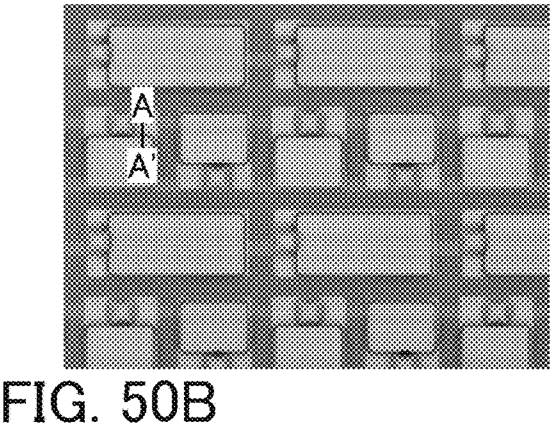
FIG. 50A is an optical micrograph showing a structure of a display apparatus of an example and FIGS. 50B and 50C are micrographs obtained using a scanning transmission electron microscope, each showing the structure of the display apparatus of the example.
Figure 50B:
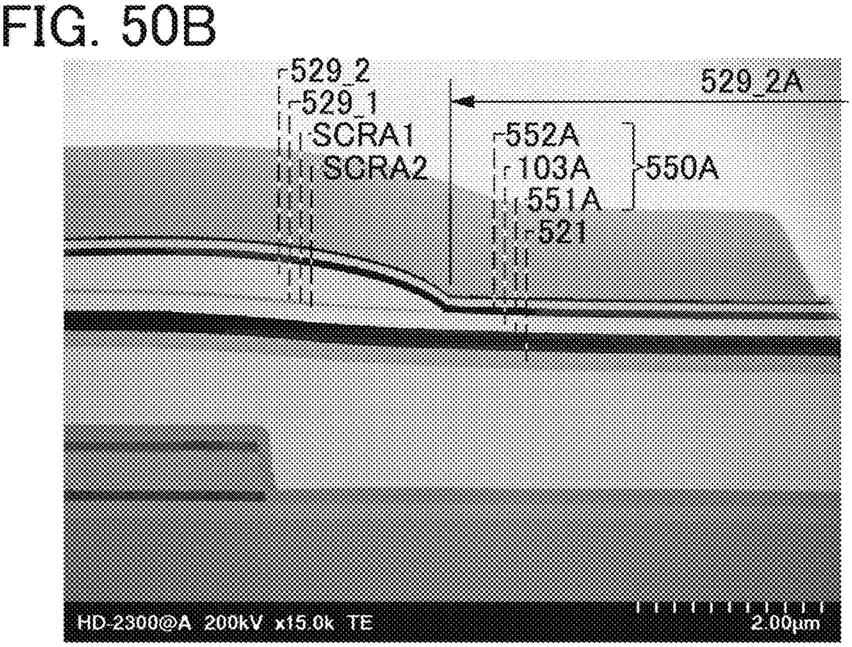
Figure 50C:
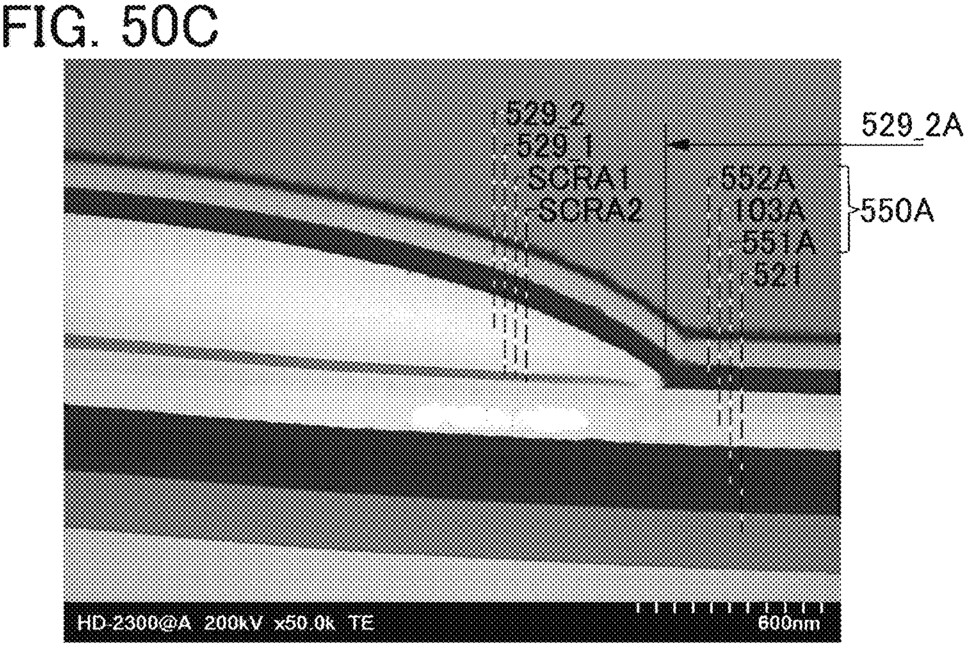

FIG. 50A is an optical micrograph showing a structure of a cross section of the fabricated display apparatus. FIGS. 50B and 50C are micrographs obtained using a scanning transmission electron microscope, each showing a cross section taken along a cutting line A-A' in FIG. 50A.

<Display Apparatus>

The fabricated display apparatus, which is described in this example, has a structure similar to that of the display apparatus 700 (see FIG. 36A). The display apparatus 700 includes the pixel set 703 including the light-emitting devices 550A, 550B, and 550C (see FIG. 36B). Note that the display apparatus 700 includes a plurality of pixel sets 703 arranged at a resolution of 500 ppi in a square region with a size of 2 mm×2 mm. That is, the display apparatus 700 includes the plurality of pixel sets 703 arranged longitudinally and horizontally at an approximately 49.5 μm pitch. The display apparatus 700 includes the substrate 510 and the functional layer 520, and the functional layer 520 includes the insulating film 521 (see FIG. 36C).

<Light-Emitting Device 1>

The fabricated light-emitting device 1, which is described in this example, has a structure similar to that of the light-emitting device 550A. Specifically, the light-emitting device 550A has a rectangular front surface with a size of approximately 16 μm×36 μm (see FIG. 36B). The light-emitting device 550A includes a reflective film REFA, the electrode 551A, the layer 104A, the layer 112A, the layer 111A, a layer 113A1, a layer 113A2, the layer 105A, the electrode 552A, and the layer CAP (see FIG. 36C).

<Light-Emitting Device 2>

The fabricated light-emitting device 2, which is described in this example, has a structure similar to that of the light-emitting device 550B. Specifically, the light-emitting device 550B has a rectangular front surface with a size of approximately 13.25 μm×17.75 μm (see FIG. 36B). The light-emitting device 550B includes a reflective film REFB, the electrode 551B, the layer 104B, the layer 112B, the layer 111B, a layer 113B1, a layer 113B2, the layer 105B, the electrode 552B, and the layer CAP (see FIG. 36C). Note that the gap 551AB is positioned between the electrode 551B and the electrode 551A.

<Light-Emitting Device 3>

The fabricated light-emitting device 3, which is described in this example, has a structure similar to that of the light-emitting device 550C. Specifically, the light-emitting device 550C has a rectangular front surface with a size of approximately 13.25 μm×17.75 μm (see FIG. 36B). The light-emitting device 550C includes a reflective film REFC, the electrode 551C, the layer 104C, the layer 112C, the layer 111C, a layer 113C1, a layer 113C2, the layer 105C, the electrode 552C, and the layer CAP (see FIG. 36C). Note that the gap 551BC is positioned between the electrode 551C and the electrode 551B.

<<Structure of Light-Emitting Device>>

In Table 1, "A", "B", and "C" of the reference numerals of the components of the light-emitting device are replaced with "X". Structural formulae of materials used in the light-emitting devices described in this example are shown below. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 1

| Components | Reference numerals | Materials | Composition ratio | Thickness/ nm |
|---|---|---|---|---|
| Layer | CAP | IGZO | | 70 |
| Electrode | 552X | Ag:Mg | 1:0.1 | 15 |
| Layer | 105X | LiF:Yb | 1:1 | 1 |
| Layer | 113X2 | mPPhen2P | | 10 |
| Layer | 113X1 | 2mPCCzPDBq | | 10 |
| Layer | 111X | 8mpTP-4mDBtPBfpm:βNCCP:Ir(5mppy-d3)2(mbfpypy-d3) | 0.6:0.4:0.1 | 42.4 |
| Layer | 112X | PCBBiF | | 98 |
| Layer | 104X | PCBBiF:OCHD-003 | 1:0.03 | 11.4 |
| Electrode | 551X | ITSO | | 50 |
| Reflective film | REF | APC | | 100 |

[Chemical Formulae 6]

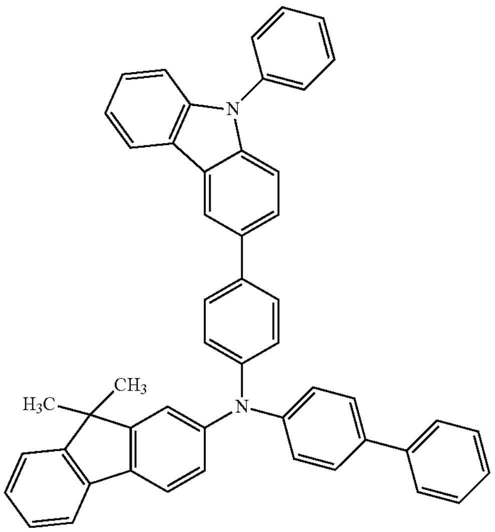

PCBBiF

-continued

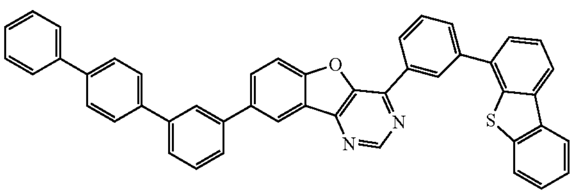

8mpTP-4mDBtPBfpm

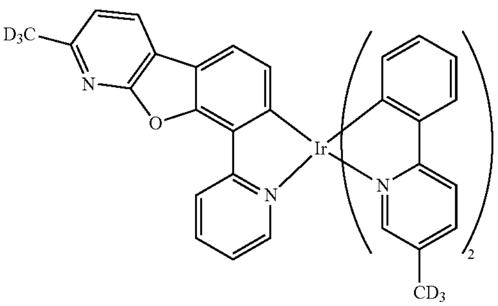

Ir(5mppy-d3)2(mbfpypy-d3)

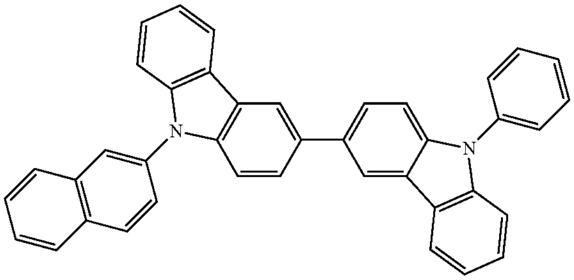

β NCCP

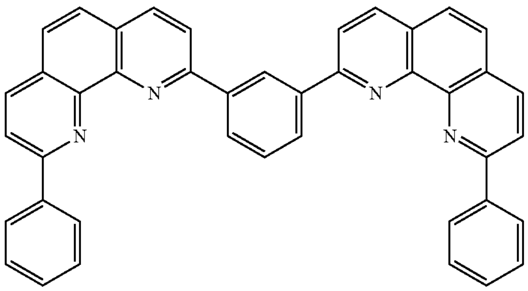

mPPhen2P

-continued

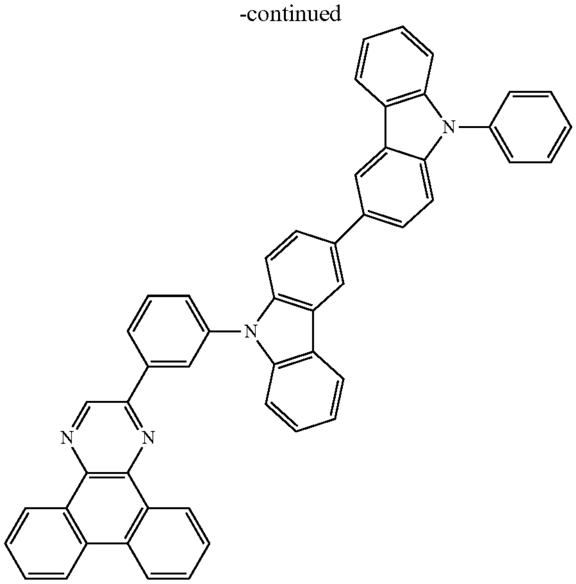

2mPCCzPDBq

<<Method for Fabricating Display Apparatus>>

The display apparatus described in this example was fabricated using a method including the following steps.

[Step 1-1]

In Step 1-1, a reflective film was formed over the insulating film 521. Specifically, the reflective film was formed by a sputtering method using an alloy containing silver (Ag), palladium (Pd), and copper (Cu) (abbreviation: APC) as a target. The reflective film contains APC and has a thickness of 100 nm.

[Step 1-2]

In Step 1-2, the reflective films REFA, REFB, and REFC were formed by a photolithography method.

[Step 2-1]

In Step 2-1, a conductive film was formed over the reflective films REFA, REFB, and REFC. Specifically, the conductive film was formed by a sputtering method using indium oxide-tin oxide containing silicon or silicon oxide (abbreviation: ITSO) as a target. The conductive film contains ITSO and has a thickness of 50 nm.

[Step 2-2]

In Step 2-2, the electrodes 551A, 551B, and 551C were formed by a photolithography method. The gap 551AB was formed between the electrode 551A and the electrode 551B, and the gap 551BC was formed between the electrode 551B and the electrode 551C (see FIG. 37). Note that the electrodes 551A, 551B, and 551C cover the reflective films REFA, REFB, and REFC, respectively.

[Step 2-3]

In Step 2-3, a workpiece provided with the electrode was washed with water and then transferred into a vacuum evaporation apparatus. After that, the pressure in the vacuum evaporation apparatus was reduced to approximately $10^{-4}$ Pa, and vacuum baking was performed at 200° C. for 2.78 hours in a heating chamber of the vacuum evaporation apparatus. Then, the workpiece was cooled down for approximately 30 minutes.

[Step 3]

In Step 3, the film 104*a* was formed over the electrodes 551A, 551B, and 551C. Specifically, materials of the film 104*a* were co-deposited by a resistance-heating method. The film 104*a* contains N-(biphenyl-4-yl)-N-[4-(9-phenyl-9H-carbazol-3-yl)phenyl]-9,9-dimethyl-9H-fluoren-2-amine (abbreviation: PCBBiF) and an electron-accepting material (OCHD-003) at 1:0.03 in a weight ratio and has a thickness of 11.4 nm. Note that OCHD-003 contains fluorine, and has a molecular weight of 672.

[Step 4]

In Step 4, the film 112*a* was formed over the film 104*a*. Specifically, a material of the film 112*a* was deposited by a resistance-heating method. The film 112*a* contains PCBBiF and has a thickness of 98 nm.

[Step 5]

In Step 5, the film 111*a* was formed over the film 112*a*. Specifically, materials of the film 111*a* were co-deposited by a resistance-heating method. The film 111*a* contains 8-(1,1':4',1"-terphenyl-3-yl)-4-[3-(dibenzothiophen-4-yl)phenyl]-[1]benzofuro[3,2-d]pyrimidine (abbreviation: 8mpTP-4mDBtPBfpm), 9-(2-naphthyl)-9'-phenyl-9H,9'H-3,3'-bicarbazole (abbreviation: βNCCP), and [2-d3-methyl-8-(2-pyridinyl-κN)benzofuro[2,3-b]pyridine-κC]bis[2-(5-d3-methyl-2-pyridinyl-κ$N^2$)phenyl-KC]iridium(III) (abbreviation: Ir(5mppy-$d_3$)$_2$(mbfpypy-$d_3$)) at 0.6:0.4:0.1 in a weight ratio and has a thickness of 42.4 nm.

[Step 6]

In Step 6, a film 113*a*1 was formed over the film 111*a*. Specifically, a material of the film 113*a*1 was deposited by a resistance-heating method. The film 113*a*1 contains 2-{3-[3-(N-phenyl-9H-carbazol-3-yl)-9H-carbazol-9-yl]phenyl}dibenzo[f,h]quinoxaline (abbreviation: 2mPCCzPDBq) and has a thickness of nm.

[Step 7]

In Step 7, a film 113*a*2 was formed over the film 113*a*1. Specifically, a material of the film 113*a*2 was deposited by a resistance-heating method. The film 113*a*2 contains 2,2'-(1,3-phenylene)bis(9-phenyl-1,10-phenanthroline) (abbreviation: mPPhen2P) and has a thickness of 10 nm.

[Step 8-1]

In Step 8-1, the film SCRa2 was formed over the film 113*a*2. Specifically, a material of the film SCRa2 was deposited by a resistance-heating method. The film SCRa2 contains tris(8-quinolinolato)aluminum(III) (abbreviation: $Alq_3$) and has a thickness of 10 nm.

[Step 8-2]

In Step 8-2, a stacked-layer film was formed over the film SCRa2. The stacked-layer film includes an insulating film over the film SCRa2 and a metal film over the insulating film. Specifically, the workpiece provided with components up to the film SCRa2 was taken out from a vacuum evaporation apparatus and then transferred into an ALD deposition apparatus, and a material was deposited by an ALD method. Note that the insulating film contains aluminum oxide (abbreviation: $AlO_x$) and has a thickness of nm. In addition, the workpiece provided with the insulating film was taken out from the ALD deposition apparatus and then transferred into a sputtering apparatus, and a material was deposited by a sputtering method. The metal film contains molybdenum (Mo) and has a thickness of 50 nm.

[Step 8-3]

In Step 8-3, the stacked-layer film was processed into a predetermined shape to form the layer SCRA1 (see FIG. 38). Specifically, unnecessary portions were removed by an etching method using the resist RES_A.

First, the resist RES_A was formed using a photosensitive polymer. The resist RES_A overlaps with the electrode 551A. Then, an unnecessary portion of the metal film containing Mo was removed by a dry etching method using the resist RES_A. Specifically, the metal film containing Mo was processed using a gas containing $CF_4$, oxygen, and helium as an etching gas. Then, the resist RES_A was removed using a solution containing tetramethyl ammonium hydroxide (abbreviation: TMAH).

Next, an unnecessary portion of the insulating film containing $AlO_x$ was removed by a dry etching method using the metal film containing Mo. Specifically, the insulating film containing $AlO_x$ was processed using a gas containing trifluoromethane (abbreviation: $CHF_3$) and helium (He) as an etching gas. Note that the metal film containing Mo functions as a hard mask.

[Step 8-4]

In Step 8-4, the films SCRa2, 113*a*2, 113*a*1, 111*a*, 112*a*, and 104*a* were processed into predetermined shapes (see FIG. 39). Specifically, unnecessary portions were removed by a dry etching method using the layer SCRA1. Note that the layer SCRA1 functions as a hard mask and an oxygen-containing gas was used as an etching gas. The layers 104A, 112A, 111A, 113A1, 113A2, and SCRA2 overlap with the electrode 551A.

After Step 8-1 to Step 8-4, the electrode 551A, the layer 113A2, and the components therebetween in the light-emitting device are formed on the workpiece, the layer SCRA2 is formed over the layer 113A2, and the layer SCRA1 is formed over the layer SCRA2.

Furthermore, the electrodes 551B and 551C are exposed. The electrodes 551B and 551C are exposed to an etching gas used in a dry etching method. The properties of surfaces of the electrodes 551B and 551C are different from those of the surface of the electrode 551A.

Note that a workpiece provided with some components of a light-emitting device and one or more exposed electrodes can be referred to as work in process. In the case where an electrode is exposed on work in process, another light-emitting device can be formed over the electrode.

[Step 9]

In Step 9, surfaces of the exposed electrodes were removed by an etching method to expose new surfaces. Specifically, a region from the surface of each electrode to a depth of approximately 8 nm was removed by an etching method using an aqueous solution containing oxalic acid. The etching makes the thickness of each of the electrodes 551B and 551C smaller than that of the electrode 551A.

Then, the workpiece was transferred into a vacuum evaporation apparatus, the pressure in the apparatus was reduced to approximately $10^{-4}$ Pa, and vacuum baking was performed at 80° C. for 2.78 hours in a heating chamber of the vacuum evaporation apparatus. Then, the workpiece was cooled down for approximately 30 minutes.

[Step 10]

In Step 10, the film 104*b* was formed over the electrodes 551A, 551B, and 551C. Specifically, treatment similar to that in Step 3 was performed. Note that the description of Step 3 can be used for the description of Step 10 by replacing "a" in the reference numerals with "b".

[Step 11]

In Step 11, the film 112*b* was formed over the film 104*b*. Specifically, treatment similar to that in Step 4 was performed. Note that the description of Step 4 can be used for the description of Step 11 by replacing "a" in the reference numerals with "b".

[Step 12]

In Step 12, the film 111*b* was formed over the film 112*b*. Specifically, treatment similar to that in Step 5 was performed. Note that the description of Step 5 can be used for the description of Step 12 by replacing "a" in the reference numerals with "b".

[Step 13]

In Step 13, a film **113*b*1 was formed over the film 111*b*. Specifically, treatment similar to that in Step 6 was performed. Note that the description of Step 6 can be used for the description of Step 13** by replacing "a" in the reference numerals with "b".

[Step 14]

In Step 14, a film **113*b*2 was formed over the film 113*b*1. Specifically, treatment similar to that in Step 7 was performed. Note that the description of Step 7 can be used for the description of Step 14** by replacing "a" in the reference numerals with "b".

[Step 15-1]

In Step 15-1, the film SCRb2 was formed over the film **113*b*2. Specifically, treatment similar to that in Step 8-1 was performed. Note that the description of Step 8-1 can be used for the description of Step 15-1** by replacing "a" in the reference numerals with "b".

[Step 15-2]

In Step 15-2, a stacked-layer film was formed over the film SCRb2. Specifically, treatment similar to that in Step 8-2 was performed. Note that the description of Step 8-2 can be used for the description of Step 15-2 by replacing "a" in the reference numerals with "b".

[Step 15-3]

In Step 15-3, the stacked-layer film was processed into a predetermined shape to form the layer SCRB1 (see FIG. 40). Specifically, treatment similar to that in Step 8-3 was performed. Note that the description of Step 8-3 can be used for the description of Step 15-3 by replacing "A" in the reference numerals with "B".

[Step 15-4]

In Step 15-4, the films SCRb2, **113*b*2, 113*b*1, 111*b*, 112*b*, and 104*b* were processed into predetermined shapes (see FIG. 41). Specifically, treatment similar to that in Step 8-4 was performed. Note that the description of Step 8-4 can be used for the description of Step 15-4** by replacing "a" in the reference numerals with "b" and replacing "A" in the reference numerals with "B".

After Step 15-1 to Step 15-4, the electrode 551B, the layer 113B2, and the components therebetween in the light-emitting device are formed on the workpiece, the layer SCRB2 is formed over the layer 113B2, and the layer SCRB1 is formed over the layer SCRB2.

Furthermore, the electrode 551C is exposed. The electrode 551C is exposed to an etching gas used in a dry etching method. The properties of the surface of the electrode 551C are different from those of the surface of the electrode 551A or the electrode 551B.

[Step 16]

In Step 16, the surface of the exposed electrode was removed by an etching method to expose a new surface. Specifically, a region from the surface of the electrode to a depth of approximately 8 nm was removed by an etching method using an aqueous solution containing oxalic acid. The etching makes the thickness of the electrode 551C smaller than those of the electrodes 551A and 551B.

Then, the workpiece was transferred into a vacuum evaporation apparatus, the pressure in the apparatus was reduced to approximately $10^{-4}$ Pa, and vacuum baking was performed at 80° C. for 2.78 hours in a heating chamber of the vacuum evaporation apparatus. Then, the workpiece was cooled down for approximately 30 minutes.

[Step 17]

In Step 17, the film **104*c* was formed over the electrodes 551A, 551B, and 551C. Specifically, treatment similar to that in Step 3 was performed. Note that the description of Step 3 can be used for the description of Step 17** by replacing "a" in the reference numerals with "c".

[Step 18]

In Step 18, the film **112*c* was formed over the film 104*c*. Specifically, treatment similar to that in Step 4 was performed. Note that the description of Step 4 can be used for the description of Step 18** by replacing "a" in the reference numerals with "c".

[Step 19]

In Step 19, the film **111*c* was formed over the film 112*c*. Specifically, treatment similar to that in Step 5 was performed. Note that the description of Step 5 can be used for the description of Step 19** by replacing "a" in the reference numerals with "c".

[Step 20]

In Step 20, a film **113*c*1 was formed over the film 111*c*. Specifically, treatment similar to that in Step 6 was performed. Note that the description of Step 6 can be used for the description of Step 20** by replacing "a" in the reference numerals with "c".

[Step 21]

In Step 21, a film **113*c*2 was formed over the film 113*c*1. Specifically, treatment similar to that in Step 7 was performed. Note that the description of Step 7 can be used for the description of Step 21** by replacing "a" in the reference numerals with "c".

[Step 22-1]

In Step 22-1, the film SCRc2 was formed over the film **113*c*2. Specifically, treatment similar to that in Step 8-1 was performed. Note that the description of Step 8-1 can be used for the description of Step 22-1** by replacing "a" in the reference numerals with "c".

[Step 22-2]

In Step 22-2, a stacked-layer film was formed over the film SCRc2.

Specifically, treatment similar to that in Step 8-2 was performed. Note that the description of Step 8-2 can be used for the description of Step 22-2 by replacing "a" in the reference numerals with "c".

[Step 22-3]

In Step 22-3, the stacked-layer film was processed into a predetermined shape to form the layer SCRC1 (see FIG. 42). Specifically, treatment similar to that in Step 8-3 was performed. Note that the description of Step 8-3 can be used for the description of Step 22-3 by replacing "A" in the reference numerals with "C".

[Step 22-4]

In Step 22-4, the films SCRc2, **113*c*2, 113*c*1, 111*c*, 112*c*, and 104*c* were processed into predetermined shapes (see FIG. 43). Specifically, treatment similar to that in Step 8-4 was performed. Note that the description of Step 8-4 can be used for the description of Step 22-4** by replacing "a" in the reference numerals with "c" and replacing "A" in the reference numerals with "C".

After Step 22-1 to Step 22-4, the electrode 551C, the layer 113C2, and the components therebetween in the light-emitting device are formed on the workpiece, the layer SCRC2 is formed over the layer 113C2, and the layer SCRC1 is formed over the layer SCRC2.

[Step 23]

In Step 23, the metal film containing Mo was removed from the layers SCRA1, SCRB1, and SCRC1 and the insulating film containing Ala, was left. Specifically, a dry etching method using a gas containing $CF_4$, oxygen, and helium was employed.

[Step 24]

In Step 24, the layer 529_1 was formed over the layers SCRA1, SCRB1, and SCRC1 (see FIG. 44). Specifically, the workpiece was transferred into an ALD deposition apparatus and a material was deposited by an ALD method. Note that the layer 529_1 contains Ala, and has a thickness of 15 nm.

[Step 25]

In Step 25, the layer 529_2 was formed over the layer 529_1 (see FIG. 45). Specifically, a photosensitive polymer and a photolithography method were used. Note that the layer 529_2 fills the gaps 551AB and 551BC and has the openings 529_2A, 529_2B, and 529_2C.

The workpiece was heated to process the layer 529_2 into a predetermined shape. Specifically, the workpiece was heated in an air atmosphere at 100° C. for one hour so that top and side surfaces of the layer 529_2 were continuously curved. [Step 26]

In Step 26, the layers 529_1, SCRA1, SCRB1, SCRC1, SCRA2, SCRB2, and SCRC2 were processed into predetermined shapes (see FIG. 46). Specifically, unnecessary portions are removed by an etching method using an aqueous solution containing hydrofluoric acid (HF) to expose the layers 113A2, 113B2, and 113C2. Note that the layer 529_2 functions as a resist.

Then, the workpiece was transferred into a vacuum evaporation apparatus, the pressure in the apparatus was reduced to approximately $10^{-4}$ Pa, and vacuum baking was performed at 80° C. for 1.5 hours in a heating chamber of the vacuum evaporation apparatus. Then, the workpiece was cooled down for approximately 30 minutes.

[Step 27]

In Step 27, the layer 105 was formed over the layers 113A2, 113B2, and 113C2 (see FIG. 47). Specifically, materials of the layer 105 were co-deposited by a resistance-heating method. The layer 105 contains lithium fluoride (LiF) and ytterbium (Yb) at 1:1 in a volume ratio and has a thickness of 1 nm.

[Step 28]

In Step 28, the conductive film 552 was formed over the layer 105. Specifically, materials of the conductive film 552 were co-deposited by a resistance-heating method. The conductive film 552 contains silver (Ag) and magnesium (Mg) at 1:0.1 in a weight ratio and has a thickness of 15 nm. The conductive film 552 includes the electrodes 552A, 552B, and 552C.

[Step 29]

In Step 29, the layer CAP was formed over the conductive film 552.

Specifically, the layer CAP was formed by a sputtering method using In—Ga—Zn oxide (abbreviation: IGZO) as a target. The layer CAP contains IGZO and has a thickness of 70 nm.

FIG. 50A is an optical micrograph of the pixel set of the display apparatus fabricated by the above-described method. FIGS. 50B and 50C each show part of the cross section of the pixel set. For the observation, a scanning transmission electron microscope was used.

The top and side surfaces of the layer 529_2 are continuously curved. The layer 529_1 is positioned between the layer 529_2 and the unit 103A, the layer SCRA1 is positioned between the layer 529_1 and the unit 103A, and the layer SCRA2 is positioned between the layer SCRA1 and the unit 103A.

<<Operation Characteristics of Light-Emitting Device 1>>

The light-emitting device 1 has a structure similar to that of the light-emitting device 550A. When supplied with electric power, the light-emitting device 1 emitted the light ELA (see FIG. 36C). Operation characteristics of the light-emitting device 1 were measured at room temperature (see FIG. 48). Note that luminance, CIE chromaticity, and emission spectra were measured with a spectroradiometer (SR-UL1R manufactured by TOPCON TECHNOHOUSE CORPORATION). The light-emitting devices 1 are arranged at a resolution of 500 ppi in a measurement region and occupy 23.58% of the area of the measurement region. The measured value was corrected with use of the area ratio.

Table 2 shows main initial characteristics of the fabricated light-emitting device emitting light while being supplied with a current flowing at a current density of approximately 10.0 mA/cm$^2$. Table 2 also shows the characteristics of the other light-emitting devices each having a structure described later.

TABLE 2

| | Voltage (V) | Current density (mA/cm2) |
|---|---|---|
| Light-emitting device 1 | 4.1 | 10.0 |
| Light-emitting device 2 | 3.9 | 10.0 |
| Light-emitting device 3 | 3.9 | 10.0 |
| Comparative device 1 | 4.0 | 10.0 |
| Comparative device 2 | 4.9 | 10.0 |
| Comparative device 3 | 4.9 | 10.0 |

The light-emitting device 1 was found to exhibit favorable characteristics. For example, the voltage-current density characteristics of the light-emitting device 1 were equal to those of the comparative device 1.

<<Operation Characteristics of Light-Emitting Device 2>>

The light-emitting device 2 has a structure similar to that of the light-emitting device 550B. When supplied with electric power, the light-emitting device 2 emitted the light ELB (see FIG. 36C). Operation characteristics of the light-emitting device 2 were measured at room temperature (see FIG. 48). The light-emitting devices 2 are arranged at a resolution of 500 ppi in a measurement region and occupy 9.76% of the area of the measurement region. The measured value was corrected with use of the area ratio.

Table 2 shows the main initial characteristics of the fabricated light-emitting device emitting light while being supplied with a current flowing at a current density of approximately 10.0 mA/cm$^2$.

The light-emitting device 2 was found to exhibit favorable characteristics. For example, the voltage-current density characteristics of the light-emitting device 2 were equal to those of the light-emitting device 1 and the comparative device 1. Unlike in the comparative device 2, a phenomenon of an increase in the voltage was not observed in the voltage-current density characteristics of the light-emitting device 2.

<<Operation Characteristics of Light-Emitting Device 3>>

The light-emitting device 3 has a structure similar to that of the light-emitting device 550C. When supplied with electric power, the light-emitting device 3 emitted the light ELC (see FIG. 36C). Operation characteristics of the light-emitting device 3 were measured at room temperature (see FIG. 48). The light-emitting devices 3 are arranged at a resolution of 500 ppi in a measurement region and occupy 9.76% of the area of the measurement region. The measured value was corrected with use of the area ratio.

Table 2 shows the main initial characteristics of the fabricated light-emitting device emitting light while being supplied with a current flowing at a current density of approximately 10.0 mA/cm$^2$.

The light-emitting device 3 was found to exhibit favorable characteristics. For example, the voltage-current density characteristics of the light-emitting device 3 were equal to those of the light-emitting device 1 and the comparative device 1. Unlike in the comparative device 3, a phenomenon of an increase in the voltage was not observed in the voltage-current density characteristics of the light-emitting device 3.

<Comparative Apparatus>

A fabricated comparative apparatus, which is described in this example, has a structure similar to that of the display apparatus 700. The comparative apparatus and the display apparatus have similar structures but were fabricated by different methods. Different portions are described in detail here, and the above description is referred to for portions where a structure and a method similar to the above were employed.

<Comparative Device 1>

The fabricated comparative device 1, which is described in this example, has a structure similar to that of the light-emitting device 550A.

<Comparative Device 2>

The fabricated comparative device 2, which is described in this example, has a structure similar to that of the light-emitting device 550B.

<Comparative Device 3>

The fabricated comparative device 3, which is described in this example, has a structure similar to that of the light-emitting device 550C.

<<Method for Fabricating Comparative Apparatus>>

The comparative apparatus described in this example was fabricated using a method including the following steps.

Note that the fabrication method of the comparative apparatus is different from that of the display apparatus in the following points: after the films SCRa2, 113*a*2, 113*a*1, 111*a*, 112*a*, and 104*a* were processed into predetermined shapes in Step 8-4 (see FIG. 39), Step 9 was skipped and the film 104*b* was formed over the electrode 551B in Step 10 without removing surfaces of the exposed electrodes, and after the films SCRb2, 113*b*2, 113*b*1, 111*b*, 112*b*, and 104*b* were processed into predetermined shapes in Step 15-4 (see FIG. 41), Step 16 was skipped and the film 104*c* was formed over the electrode 551C in Step 17 without removing the surface of the exposed electrode. Different portions are described in detail here, and the above description is referred to for portions where a method similar to the above was employed.

[Step 10]

In Step 10, the film 104*b* was formed over the electrodes 551A, 551B, and 551C. Specifically, treatment similar to that in Step 3 was performed. Note that the description of Step 3 can be used for the description of Step 10 by replacing "a" in the reference numerals with "b". Note that after a dry etching method was employed in Step 8-4, Step 9 is skipped; thus, the electrodes 551B and 551C each have a surface exposed to an etching gas.

[Step 17]

In Step 17, the film 104*c* was formed over the electrodes 551A, 551B, and 551C. Specifically, treatment similar to that in Step 3 was performed. Note that the description of Step 3 can be used for the description of Step 17 by replacing "a" in the reference numerals with "c". Note that after a dry etching method was employed in Step 15-4, Step 16 is skipped; thus, the electrode 551C has the surface exposed to an etching gas.

<<Operation Characteristics of Comparative Device 1>>

When supplied with electric power, the comparative device 1 emitted the light ELA (see FIG. 36C). Operation characteristics of the comparative device 1 were measured at room temperature (see FIG. 49). The comparative devices 1 are arranged at a resolution of 500 ppi in a measurement region and occupy 23.58% of the area of the measurement region. The measured value was corrected with use of the area ratio.

Table 2 shows the main initial characteristics of the fabricated comparative device emitting light while being supplied with a current flowing at a current density of approximately 10.0 $mA/cm^2$.

<<Operation Characteristics of Comparative Device 2>>

When supplied with electric power, the comparative device 2 emitted the light ELB (see FIG. 36C). Operation characteristics of the comparative device 2 were measured at room temperature (see FIG. 49). The comparative devices 2 are arranged at a resolution of 500 ppi in a measurement region and occupy 9.76% of the area of the measurement region. The measured value was corrected with use of the area ratio.

Table 2 shows the main initial characteristics of the fabricated comparative device emitting light while being supplied with a current flowing at a current density of approximately 10.0 $mA/cm^2$.

<<Operation Characteristics of Comparative Device 3>>

When supplied with electric power, the comparative device 3 emitted the light ELC (see FIG. 36C). Operation characteristics of the comparative device 3 were measured at room temperature (see FIG. 49). The comparative devices 3 are arranged at a resolution of 500 ppi in a measurement region and occupy 9.76% of the area of the measurement region. The measured value was corrected with use of the area ratio.

Table 2 shows the main initial characteristics of the fabricated comparative device emitting light while being supplied with a current flowing at a current density of approximately 10.0 $mA/cm^2$.

Example 2

In this example, a method for fabricating a display apparatus of one embodiment of the present invention will be described with reference to FIG. 51, FIG. 52, and FIG. 53.

Figure 51:
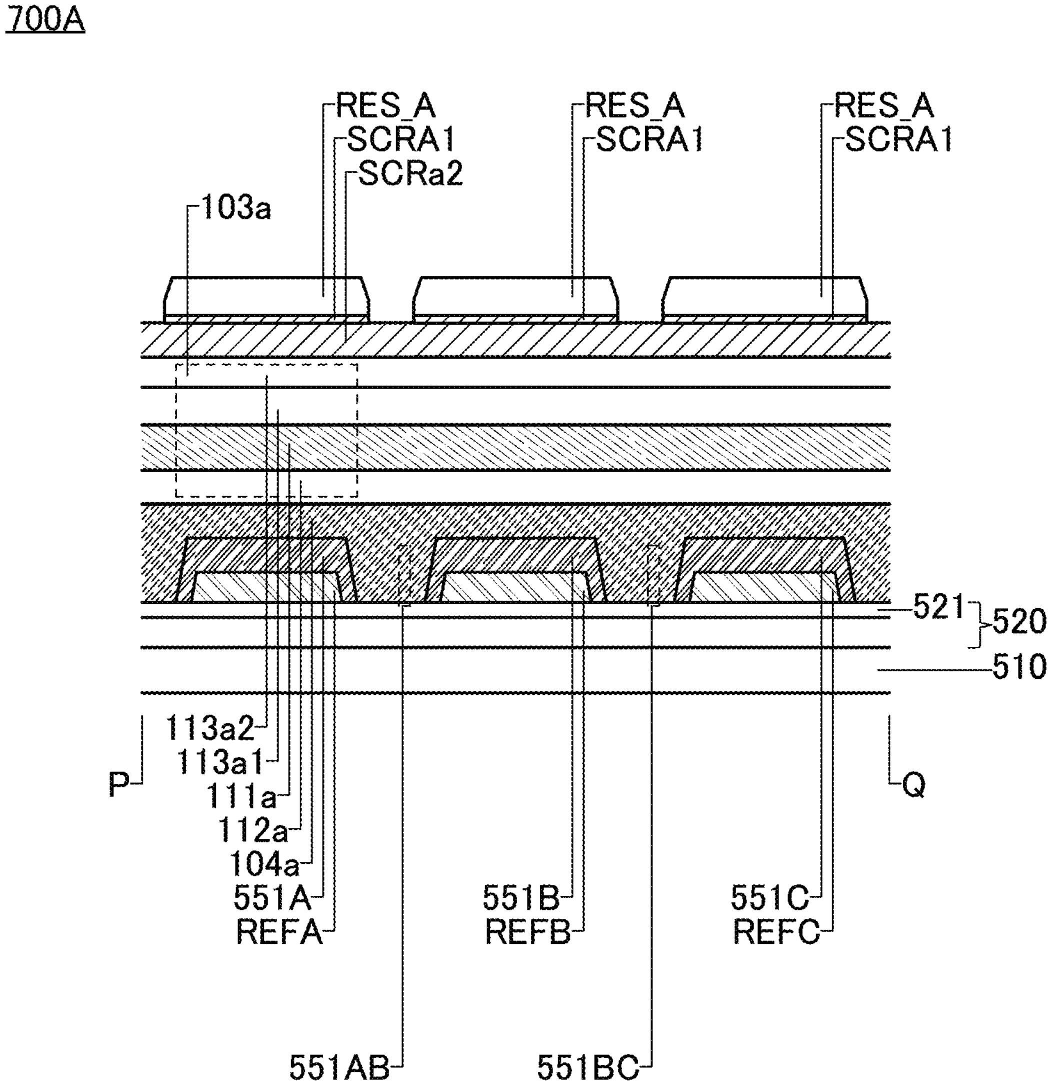
FIG. 51 illustrates a method for fabricating a display apparatus of an example.

FIG. 51 illustrates a fabrication method of a display apparatus.

Figure 52:
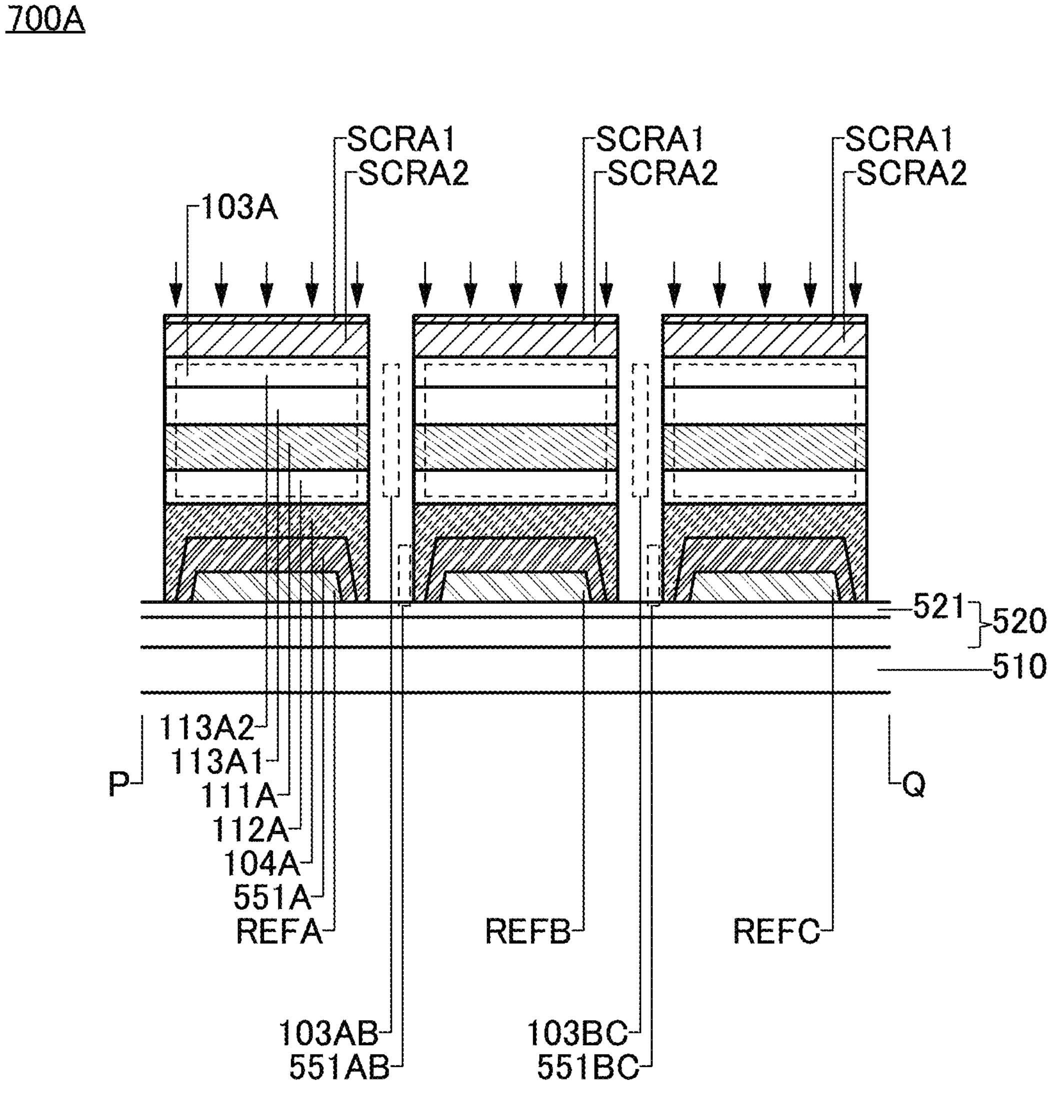
FIG. 52 illustrates a method for fabricating a display apparatus of an example.

FIG. 52 illustrates the fabrication method of the display apparatus.

Figure 53:
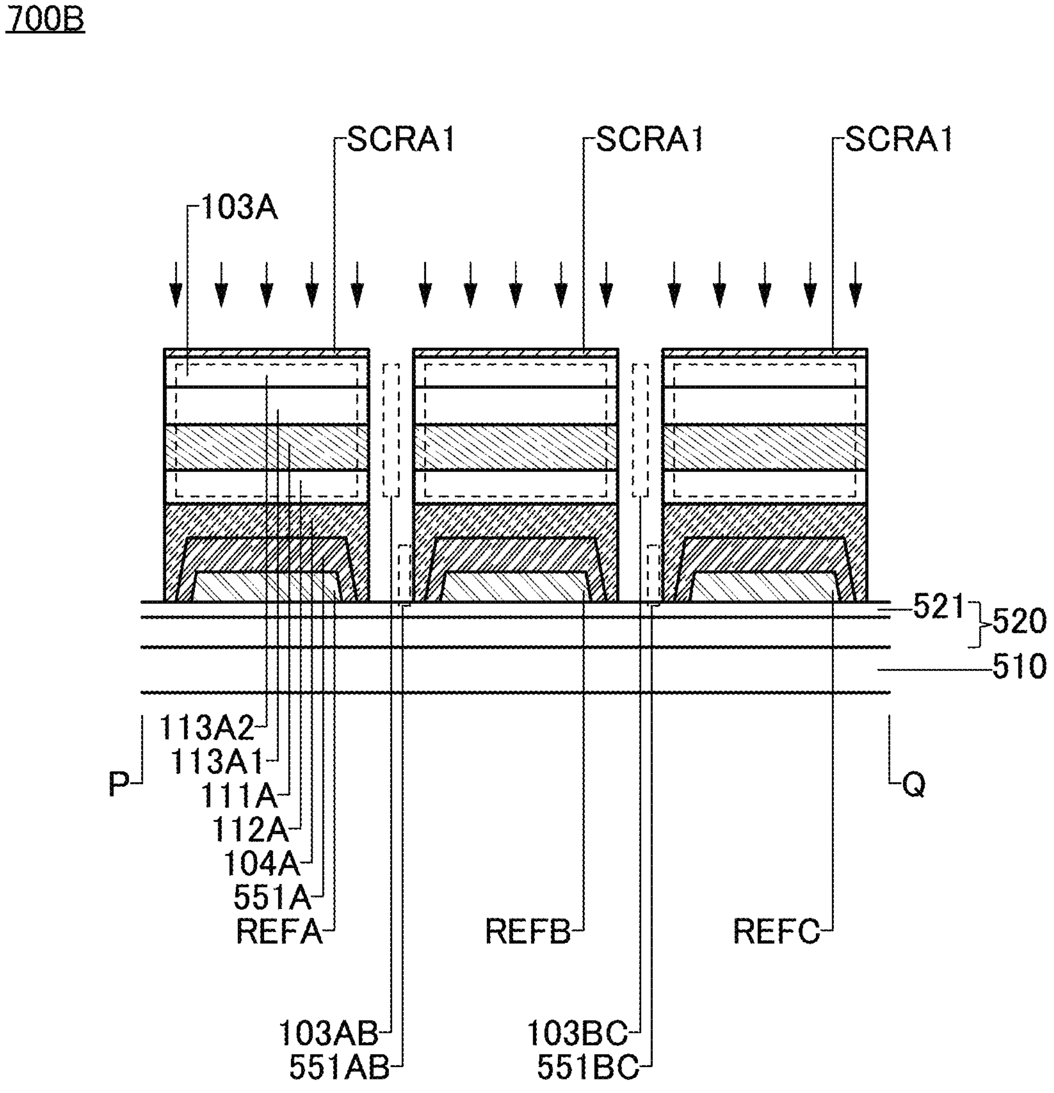
FIG. 53 illustrates a method for fabricating a display apparatus of an example.

FIG. 53 illustrates the fabrication method of the display apparatus.

Fabrication Method Example 1 of Display Apparatus

The fabrication method of a display apparatus 700A described in this example is different from that of the display apparatus described in Example 1 in the following points: a stacked-layer film is processed into a shape different from that in Example 1 to form the layer SCRA1 over the electrodes 551A, 551B, and 551C in Step 8-3; a workpiece was cleaned with use of a high-pressure cleaner after the resist RES_A was removed and after an insulating film containing $AlO_x$ was processed using a metal film containing Mo as a hard mask; the films SCRa2, 113*a*2, 113*a*1, 111*a*, 112*a*, and 104*a* were processed into predetermined shapes over the electrodes 551A, 551B, and 551C using the layer SCRA1 as a hard mask in Step 8-4; the workpiece was cleaned with use of a high-pressure cleaner after the processing; and Step 9 and subsequent steps were omitted. Different portions are described in detail here, and the above description is referred to for portions where a method similar to the above was employed.

[Step 8-3]

In Step 8-3, the stacked-layer film was processed into a predetermined shape to form the layer SCRA1 (see FIG. 51). Specifically, unnecessary portions were removed by an etching method using the resist RES_A.

First, the resist RES_A was formed using a photosensitive polymer. The resist RES_A overlaps with the electrode 551A. Then, an unnecessary portion of the metal film containing Mo was removed by a dry etching method using the resist RES_A. Specifically, the metal film containing Mo was processed using a gas containing $CF_4$, oxygen, and helium as an etching gas. After that, the resist RES_A was removed using a solution containing tetramethyl ammonium hydroxide (abbreviation: TMAH) and then the workpiece was cleaned with use of a high-pressure cleaner. Specifically, pure water was sprayed for 60 seconds at a pressure of 0.5 MPa on the workpiece, which was rotating at a speed of 250 rpm.

Next, an unnecessary portion of the insulating film containing $AlO_x$ was removed by a dry etching method using the metal film containing Mo. Specifically, the insulating film containing $AlO_x$ was processed using a gas containing trifluoromethane (abbreviation: $CHF_3$) and helium (He) as an etching gas and then the workpiece was cleaned with use of a high-pressure cleaner. Note that the metal film containing Mo functions as a hard mask.

[Step 8-4]

In Step 8-4, the films SCRa2, 113*a*2, 113*a*1, 111*a*, 112*a*, and 104*a* were processed into predetermined shapes (see FIG. 52). Specifically, unnecessary portions were removed by a dry etching method using the layer SCRA1. Note that the layer SCRA1 functions as a hard mask and an oxygen-containing gas was used as an etching gas. The layers 104A, 112A, 111A, 113A1, 113A2, and SCRA2 are each divided into a portion overlapping with the electrode 551A, a portion overlapping with the electrode 551B, and a portion overlapping with the electrode 551C.

<<Structure of Work in Process of Display Apparatus 700A>>

After Step 1 to Step 8-4, the electrode 551A, the layer 113A2, and the components therebetween of one light-emitting device; the electrode 551B, the layer 113B2, and the components therebetween of another light-emitting device; and the electrode 551C, the layer 113C2, and the components therebetween of another light-emitting device are formed on the workpiece. The layer SCRA2 was formed over the layer 113A2 and the layer SCRA1 was formed over the layer SCRA2.

Meanwhile, in observation of a workpiece of a display apparatus 700B described later, the electrode 551A, the layer 113A2, and the components therebetween of the one light-emitting device are partly lacked, the electrode 551B, the layer 113B2, and the components therebetween of the other light-emitting device are partly lacked, and the electrode 551C, the layer 113C2, and the components therebetween of the other light-emitting device are partly lacked. That is, by including the layer SCRA2, the stacked-layer structure over the electrode has resistance to a load due to the cleaning with use of a high-pressure cleaner.

Fabrication Method Example 2 of Display Apparatus

The fabrication method of the display apparatus 700B described in this example is different from that of the display apparatus 700A in that after Step 7, the process proceeded not to Step 8-1 but to Step 8-2. Different portions are described in detail here, and the above description is referred to for portions where a structure and a method similar to the above were employed.

<<Structure of Work in Process of Display Apparatus 700B>>

After Step 1 to Step 8-4, the electrode 551A, the layer 113A2, and the components therebetween of one light-emitting device; the electrode 551B, the layer 113B2, and the components therebetween of another light-emitting device; and the electrode 551C, the layer 113C2, and the components therebetween of another light-emitting device are formed on the workpiece (see FIG. 53). The layer SCRA1 is formed over the layer 113A2. The display apparatus 700B is different from the above-described display apparatus in that the layer SCRA2 is not formed over the layer 113A2.

Example 3

In this example, a structure applicable to a display apparatus of one embodiment of the present invention is described with reference to FIGS. 54A to 54F.

Figure 54A:
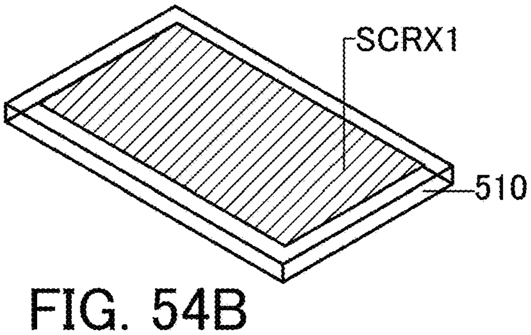
FIGS. 54A to 54F illustrate structures of samples of an example.
Figure 54B:
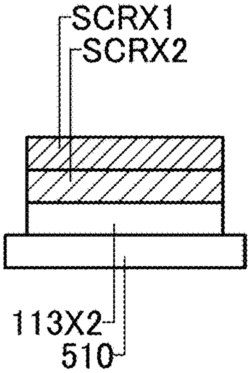
Figure 54C:
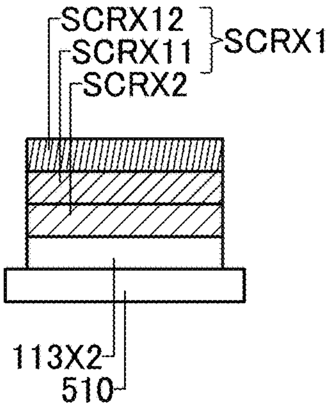
Figure 54D:
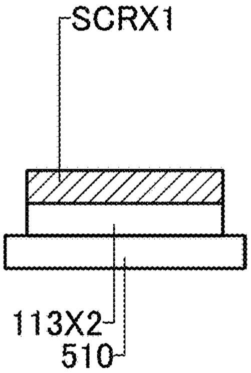
Figure 54E:
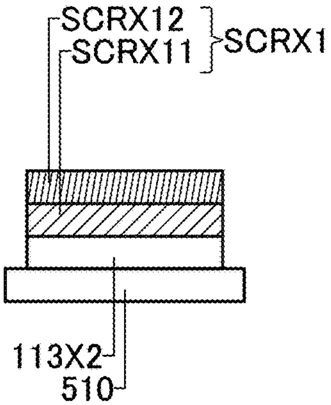
Figure 54F:
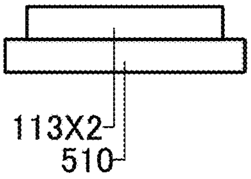

FIG. 54A is a perspective view illustrating a sample including part of a structure applicable to a display apparatus of one embodiment of the present invention. FIGS. 54B and 54C are diagrams illustrating cross sections of samples, and FIGS. 54D to 54F are diagrams illustrating cross sections of comparative samples.

<Sample 1>

A fabricated sample 1, which is described in this example, has a stacked-layer structure similar to part of each of the light-emitting devices 550A, 550B, and 550C. For example, by replacing "X" of the reference numerals of the components of the sample 1 with "A", the stacked-layer structure of the sample 1 matches part of the stacked-layer structure of the light-emitting device 550A (see FIG. 2 and FIGS. 54A and 54B). Similarly, by replacing "X" of the reference numerals of the components of the sample 1 with "B" and "C", the stacked-layer structure of the sample 1 matches part of the stacked-layer structure of the light-emitting device 550B and the light-emitting device 550C, respectively.

<<Structure of Sample 1>>

Table 3 shows the structure of the sample 1. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 3

| Components | Reference numerals | Materials | Thickness/ nm |
|---|---|---|---|
| Layer | SCRX1 | AlOx | 30 |
| Layer | SCRX2 | $Alq_3$ | 10 |
| Layer | 113X2 | mPPhen2P | 100 |

<<Method for Fabricating Sample 1>>

The sample 1 described in this example was fabricated using a method including the following steps.

[Step 1]

In Step 1, the layer 113X2 was formed. Specifically, a material of the layer 113X2 was deposited by a resistance-heating method. The layer 113X2 contains mPPhen2P and has a thickness of 100 nm.

[Step 2]

In Step 2, a layer SCRX2 was formed over the layer 113X2. Specifically, a material of the layer SCRX2 was deposited by a resistance-heating method. The layer SCRX2 contains $Alq_3$ and has a thickness of 10 nm.

[Step 3]

In Step 3, a layer SCRX1 was formed over the layer SCRX2. Specifically, an ALD method was employed. The layer SCRX1 contains $AlO_x$ and has a thickness of 30 nm.

<<Method for Analyzing Component Material Contained in Sample 1>>

A component material contained in the sample 1 described in this example was analyzed by a method including the following steps.

[Step 1]

A part with a size of 5 cm 2 (2.5 cm×2.0 cm), which was cut from the sample 1, and 0.5 ml of a mixed solution containing acetonitrile (abbreviation: AN) and chloroform (abbreviation: $CHCL_3$) at 8:2 in a volume ratio were enclosed in a 50 mL sample bottle.

[Step 2]

The sample bottle was irradiated with ultrasonic waves for 10 minutes, whereby the component material contained in the sample 1 was extracted.

[Step 3]

The liquid taken out from the sample bottle was filtered through a porous filter with a pore size of 0.2 μm and then analyzed by high performance liquid chromatography.

For a fixed phase, a column (ACQUITY UPLC CSH C18, 2.1×100 mm) was used. For a mobile phase, a mixed solution of AN and a 0.1% formic acid aqueous solution (abbreviation: HCOOH(aq)) was used. Note that the mixing ratio of AN to HCOOH(aq) in the mobile phase was 55:45 (volume ratio) for the first 17 minutes of the analysis; the volume ratio was then changed to 95:5 by a linear gradient method from minute 17 to minute 20 and was then kept at the volume ratio of 95:5 from minute 20 to minute 30.

A photodiode array and a mass analyzer were used as detectors.

<<Component Material Contained in Sample 1>>

Table 4 and Table 5 show the analysis results obtained by the high performance liquid chromatography. Note that a peak 2 to a peak 13 shown in Table 4 and Table 5 are not detected in a comparative sample 3, which is a reference, and were newly detected in a comparative sample 1 or a comparative sample 2. Note that a peak derived from $Alq_3$ is detected in each of the samples 1 and 2 but is not shown here because this peak is not derived from mPPhen2P. The value of each peak is the proportion calculated using an area normalization method while a peak area is regarded as the product of the intensity and the detection period of a signal of each peak. Table 6 shows the mass (m/z) and the estimated structure of a separated substance. Table 4 to Table 6 also show the results of other samples described later.

TABLE 4

| | Peak 1 | Peak 2 | Peak 3 | Peak 4 | Peak 5 | Peak 6 | Peak 7 |
|---|---|---|---|---|---|---|---|
| Sample 1 | 100.00% | | | | | | |
| Sample 2 | 100.00% | | | | | | |
| Comparative sample 1 | 99.45% | 0.02% | 0.08% | 0.07% | 0.17% | 0.11% | 0.01% |
| Comparative sample 2 | 99.87% | | | 0.01% | 0.03% | 0.03% | |
| Comparative sample 3 | 100.00% | | | | | | |

TABLE 5

| | Peak 8 | Peak 9 | Peak 10 | Peak 11 | Peak 12 | Peak 13 |
|---|---|---|---|---|---|---|
| Sample 1 | | | | | | |
| Sample 2 | | | | | | |
| Comparative sample 1 | 0.07% | 0.02% | | | | |
| Comparative sample 2 | 0.01% | | 0.02% | 0.01% | 0.01% | 0.01% |
| Comparative sample 3 | | | | | | |

TABLE 6

| | m/z | Estimated structure |
|---|---|---|
| Peak 1 | 587.22 | mPPhen2P |
| Peak 2 | 601.24 | Adduct generated by addition of one methyl group |
| Peak 3 | 601.24 | Adduct generated by addition of one methyl group |
| Peak 4 | 623.24 | Adduct generated by addition of two oxygen atoms and four hydrogen atoms |
| Peak 5 | 591.26 | Adduct generated by addition of four hydrogen atoms |
| Peak 6 | 639.24 | Adduct generated by addition of three oxygen atoms and four hydrogen atoms |
| Peak 7 | 639.24 | Adduct generated by addition of three oxygen atoms and four hydrogen atoms |
| Peak 8 | 643.27 | Adduct generated by addition of three oxygen atoms and eight hydrogen atoms |
| Peak 9 | 641.25 | Adduct generated by addition of three oxygen atoms and six hydrogen atoms |
| Peak 10 | 607.21 | Unknown |
| Peak 11 | 589.24 | Adduct generated by addition of two hydrogen atoms |
| Peak 12 | 601.24 | Adduct generated by addition of one methyl group |
| Peak 13 | 603.22 | Adduct generated by addition of one oxygen atom |

In the sample 1, only a signal corresponding to mPPhen2P (a peak 1) was observed as in the comparative sample 3. It was found that the layer 113X2 contains no alteration product and contains mPPhen2P with high purity. Even when the layer SCRX2 containing $Alq_3$ was formed by a resistance-heating method over a surface of the layer 113X2 containing mPPhen2P, mPPhen2P was not altered. Moreover, even when the layer SCRX1 containing $AlO_x$ was formed by an ALD method over a surface of the layer SCRX2 containing $Alq_3$, mPPhen2P was not altered.

Meanwhile, in the comparative sample 1, signals derived from alteration products of mPPhen2P (the peaks 2 to 9) were observed in addition to a signal corresponding to mPPhen2P. The detected alteration products were mainly a methyl adduct, an oxygen adduct, a hydrogen adduct, and the like of mPPhen2P. A plurality of kinds of alteration products were contained. That is, when the layer SCRX1 containing $AlO_x$ was formed by an ALD method over the surface of the layer 113X2 containing mPPhen2P, a plurality of kinds of methyl adducts, a plurality of kinds of oxygen adducts, a plurality of kinds of hydrogen adducts, and the like of mPPhen2P were generated. These results revealed that in the sample 1, generation of a methyl adduct, an oxygen adduct, a hydrogen adduct, and the like of mPPhen2P is inhibited more than in the comparative sample 1, indicating that the layer SCRX2 has an effect of inhibiting alteration of the layer 113X2.

Formation of a film by an ALD method over a surface of a layer containing an organic compound might alter the organic compound. In an ALD method, the surface of the layer containing the organic compound is alternately exposed to a gas containing a precursor and a gas containing an oxidizer. For example, in an ALD method using a gas containing trimethylaluminum and a gas containing an oxidizer, the organic compound may react with trimethylaluminum and a methyl group may be added to the organic compound. Moreover, the organic compound may react with the oxidizer and an oxide of the organic compound may be generated. Furthermore, a double bond or a triple bond of the organic compound may be hydrogenated.

<Sample 2>

A fabricated sample 2, which is described in this example, has a stacked-layer structure similar to part of each of the light-emitting devices 550A, 550B, and 550C (see FIG. 36C and FIGS. 54A and 54C). By replacing "X" of the reference numerals of the components of the sample 2 with "B" and "C", the stacked-layer structure of the sample 2 matches part of the stacked-layer structure of the light-emitting device 550B and the light-emitting device 550C, respectively.

<<Structure of Sample 2>>

Table 7 shows the structure of the sample 2. The sample 2 is different from the sample 1 in the layer SCRX1. Specifically, the sample 2 is different from the sample 1 in that the layer SCRX1 includes a layer SCRX11 and a layer SCRX12.

TABLE 7

| Components | Reference numerals | Materials | Thickness/nm |
|---|---|---|---|
| Layer | SCRX12 | Mo | 50 |
| Layer | SCRX11 | $AlO_x$ | 30 |
| Layer | SCRX2 | Alq3 | 10 |
| Layer | 113X2 | mPPhen2P | 100 |

<<Method for Fabricating Sample 2>>

The sample 2 described in this example was fabricated using a method including the following steps. The fabrication method of the sample 2 is different from that of the sample 1 in that not the layer SCRX1 but the layer SCRX11 was formed in Step 3 and the process proceeds to Step 4 after Step 3. Different portions are described in detail here, and the above description is referred to for portions where a method similar to the above was employed.

[Step 3]

In Step 3, the layer SCRX11 was formed over the layer SCRX2. Specifically, an ALD method was employed. The layer SCRX11 contains $AlO_x$ and has a thickness of 30 nm.

[Step 4]

In Step 4, the layer SCRX12 was formed over the layer SCRX11. Specifically, the layer SCRX12 was formed by a sputtering method using Mo as a target. The layer SCRX12 contains Mo and has a thickness of 50 nm.

<<Component Material Contained in Sample 2>>

Table 4 shows the analysis results obtained by the high performance liquid chromatography. Note that a method similar to the method for analyzing the component material contained in the sample 1 was employed.

In the sample 2, only a signal corresponding to mPPhen2P (the peak 1) was observed as in the comparative sample 3. It was found that the layer 113X2 contains no alteration product and contains mPPhen2P with high purity. Even when the layer SCRX2 containing $Alq_3$ was formed by a resistance-heating method over the surface of the layer 113X2 containing mPPhen2P, mPPhen2P was not altered. Moreover, even when the layer SCRX11 containing $AlO_x$ was formed by an ALD method over the surface of the layer SCRX2 containing $Alq_3$, mPPhen2P was not altered. Furthermore, even when the layer SCRX12 containing Mo was formed by a sputtering method over a surface of the layer SCRX11 containing $AlO_x$, mPPhen2P was not altered.

Meanwhile, in the comparative sample 2, signals derived from alteration products of mPPhen2P (the peaks 4 to 6, 8, and 10 to 13) were observed in addition to a signal corresponding to mPPhen2P. The detected alteration products were mainly a methyl adduct, an oxygen adduct, a hydrogen adduct, and the like of mPPhen2P. A plurality of kinds of alteration products were contained. That is, when the layer SCRX11 containing $AlO_x$ was formed by an ALD method over the surface of the layer 113X2 containing mPPhen2P and the layer SCRX12 containing Mo was formed by a sputtering method over the surface of the layer SCRX11, a plurality of kinds of methyl adducts, a plurality of kinds of oxygen adducts, a plurality of kinds of hydrogen adducts, and the like of mPPhen2P were generated. Note that the comparative sample 2 contained a larger number of kinds of alteration products than the comparative sample 1. These results revealed that in the sample 2, generation of a methyl adduct, an oxygen adduct, a hydrogen adduct, and the like of mPPhen2P is inhibited more than in the comparative sample 2, indicating that the layer SCRX2 has an effect of inhibiting alteration of the layer 113X2.

Formation of a film by an ALD method over a surface of a layer containing an organic compound might alter the organic compound. In an ALD method, the surface of the layer containing the organic compound is alternately exposed to a gas containing a precursor and a gas containing an oxidizer. For example, in an ALD method using a gas containing trimethylaluminum and a gas containing an oxidizer, the organic compound may react with trimethylaluminum and a methyl group may be added to the organic compound. Moreover, the organic compound may react with the oxidizer and an oxide of the organic compound may be generated. Furthermore, a double bond or a triple bond of the organic compound may be hydrogenated.

When the film was stacked by a sputtering method over the film formed by an ALD method over the surface of the layer containing the organic compound, alteration, such as oxidization, of the organic compound was promoted. That is, a sputtering method may cause oxidization or hydrogenation of the organic compound contained in the layer 113X2 even when a film is formed by an ALD method over the layer 113X2. In other words, provision of the layer SCRX2 between the layer 113X2 and the layer SCRX11 can sometimes inhibit alteration, such as oxidization or hydrogenation, of the layer 113X2 that occurs through the layer SCRX11.

<Comparative Sample 1>

The fabricated comparative sample 1, which is described in this example, is different from the sample 1 in not including the layer SCRX2 (see FIGS. 54A and 54D).

<<Structure of Comparative Sample 1>>

Table 8 shows the structure of the comparative sample 1.

TABLE 8

| Components | Reference numerals | Materials | Thickness/nm |
|---|---|---|---|
| Layer | SCRX1 | $AlO_x$ | 30 |
| Layer | 113X2 | mPPhen2P | 100 |

<<Component Material Contained in Comparative Sample 1>>

Table 4 shows the analysis results obtained by the high performance liquid chromatography.

<Comparative Sample 2>

The fabricated comparative sample 2, which is described in this example, is different from the sample 2 in not including the layer SCRX2 (see FIGS. 54A and 54E).

<<Structure of Comparative Sample 2>>

Table 9 shows the structure of the comparative sample 2.

TABLE 9

| Components | Reference numerals | Materials | Thickness/nm |
|---|---|---|---|
| Layer | SCRX12 | Mo | 50 |
| Layer | SCRX11 | $AlO_x$ | 30 |
| Layer | 113X2 | mPPhen2P | 100 |

<<Component Material Contained in Comparative Sample 2>>

Table 4 shows the analysis results obtained by the high performance liquid chromatography.

<Comparative Sample 3>

The fabricated comparative sample 3, which is described in this example, is different from the samples 1 and 2 in not including the layers SCRX1 and SCRX2 (see FIGS. 54A and 54F).

<<Structure of Comparative Sample 3>>

Table 10 shows the structure of the comparative sample 3.

TABLE 10

| Components | Reference numerals | Materials | Thickness/nm |
|---|---|---|---|
| Layer | 113X2 | mPPhen2P | 100 |

<<Component Material Contained in Comparative Sample 3>>

Table 4 shows the analysis results obtained by the high performance liquid chromatography.

This application is based on Japanese Patent Application Serial No. 2022-162233 filed with Japan Patent Office on Oct. 7, 2022, the entire content of which is hereby incorporated by reference.

What is claimed is:

1. A display apparatus comprising:

a first light-emitting device, the first light-emitting device comprising:

a first electrode;

a first unit; and a third electrode;

a second light-emitting device, the second light-emitting device comprising:

a second electrode;

a second unit; and a fourth electrode;

an insulating film; and a first layer, wherein the first electrode is between the first unit and the insulating film, wherein the first electrode has a first thickness, wherein the first unit is between the first electrode and the third electrode, wherein the first unit comprises a first light-emitting material, wherein the second electrode is between the second unit and the insulating film, wherein a first gap is between the second electrode and the first electrode, wherein the second electrode has a second thickness, wherein the second thickness is smaller than the first thickness, wherein the second unit is between the second electrode and the fourth electrode, wherein the second unit comprises a second light-emitting material, wherein a second gap is between the second unit and the first unit, wherein the second gap overlaps with the first gap, wherein the first layer is in contact with the first unit and the second unit in the second gap, and wherein the first layer is in contact with the insulating film in the first gap.

2. A display apparatus comprising:

a first light-emitting device, the first light-emitting device comprising:

a first electrode;

a first unit;

a third electrode;

a first layer; and a third layer;

a second light-emitting device, the second light-emitting device comprising:

a second electrode;

a second unit; and a fourth electrode;

an insulating film; and a second layer, wherein the first electrode is between the first unit and the insulating film, wherein the first electrode has a first thickness, wherein the first unit is between the first electrode and the third electrode, wherein the first unit comprises a first light-emitting material, wherein the second electrode is between the second unit and the insulating film, wherein a first gap is between the second electrode and the first electrode, wherein the second electrode has a second thickness, wherein the second thickness is smaller than the first thickness, wherein the second unit is between the second electrode and the fourth electrode, wherein the second unit comprises a second light-emitting material, wherein a second gap is between the second unit and the first unit, wherein the second gap overlaps with the first gap, wherein the second layer is in contact with the first unit and the second unit in the second gap, wherein the second layer is in contact with the insulating film in the first gap, wherein the first layer is between the third electrode and the first unit, wherein the first layer comprises a third opening, wherein the third opening overlaps with the first electrode, wherein the third layer is between the first layer and the first unit, wherein the third layer comprises a fourth opening, and wherein the fourth opening overlaps with the third opening.

3. The display apparatus according to claim 2, wherein the first layer comprises oxygen and aluminum, and wherein the third layer has higher water solubility than the first unit.

4. The display apparatus according to claim 2, further comprising:

a conductive film; and a fourth layer, wherein the conductive film comprises the third electrode, wherein the fourth layer is between the conductive film and the second layer, wherein the fourth layer comprises a first opening, wherein the second layer comprises a fifth opening, and wherein the fifth opening overlaps with the third opening, the fourth opening, and the first opening.

5. The display apparatus according to claim 4, wherein the first opening comprises an end portion substantially aligned with end portions of the fifth opening, the third opening, and the fourth opening.

* * * * *